(12) United States Patent
Dahl et al.

(10) Patent No.: US 7,224,532 B2
(45) Date of Patent: May 29, 2007

(54) OPTICAL USES DIAMONDOID-CONTAINING MATERIALS

(75) Inventors: Jeremy E. Dahl, Palo Alto, CA (US); Robert M. Carlson, Petaluma, CA (US); Shenggao Liu, Hercules, CA (US)

(73) Assignee: Chevron U.S.A. Inc., San Ramon, CA (US)

( * ) Notice: Subject to any disclaimer, the term of this patent is extended or adjusted under 35 U.S.C. 154(b) by 49 days.

(21) Appl. No.: 10/621,956

(22) Filed: Jul. 16, 2003

(65) Prior Publication Data

US 2004/0109328 A1    Jun. 10, 2004

Related U.S. Application Data

(60) Provisional application No. 60/431,273, filed on Dec. 6, 2002.

(51) Int. Cl.
G02B 3/00 (2006.01)
B24B 3/02 (2006.01)

(52) U.S. Cl. ...................... 359/642; 428/408

(58) Field of Classification Search ........... 359/642; 428/408; 423/446
See application file for complete search history.

(56) References Cited

U.S. PATENT DOCUMENTS

| | | | |
|---|---|---|---|
| 3,457,318 A | 7/1969 | Capaldi et al. | 585/317 |
| 3,832,332 A | 8/1974 | Thompson | 528/344 |
| 4,201,955 A | 5/1980 | Elton et al. | 372/69 |
| 4,225,734 A | 9/1980 | McMurry | 585/351 |
| 4,638,484 A | 1/1987 | Rand et al. | 372/42 |
| 4,880,613 A | 11/1989 | Satoh et al. | 423/446 |
| 4,910,436 A | 3/1990 | Collins et al. | 315/111.81 |
| 4,949,347 A | 8/1990 | Satoh et al. | 372/41 |
| 4,950,625 A | 8/1990 | Nakashima et al. | 501/86 |
| 4,950,657 A | 8/1990 | Nakashimi et al. | 514/85 |
| 5,017,734 A | 5/1991 | Baum et al. | 585/21 |
| 5,019,660 A | 5/1991 | Chapman et al. | 585/22 |

(Continued)

FOREIGN PATENT DOCUMENTS

DE    2545292 A    4/1979

(Continued)

OTHER PUBLICATIONS

Erdemir, Ali and Christophe Donnet, "Tribology of Diamond, Diamond-Like Carbon, and Related Films," Chapter 24 *Modern Tribology Handbook*, vol. 2, Materials, Coatings, and Industrial Applications, CRC Press, New York, pp. 871-908 (2001).

(Continued)

*Primary Examiner*—Scott J. Sugarman
*Assistant Examiner*—Mohammed A. Hansan
(74) *Attorney, Agent, or Firm*—Buchanan Ingersoll & Rooney PC

(57) ABSTRACT

Novel optical devices based on diamondoid-containing materials are disclosed. Materials that may be fabricated from diamondoids included diamondoid nucleated CVD films, diamondoid-containing CVD films, molecular crystals, and polymerized materials. Devices that may be fabricated from the diamondoid-containing materials disclosed herein include solid state dye lasers, semiconductor lasers, light emitting diodes, photodetectors, photoresistors, phototransistors, photovoltaic cells, solar cells, anti-reflection coatings, lenses, mirrors, pressure windows, optical waveguides, and particle and radiation detectors.

8 Claims, 28 Drawing Sheets

U.S. PATENT DOCUMENTS

| | | | |
|---|---|---|---|
| 5,051,785 A | 9/1991 | Beetz, Jr. et al. | 257/77 |
| 5,075,757 A | 12/1991 | Ishii et al. | 257/734 |
| 5,082,359 A * | 1/1992 | Kirkpatrick | 359/642 |
| 5,112,775 A | 5/1992 | Iida et al. | 438/105 |
| 5,117,267 A | 5/1992 | Kimoto et al. | 257/78 |
| 5,132,749 A | 7/1992 | Nishibayashi et al. | 257/77 |
| 5,144,380 A | 9/1992 | Kimoto et al. | 257/77 |
| 5,171,632 A | 12/1992 | Heeger et al. | 428/364 |
| 5,210,430 A | 5/1993 | Taniguchi et al. | 257/103 |
| 5,210,431 A | 5/1993 | Kimoto et al. | 257/77 |
| 5,223,721 A | 6/1993 | Iida et al. | 257/77 |
| 5,245,189 A | 9/1993 | Satoh et al. | 250/343 |
| 5,273,731 A | 12/1993 | Anthony et al. | 423/446 |
| 5,275,967 A | 1/1994 | Taniguchi et al. | 438/22 |
| 5,306,928 A | 4/1994 | Kimoto et al. | 257/77 |
| 5,328,855 A * | 7/1994 | Kitabatake et al. | 438/105 |
| 5,331,183 A | 7/1994 | Sariciftci et al. | 257/40 |
| 5,347,147 A | 9/1994 | Jones | 137/522 |
| 5,349,209 A | 9/1994 | Moyer et al. | 257/80 |
| 5,352,908 A | 10/1994 | Kobashi et al. | 257/73 |
| 5,371,382 A | 12/1994 | Venkatesan et al. | 257/77 |
| 5,382,684 A | 1/1995 | Moini et al. | 564/281 |
| 5,382,809 A | 1/1995 | Nishibayashi et al. | 257/77 |
| 5,389,799 A | 2/1995 | Uemoto | 257/77 |
| 5,414,189 A | 5/1995 | Chen et al. | 585/801 |
| 5,420,879 A | 5/1995 | Kawarada et al. | 372/41 |
| 5,432,003 A * | 7/1995 | Plano et al. | 428/408 |
| 5,449,531 A | 9/1995 | Zhu et al. | 427/249.8 |
| 5,454,880 A | 10/1995 | Sariciftci et al. | 136/263 |
| 5,470,505 A | 11/1995 | Smith et al. | 252/500 |
| 5,470,661 A * | 11/1995 | Bailey et al. | 428/408 |
| 5,476,812 A | 12/1995 | Kimoto et al. | 438/47 |
| 5,478,650 A | 12/1995 | Davanloo et al. | 428/408 |
| 5,504,323 A | 4/1996 | Heeger et al. | 250/214.1 |
| 5,504,767 A | 4/1996 | Jamison et al. | 372/41 |
| 5,531,184 A | 7/1996 | Muranaka et al. | 117/108 |
| 5,541,423 A | 7/1996 | Hirabayashi | 257/77 |
| 5,600,156 A | 2/1997 | Nishibayashi et al. | 257/77 |
| 5,608,666 A | 3/1997 | Inushima et al. | 365/112 |
| 5,610,405 A | 3/1997 | Inushima et al. | 250/372 |
| 5,632,812 A | 5/1997 | Hirabayashi | 117/94 |
| 5,653,800 A | 8/1997 | Kucherov et al. | 117/79 |
| 5,656,828 A | 8/1997 | Zachai et al. | 257/77 |
| 5,701,323 A | 12/1997 | Kahr et al. | 372/54 |
| 5,703,896 A | 12/1997 | Pankove et al. | 372/50.23 |
| 5,747,118 A | 5/1998 | Bunshah et al. | 427/577 |
| 5,773,830 A | 6/1998 | Lu et al. | 250/370.01 |
| 5,792,256 A | 8/1998 | Kucherov et al. | 117/89 |
| 5,812,573 A | 9/1998 | Shiomi et al. | 372/44.01 |
| 6,110,276 A | 8/2000 | Yu et al. | 117/94 |
| 6,151,347 A | 11/2000 | Noel et al. | 372/45.01 |
| 6,162,412 A | 12/2000 | Fujimori et al. | 423/446 |
| 6,235,851 B1 | 5/2001 | Ishii et al. | 525/440 |
| 6,274,837 B1 | 8/2001 | Windischmann et al. | 219/69.17 |
| 6,340,393 B1 | 1/2002 | Yoshida | 117/86 |
| 6,352,884 B1 | 3/2002 | Yu et al. | 438/166 |
| 6,376,276 B1 | 4/2002 | Oishi et al. | 438/105 |
| 6,433,474 B1 | 8/2002 | Horiuchi et al. | 313/499 |
| 2002/0009274 A1 | 1/2002 | Gharavi | 385/122 |
| 2004/0054243 A1 | 3/2004 | Maesen et al. | 585/352 |
| 2004/0059145 A1 | 3/2004 | Liu et al. | 556/64 |

FOREIGN PATENT DOCUMENTS

| | | |
|---|---|---|
| EP | 1 081 747 A1 | 3/2001 |
| EP | 1 088 875 A2 | 4/2001 |
| EP | 1 043 916 A1 | 10/2002 |
| WO | WO 92/13909 | 8/1992 |
| WO | WO 95/06019 A1 | 3/1995 |
| WO | 01/83410 A1 | 11/2001 |
| WO | WO 02/00505 A2 | 1/2002 |
| WO | WO 02/057201 A2 | 7/2002 |
| WO | WO 02/058139 A2 | 7/2002 |
| WO | WO 03/05066 A1 | 6/2003 |

OTHER PUBLICATIONS

Askeland, D.R., "Electrical Conductivity", Chapter 17, pp. 664-667, *The Science and Engineering of Materials* Second Edition, J. Donald Childress ed. (1989).

Balaban et al., Systematic Classification and Nomenclature of Diamond Hydrocarbons -I, *Tetrahedron* 34:3599-3606 (1978).

Baugman, G.I., "Dibromination of Adamantane", (1964).

Becker et al, "A Short Synthese of 1-azaadamantan-4-one and the 4r and 4s Isomers of 4-Amino-1-azaadamantane", *Synthesis* 11:1080-1082 (1992).

Bingham, R.C. et al., Chapter 18 of "Chemistry of Adamantanes", *Springer-Verlag* (1971).

Bishop, R., et al., "Detection of Non-Conjugative Interactions in Rigid Cyclic Molecules by Using Carbon-13 N.M.R. Shift Values", *Aust. J. Chem.* 40:249-255 (1987).

Black, R.M. et al., "Adamantane Chemistry. Part 3. Abnormal Hypoiodite Reactions of 2-Substituted Adamantan-2-ols; Synthetic Routes to 4-Oxahomo-and 2-Oxa-adamantanes, and 7-Substituted-bicyclo[3.3.1]nona-3-ols", *J. Chem. Soc. Perkins Trans.* I 410-418 (1980).

Blaney et al, "Chemistry of Diamantane, Part II. Synthesis of 3,5-disubstituted Derivatives", *Synthetic Communications* 3(6):435-439 (1973).

Boudjouk et al, "Synthesis and Reactivity of 1-Silaadamantyl Systems", *Journal of Organometallic Chemistry* 2:336-343 (1983).

Boudjouk et al, "The Reaction of Magnesium with cis-1,3,5-Trsi(bromomethyl)cyclohexane. Evidence For a Soluble Trigrignard", *Journal of Organometallic Chemistry* 281:C21-C23 (1985).

Bubnov et al, "A Novel Method of Synthesis of 1-azaadamantane from 1-boraadamantane", *Journal of Organometallic Chemistry* 412:1-8 (1991).

Canham, L., "Gaining Light from Silicon", *Nature* 408:411-412 (2000).

Cao, G.Z., "Nitrogen and Phosphorous Doping in CVD Diamond", *Diamond*, edited by M.H. Nazare and A.J. Neves, INSPEC pp. 345-347 (2001).

Chakrabarti et al., "Chemistry of Adamantane. Part II. Synthesis of 1-Adamantyloxyalkylamines", *Tetrahedron Letters* 60:6249-6252 (1968).

"Computation Concepts" *Chem3D Molecular Modeling and Analysis User's Guide*, Chapter 9, pp. 123-144.

Courtney, T., Johnston, D.E. McKervey, M.A. and Rooney, J.J., "The Chemistry of Diamantanes. Part 1. synthesis and Some Functionalisation Reactions", *J. Chem. Soc. Perkin I* 2691-2696 (1972).

Eguchi et al, "A Novel Route to the 2-Aza-adamantyl System via Photochemical Ring Contraction of Epoxy 4-Azahomoadamantanes", *Journal of Organometallic Chemistry, Commun.*, 1147-1148 (1984).

Fernandez, M.J., et al., "NMR Study of 1-Azatricyclo[3.3.1$^{3-7}$]decane Derivatives", *J. Heterocyclic Chem.* 26:307-312 (1989).

Fernandez, M.J., et al., "Synthesis, Structural and Conformational Study of 4-α-(or β)-p-Chlorobenzoyloxy-1-azaadamantane Hydrochloride", *J. Heterocyclic Chem.* 26:349-353 (1989).

Fleming, I., et al., "A New Oxindole Synthesis", *J. Chem. Soc. Perkin Trans.* 1:617-626 (1991).

Fort, Jr., et al., "Stereochemistry of Hydride Reductions of 4,8-Dihalo-2-thiaadamantanes and Related Thiabicyclo[3.3.1]nonanes", *J. Org. Chem.* 52:2396-2399 (1987).

Fox, M.A., et al., "Transmission of Electronic Effects by Icosahedral Carboranes; Skeletal Carbon-13 Cehmical Shifts and Ultraviolet-Visible Spectra of Substituted aryl-*p*-carboranes (1,12-dicarba-*closo*-dodecaboranes)", *J. Chem. Soc., Dalton Trans.* 401-411 (1998).

Fritz, G., et al., "Silicon-Carbon Compounds with a Carborundum Structure", Abstract, *Angew. Chem, Internat. Edit.* 9(6) (1970).

Fritz, G., et al., "Uber die Isolierung Hoherer Carbosilane aus der Pyrolyse des Tetramethylsilans", *Z. anorg. allg. Chem.* 512 pps. 103-125 (1984).

Gagneux et al, "1-Substituted 2-Heteroadamantanes", *Tetrahedron Letters* 17: 1365-1368 (1969).

Gerzon, et al., "The Adamantyl Group in Medicinal Agents, 1. Hypoglycemic N-Arylsulfonyl-N-adamantylureas", *Journal of Medicinal Chemistry* 6(6):760-763 (1963).

Hass, et al., Adamantyoxycarbonyl, a New Blocking Group. Preparation of 1-Adamantyl Chloroformate, *Journal of the American Chemical Society* 88(9):1988-1992 (1966).

Hahn, J.M. et al., "Strongly Enhanced Stereoselectivity in the Reduction of of 5-Substituted Adamantanones by Substitution of $C_5$ by Positive Nitrogen", *J. Am. Chem. Soc.* 114:1916-1917 (1992).

Hawley, "Condensed Chemical Dictionary", 14th ed., John Wiley & Sons, Inc., 2001.

Heavens, O.S., "Wave Theory (1): Interference", pp. 28-48 from *Insight into Optics*, John Wiley & Sons, (1991).

Heavens, O.S., "Interaction of Radiation and Matter", pp. 137-145 from *Insight into Optics*, John Wiley & Sons, (1991).

Heavens, O.S., "Lasers", pp. 244-259 from *Insight into Optics*, John Wiley & Sons, (1991).

Hecht, E., "Lasers and Laserlight", pp. 577-593 from *Optics*, Addison-Wesley Publishing Company, (1987).

Henkel et al, "Neighboring Group Effects in the β-halo Amines. Synthesis and Solvolytic Reactivity of the anti-4-Substituted 2-Azaadamantyl System", *Journal of Organometallic Chemistry* 46:4953-4959 (1981).

Jackman, R.B., "Diamond Optoelectronic Devices", edited by M.H. Nazare and A.J. Neves, INSPEC pp. 393-398 (2001).

Jawdosiuk, M., et al., "Photolysis and Thermolysis of 3-Azidonoradamantane. "Anti-Bredt" Imines, 2-aza-adamant-1-ene, and 4-Azaprotoadamant-3-ene", *J. Chem. Soc. Perkin Trans* 1:2583-2585 (1984).

Jones, R., et al., "Theory of Aggregation of Nitrogen in Diamond", edited by M.H. Nazare and A.J. Neves, INSPEC pp. 127-129 (2001).

John, P., "Toward Diamond Lasers", *Science* 292:1847-1848 (2001).

Johnston, C., et al., "Boron Doping and Characterisation of Diamond", *Diamond*, edited by M.H. Nazare and A.J. Neves, INSPEC pp. 337-344 (2001).

Kalish, R., et al., "Doping of Diamond Using Ion Implantation", *Diamond*, edited by M.H. Nazare and A.J. Neves, INSPEC pp. 321-330 (2001).

Kano, K., "Optoelectronics", pp. 428-464 from *Semiconductor Devices*, Prentice Hall, New Jersey.

Kiflawi, I., et al, "Aggregates of Nitrogen in Diamond", edited by M.H. Nazare and A. J. Neves, INSPEC pp. 130-133 (2001).

Kiflawi, I., et al, "The Nitrogen Interstitial in Diamond", edited by M.H. Nazare and A.J. Neves, INSPEC pp. 134-135 (2001).

Koizumi, S., et al., "Ultraviolet Emission from a Diamond pn Junction", *Science* 292:1988-1890 (2001).

Krasutsky, P.A., et al., "A New One-Step Method for Oxaadamantane Synthesis", *Tetrahedron Letters* 37(32):5673-5674 (1996).

Krasutsky, P.A., et al., "Observation of a Stable Carbocation in a Consecutive Criegee Rearrangement with Trifluoroperacetic Acid", *J. Org. Chem.* 65:3926-3933 (2000).

Krishnamurthy et al, "Heterodamantanes. 2. Synthesis of 3-Heterodiamantanes", *Journal of Organometallic Chemistry*, 46(7):1389-1390 (1981).

Kroschwitz, J.I., ed, "Electrically Conductive Polymers" pp. 174-219 from *High Performance Polymers and Composites, John Wiley & Sons* (1991).

Kurtsiefer, C., et al., "Stable Solid-State Source of single Photons", *Physical Review Letters* 85(2):290-293 (2000).

Lansbury, et al., "Some Reactions of α-Metalated Ethers", *The Journal of Organic Chemistry* 27(6):1933-1939 (1962).

Lawson, S.C., et al., "The effect of Transition Metals (TM) on the Aggregation Kinetics of Nitrogen in Diamond", edited by M.H. Nazare and A.J. Neves, INSPEC pp. 172-173 (2001).

Liaw, D.J, et al., "Synthesis and Characterization of New Polyamides and Polyimides Prepared from 2,2-bis[4-(4-aminophenoxy)phenyl]adamantane", *Macromol. Chem. Phys.* 200(6):1326-1332 (1999).

Lin, et al., "Natural Occurrence of Tetramantane ($C_{22}H2_8$). Pentamantane ($C_{26}H_{32}$) and Hexamantane ($C_{30}H_{36}$) in a Deep Petroleum Reservoir", *Fuel* 74(10):1512-1521 (1995).

Lippert, E., et al., "Darstellung and UV-Spektren einiger Fluorenon-Derivate", *Angew. Chem.* 71:429-430 (1959).

Makarova, et al., "Psychotropic Activity of Some Aminoketones Belonging to the Adamantane Group" *Pharmaceutical Chemistry Journal* 34:6 (2000).

Marchand, A.P., "Diamondoid Hydrocarbons—Delving into Nature's Bounty", *Science* 299, 52-52 (2003).

Marchand, A.P., "Polycyclic Cage Compounds: Reagents, Substrates, and Materials for the $21^{st}$ Century", *Aldrichimica Acta* 28(4):95-104 (1995).

Marshall et al., "N-Arylsulfonyl-N-alkylureas", *Journal of Organic Chemistry* 23:927-929 (1958).

Marshall et al., "Further studies on N-Arylsulfonyl-N-alkylureas", *Journal of Medicinal Chemistry* 6:60-63 (1963).

McKervey, et al., "Synthetic Approaches to Large Diamondoid Hydrocarbons", *Tetrahedron* 36:9710992 (1980).

Meeuwissen et al, "Synthesis of 1-Phosphaadamantane", *Tetrahedron Letters*, 39(24):4225-4228 (1983).

Mikhailov, B.M., et al., "Organoboron Compounds", *J. Organometallic Chemistry* 250:23-31 (1983).

Moiseev, I.K., et al., "Reactions of Adamantanes in Electrophilic Media", *Russian Chem. Reviews* 68(12):1001-1020 (1999).

Mochizuki, Y, et al., "Polarizability of Silicon Clusters", *Chemical Physics Letters* 336, 451-456 (2001).

Mukherjee, A.K., et al., "On the Stereochemistry of the Oxidation of 5-Phenyl-2-thiaadamantane", *J. Org. Chem.* 58:7955-7957 (1993).

Newton, M.E., "Neutral ($[N_8]^0$) and Ionised ($[N_6]^+$) Single Substitutional Nitrogen in Diamond", edited by M.H. Nazare and A.J. Neves, INSPEC pp. 136-141 (2001).

Neves, A.J., et al., "Optical and EPR Properties of Transition Metals in Diamond", edited by M.H. Nazare and A.J. Neves, INSPEC pp. 167-171(2001).

Nordlander et al., "Solvolysis of 1-Adamantylcarbinyl and 3-Homoadamantyl Derivatives. Mechanism of the Neopentyl Cation Rearrangement", *Journal of the American Chemical Society* 88:19 (1966).

Okoroanyanwu, U. et al., "Alicyclic Polymers for 193 nm Resist Applications: Lithographic Evaluation", *Chem. Mater.* 10:3329-3333 (1998).

Park, S., et al., "*endo*-Fullerene and Doped Diamond Nanocrystallite-Based Models of Qubits for Solid State Quantum Computers", *J. Nanoscience and Nanotechnology* 1(1):75-81 (2001).

Pasini, D., et al., *Advanced Materials* 12:347-351 (2000).

Pate, B.B., "The Diamond Surface: Atomic and Electronic Structure", *Surface Science* 165:83-142 (1986).

Pavesi, L, et al., "Optical Gain in Silicon Nanocrystals", *Nature* 408:440-444 (2000).

Pereira, E., "Photoconductivity in Diamond", edited by M.H. Nazare and A.J. Neves, INSPEC pp. 243-244 (2001).

Prins, J.F., "Large Dopants in Diamond", *Diamond*, edited by M.H. Nazare and A.J. Neves, INSPEC pp. 331-336 (2001).

Radziszewski, J.G., et al., "2-Azaadamant-1-ene and 4-Azaprotoadamant-3-ene", *J. Am. Chem.* 106:7996-7998 (1984).

Ramdas, A.K., "A1.2 Modifications to $^{12}C$-diamond by the $^{13}C$-isotope: Raman, Brillouin and Infrared Spectroscopy of Phonos", *INSPEC*, Properties, Growth and Applications of Diamondoids (2001).

Ramdas, A.K., "A1.3 Electronic Excitations in Isotopically Controlled Diamonds: Infrared and Raman Spectroscopy of Acceptor-Bound Holes", *INSPEC*, Properties, Growth and Applications of Diamondoids (2001).

Reinhardt, "Biadamantane and some if its Derivatives", *Journal of Organic Chemistry* 27:3258-3261 (1962).

Risch, N., et al., "Triple (Grob) Gragmentation. Retro-Mannish Reactions of 1-Aza-Adamantane Derivatives", *Tetrahedron Letters* 32(35):4465-4468 (1991).

Risch, N., et al., "Unusual Reorganization Reactions of 3-Azabicycl[3.3.1]nonanes", *J. Am. Chem. Soc.* 113:9411-9412 (1991).

Roberts, P.J., et al., "*anti*-Tetramantane, a Large Diamondoid Fragment", *Acta. Cryst.* B33:2335-2337 (1977).

Sasaki, T. et al., "New Highly Strained Bridgehead Imines, 2-Azaadamant-1-ene and 4-Azaprotoadamant-3-ene", *Tetrahedron Letters* 23(47):4969-4972 (1982).

Saski, T., et al., "Synthesis and Acidolysis of 3-*endo*-Azidomethyl- and 3-*endo*-Azido-bicyclo[3.3.1]non-6-enes. A Novel Synthesis of 4-Azahomoadamant-4-enes", *J. Chem. Soc. Perkin Trans I* 2529-2534 (1983).

Sasaki, T., et al., "Synthesis of Adamantane Derivatives. 42. Novel Sythesis of 5-Methylene-4-azahomoadamantane Derivatives from 2-Methyl-2-hydroxyadamantane and Their Carbon-13 Nuclear Manetic Resonance Spectra", *J. Org. Chem.* 43(20):3810-3813 (1978).

Sasaki et al., "Photolytic Generation on Anti-Bredt Imines from 1-Azidobicyclo[2.2.2]octane, 1-Azidobicyclo[3.3.1]nonane, and 3-Azidonoradamantane", *J. Org. Chem.* 48(22):4067-4072 (1983).

Sasaki et al., "Synthesis of Adamantane Derivatives. II. Preparation of Some Derivatives from Adamantylacetic Acid", *Bulletin of the Chemical Society of Japan* 41 (1):238-240 (1968).

Sasaki et al., "Substitution Reaction of 1-Bromoadamantane in Dimethyl Sulfoxide: Simple Synthesis of 1-Azidoadamantane", *Journal of the American Chemical Society* 92:24 (1970).

Sasaki et al, "Synthesis of Adamantane Derivatives. 39. Synthesis of Acidolysis of 2-Azidoadamantanes. A Facile Route to 4-Azahomoadamant-4-enes", *Heterocycles* 7(1):315-320 (1977).

Sasaki et al, "Synthesis of Adamantane Derivatives. 47. Photochemical Synthesis of 4-Azahomoadamant-4-enes and Further Studies on Their Reactivity in Some Cycloadditions", *Journal of Organometallic Chemistry* 44(21):3711-3712 (1979).

Sasaki, T., et al., "Synthesis of Adamantane Derivatives. XII. The Schmidt Reaction of Adamantane-2-one", *J. Org. Chem.* 35(12):4109 (1970).

Scherz, P., "Semiconductors: Chapter 4", pp. 123-190, from *Practical Electronics for Inventors*, McGraw-Hill (2000).

Scherz, P., "Optoelectronics: Chapter 5", pp. 191-212, from *Practical Electronics for Inventors*, McGraw-Hill , (2000).

Service, R.F., "Can Chemists Assemble a Future for Molecular Electronics?", *Science* 295:2398-2399 (2002).

Stetter, et al., "Zur Kenntnis der Adamantan-carbonsaure-(1)", *Uber Verbidugen mit Urotropin-Struktur*, XVII, pp. 1161-1166 (1960).

Stetter, et al., "Ein Beitrag zur Frage der Reaktivitat von Bruckenkopf-Carboniumionen", *Uber Verbindungen mit Urotropin-Struktur XXVI, Chem. Ber.* 96:550-555 (1963).

Stetter, et al., "Neue Moglichkeiten der Direcktsubstitution am Adamantan", *Uber Verbindugen mit Urotropin-Struktur, XLII, Chem. Ber.* 102(10):3357-3363 (1969).

Stetter et al., "Uber Adamantan-phosphonsaure-(1)-dichlorid", *Uber Verbindungen mit Urotropin-Strukture XLIV, Chem. Ber.* 102(10):3364-3366 (1969).

Stetter, et al., "Herstellung von Derivaten des 1-Phenyl-adamantans", *Uber Verbindungen mit Urotropin-Strukture, XXXI, Chem. Ber.* 97(12):3488-3492 (1964).

Stetter, H., et al., Ringschluβreaktionen ausgehend von Bicyclo[3.3.1]nonandion-(3.7) *Uber Verbindungen mit Urotropin-Struktur, XXX* 3480-3487 (1964).

Suginome, H., et al., "The Replacement of the Carbonyl Group of Adamantanone by an Oxygen or sulfur Atom and the One-step Transformation of 2-Methyladamantan-2-ol into 2-Oxaadamantane; An Efficient New Synthesis of 2-Oxa- and 2-Thiaadamantane", *Synthesis* 741-743 (1986).

Suginome et al, "Photoinduced Transformations. 73. Transformations of Five-(and Six-) Membered Cyclic Alcohols into Five-(and Six-) Membered Cyclic Ethers-A New Method of a Two-Step Transformation of Hydroxy Steroids into Oxasteroids", *Journal of Organometallic Chemistry* 49:3753-3762 (1984).

Udding et al, "A Ring-opening Reaction of and Some Cyclisations to the Adamantane System. A Quasi-favorsky Reaction of a β-bromoketone", *Tetrahedron Letters* 55:5719-5722 (1968).

Verhoeven, J.W., "From Close contact to Long-Range Intramolecular Electron Transfer", *Intramolecular Electron Transfer*, John Wiley and Sons, pp. 603-644 (1999).

von H.U. Daeniker, "206. 1-Hydrazinoadamantan", *Helvetica Chimica Acta* 50:2008-2010 (1967).

Yang, X. et al., "The Synthesis and Structural Characterization fo Carborane Oligomers Connected by Carbon-Carbon and Carbon-Boron Bonds Between Icosahedra", *Inorganica Chimica Acto* 240:371-378 (1995).

PCT Search Report from PCT/US03/22629 mailed Sep. 9, 2004.

Dahl, J.E. et al., "Isolation and Structure of Higher Diamondoids, Nanometer-Sized Diamond Molecules", *Science* 299:96-99 (2003).

Parker, I.D., "Carrier Tuneling and Device Characteristics in Polymer Light-Emmitting Diodes", *J. Appl. Phys.* 75(3):1656-1666 (1994).

Tada, K., et al., "Optical Properties and Blue and Green Electroluminescence in Soluble Disubstituted Acetylene Polymers", *Jpn. J. Appl. Phys.* 35, part 2, No. 9A: 1138-1141 (1996).

Zheng, S., et al., "Novel Blue Light Emitting Polymers", *Polymer Preprints* 41(1):822-823 (2000).

PCT Search Report from PCT/US03/22629 mailed Dec. 6, 2004.

* cited by examiner

POLYACETYLENE

POLYPARAPHEMYLENE

POLYPYRROLE

POLYPARAPHEMYLENE SULPHIDE

POLYTHIOPHENE

POLYPARAPHEMYLENE VINYLENE

POLY-3 METHYL THIOPHENE

POLYCARBAZOLE

POLYISOTHIANAPHENE

POLY(1,6-HEPTADIYNE)

POLY-3 ALKYLTHIOPHENE

POLYQUINOLINE

POLY-3 ALKYLSULSUFONATE

POLYANILINE

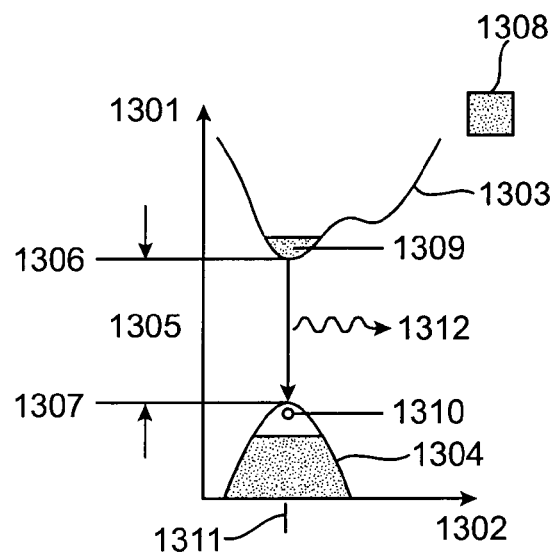 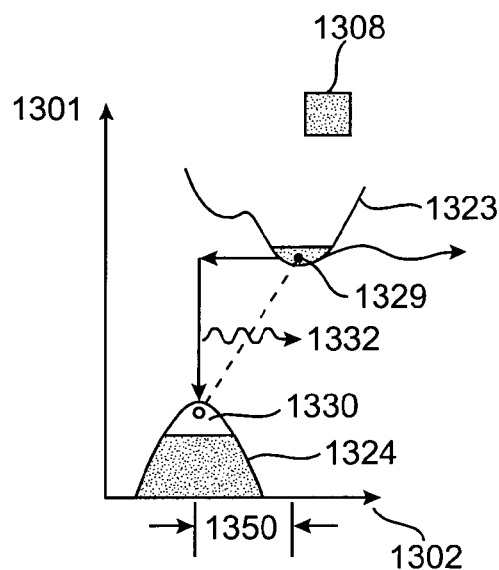
FIG. 13A  FIG. 13B
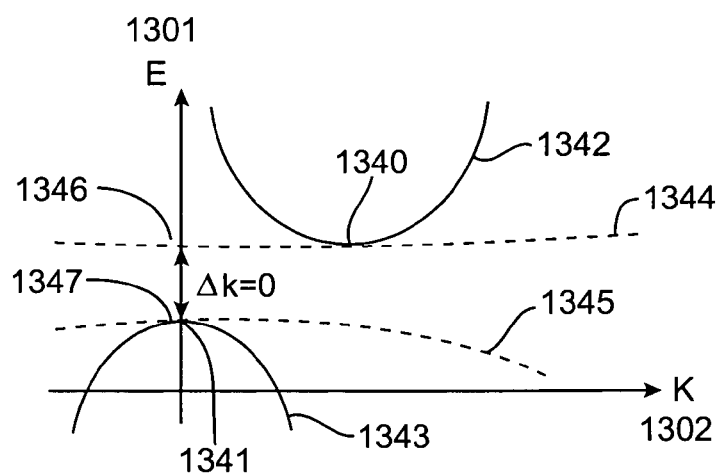
FIG. 13C

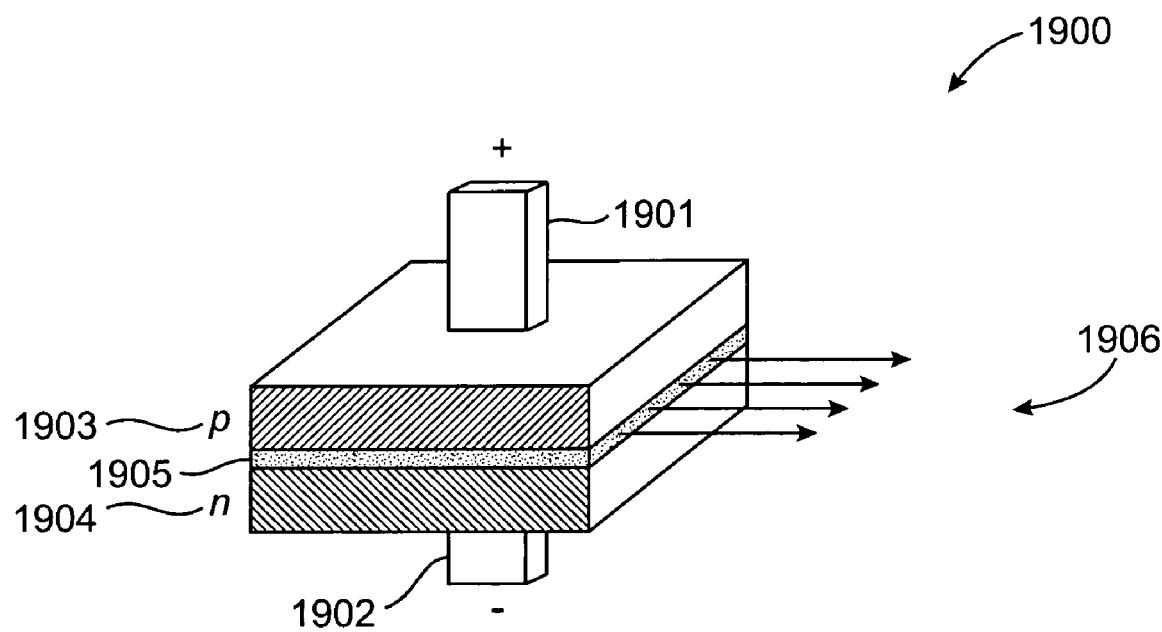
FIG. 19A
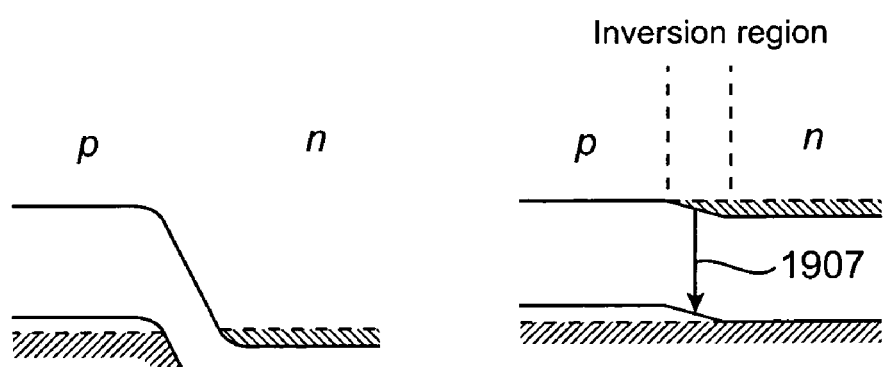
FIG. 19B
FIG. 19C

OPTICAL USES DIAMONDOID-CONTAINING MATERIALS

BACKGROUND OF THE INVENTION

1. Reference to Related Applications

The present application claims the benefit of U.S. Provisional Patent application No. 60/431,273 filed Dec. 6, 2002. U.S. Provisional Patent application No. 60/431,273 is hereby incorporated by reference in its entirety.

2. Field of the Invention

Embodiments of the present invention are directed in general toward the optical uses of diamondoid-containing materials. Specifically, these devices may include solid state dye lasers, semiconductor lasers, light emitting diodes, photodetectors, photoresistors, phototransistors, photovoltaic cells, solar cells, anti-reflection coatings, lenses, mirrors, pressure windows, optical waveguides, and particle and radiation detectors.

3. State of the Art

Carbon-containing materials offer a variety of potential uses in optics and optoelectronics. Elemental carbon has the electronic structure $1s^2 2s^2 2p^2$, where the outer shell 2s and 2p electrons have the ability to hybridize according to two different schemes. The so-called $sp^3$ hybridization comprises four identical σ bonds arranged in a tetrahedral manner. The so-called $sp^2$-hybridization comprises three trigonal (as well as planar) σ bonds with an unhybridized p-electron occupying a π orbital in a bond oriented perpendicular to the plane of the σ bonds. At the "extremes" of crystalline morphology are diamond and graphite. In diamond, the carbon atoms are tetrahedrally bonded with $sp^3$-hybridization. Graphite comprises planar "sheets" of $sp^2$-hybridized atoms, where the sheets interact weakly through perpendicularly oriented π bonds. Carbon exists in other morphologies as well, including amorphous forms called "diamond-like carbon" (DLC), and the highly symmetrical spherical and rod-shaped structures called "fullerenes" and "nanotubes," respectively.

Diamond is an exceptional material because it scores highest (or lowest, depending on one's point of view) in a number of different categories of properties. Not only is it the hardest material known, but it has the highest thermal conductivity of any material at room temperature. It displays superb optical transparency from the infrared through the ultraviolet, has the highest refractive index of any clear material, and is an excellent electrical insulator because of its very wide bandgap. It also displays high electrical breakdown strength, and very high electron and hole mobilities.

A form of carbon not discussed extensively in the literature is the "diamondoid." Diamondoids are bridged-ring cycloalkanes that comprise adamantane, diamantane, triamantane, and the tetramers, pentamers, hexamers, heptamers, octamers, nonamers, decamers, etc., of adamantane (tricyclo[3.3.1.1$^{3,7}$] decane), adamantane having the stoichiometric formula $C_{10}H_{16}$, in which various adamantane units are face-fused to form larger structures. These adamantane units are essentially subunits of diamondoids. The compounds have a "diamondoid" topology in that their carbon atom arrangements are superimposable on a fragment of an FCC (face centered cubic) diamond lattice. According to embodiments of the present invention, electron donating and withdrawing heteroatoms may be inserted into the diamond lattice, thereby creating an n and p-type (respectively) material. The heteroatom is essentially an impurity atom that has been "folded into" the diamond lattice, and thus many of the disadvantages of the prior art methods have been avoided.

SUMMARY OF THE INVENTION

Embodiments of the present invention are directed toward an optical device comprising a diamondoid-containing material.

One such device is a solid state dye laser comprising a diamondoid-containing lasing medium, an optical pumping system for delivering energy to the lasing medium, and an optical resonator for processing light emitted from the lasing medium.

The solid state dye laser has a lasing medium that may comprise a diamondoid-containing host material and either at least one color center or an optically active dopant, or both, within the host material. The color center comprises at least one nitrogen heteroatom in a heterodiamondoid positioned adjacent to at least one vacancy or pore. The dopant may be a rare earth element or a transition metal, actinide, lanthanide, or combinations thereof. The dopant may be selected from the group consisting of titanium, vanadium, chromium, iron, cobalt, nickel, zinc, zirconium, niobium, cadmium, hafnium, tantalum, tungsten, rhenium, osmium, iridium, platinum, gold, mercury, cerium, praseodymium, neodymium, promethium, samarium, europium, gadolinium, terbium, dysprosium, holmium, erbium, thulium, ytterbium, uranium, and combinations thereof.

Embodiments of the present invention also include a semiconducting laser having a light emitting p-n junction comprising a p-type diamondoid-containing material positioned adjacent to an n-type material to form a p-n junction for light emission, or a light emitting p-n junction comprising a n-type diamondoid-containing material positioned adjacent to an p-type material to form a p-n junction for light emission. The semiconducting laser may further include a means for applying a foward bias across the p-n junction to cause the emission of laser light from the p-n junction.

Embodiments of the present invention also include a light emitting diode comprising a diamondoid-containing material having a bandgap, and a means for generating an electric field to cause at least one electronic transition such that light is emitted from the diode. The electronic transition may occur across the bandgap. The light emitting diode may be further configured such that the electronic transition occurs without participation of electronic states within the bandgap.

Embodiments of the present invention also include a photodecector comprising a diamondoid-containing material having a bandgap, and a means of processing current from at least one electronic transition that results from the absorption of light by the material. The electronic transition may occur across the bandgap. The photodetector may be further configured such that the electronic transition occurs without participation of electronic states within the bandgap.

Additonal embodiments include a diamondoid-containing optical device selected from the group consisting of a photoresistor, a phototransistor, a photovoltaic cell, and a solar cell. Also contemplated as diamondoid-containing optical devices are lenses, mirrors, pressure windows, and optical waveguides.

An antireflection coating according to embodiments of the present invention comprises at least one alternating pair of a high refractive index diamondoid-containing layer and a low refractive index layer.

Each of the optical devices disclosed herein are fabricated at least in part from a diamondoid-containing material that is selected from the group consisting of a CVD-deposited film, a molecular crystal, and a polymerized film. The material comprises at least one diamondoid selected from the group consisting of adamantane, diamantane, and triamantane, and heterodiamondoid derivatives thereof. In another embodiment, the material comprises at least one diamondoid selected from the group consisting of tetramantane, pentamantane, hexamantane, heptamantane, octamantane, nonamantane, decamantane, and undecamantane, and heterodiamondoid derivatives thereof.

BRIEF DESCRIPTION OF THE DRAWINGS

FIGS. 13A, B are energy vs. momentum diagram for a direct bandgap semiconductor, and an indirect bandgap semiconductor, respectively;

FIG. 13C is an energy vs. momentum diagram for a indirect bandgap semiconductor having a nanocrystalline or quantum level morphology;

FIG. 19A is a schematic of an exemplary semiconductor laser (laser diode);

FIGS. 19B, C are bandgap diagrams of an exemplary p-n junction suitable for use in the semiconductor laser of FIG. 19A;

DETAILED DESCRIPTION OF THE INVENTION

Figure 1:
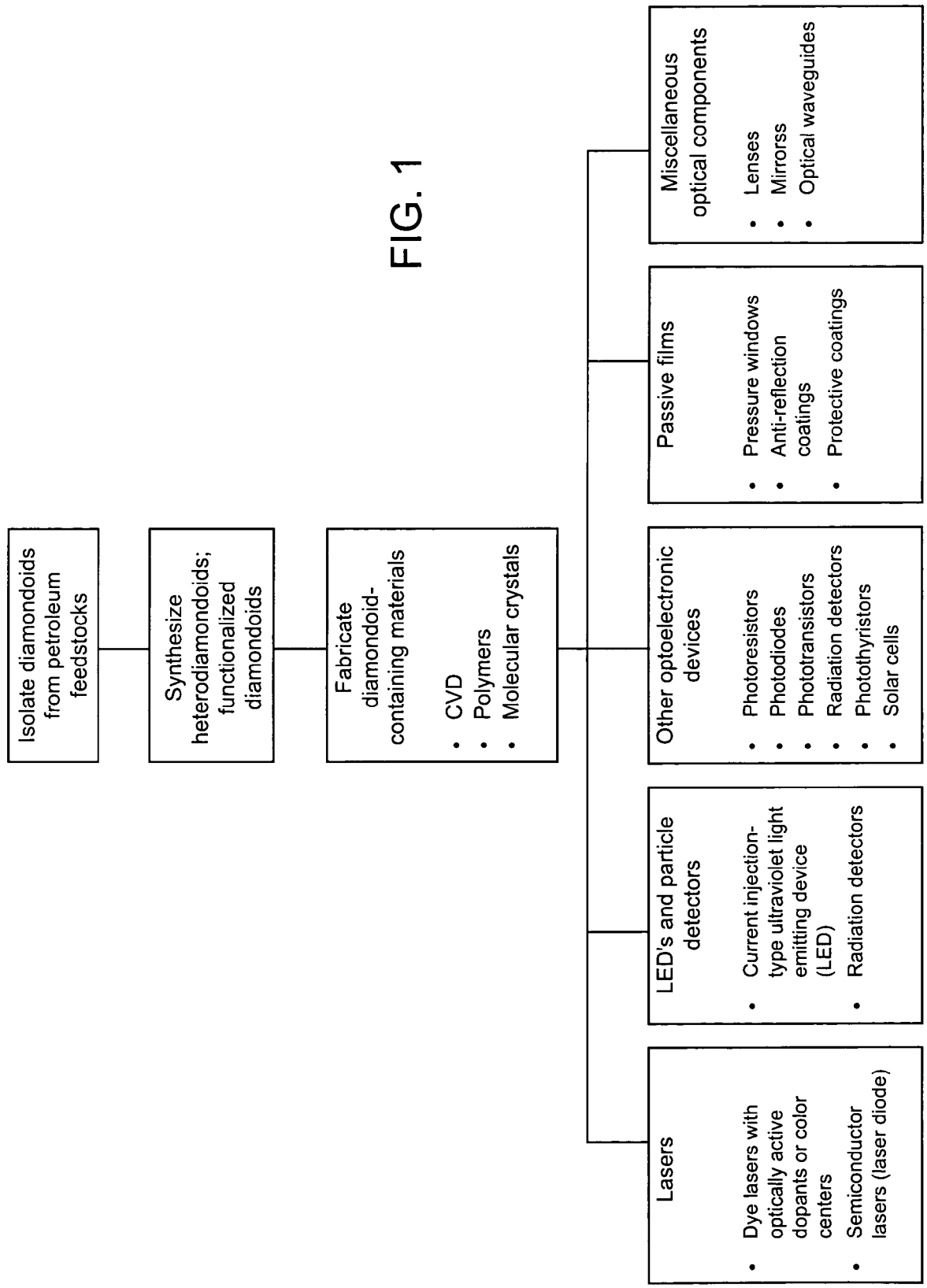
FIG. 1 is an overview of the embodiments of the present invention, showing the steps of isolating diamondoids from petroleum, synthesizing diamondoid and heterodiamondoid-containing materials, and creating optical and optoelectronic devices from the diamondoid and heterodiamondoid-containing materials.

The present disclosure will be organized in the following manner: first, the term diamondoids and heterodiamondoids will be defined, including a discussion of how these materials may be isolated. Next, the diamondoid containing materials that are contemplated to have optical uses will be discussed. These materials include CVD-deposited diamondoid-containing materials, molecular crystals, and polymeric materials. Following a discussion of diamondoid materials, the optical uses of diamondoid-containing materials will be reviewed. These uses include passive devices, meaning those that are not light emitting, versus active devices, which may emit light. Passive devices may also include lenses, pressure windows, optical waveguides, and antireflection coatings. Active devices include optoelectric devices such as photoresistors, photodiodes, and phototransistors, light emitting diodes, and lasers comprising crystalline dye lasers and semiconducting lasers (e.g., laser diodes).

Definition of Diamondoids

The term "diamondoids" refers to substituted and unsubstituted caged compounds of the adamantane series including adamantane, diamantane, triamantane, tetramantane, pentamantane, hexamantane, heptamantane, octamantane, nonamantane, decamantane, undecamantane, and the like, including all isomers and stereoisomers thereof. The compounds have a "diamondoid" topology, which means their carbon atom arrangement is superimposable on a fragment of an FCC diamond lattice. Substituted diamondoids comprise from 1 to 10 and preferably 1 to 4 independently-selected alkyl substituents.

Adamantane chemistry has been reviewed by Fort, Jr. et al. in "Adamantane: Consequences of the Diamondoid Structure," *Chem. Rev.* vol. 64, pp. 277–300 (1964). Adamantane is the smallest member of the diamondoid series and may be thought of as a single cage crystalline subunit. Diamantane contains two subunits, triamantane three, tetramantane four, and so on. While there is only one isomeric form of adamantane, diamantane, and triamantane, there are four different isomers of tetramantane (two of which represent an enantiomeric pair), i.e., four different possible ways of arranging the four adamantane subunits. The number of possible isomers increases non-linearly with each higher member of the diamondoid series, pentamantane, hexamantane, heptamantane, octamantane, nonamantane, decamantane, etc.

Adamantane, which is commercially available, has been studied extensively. The studies have been directed toward a number of areas, such as thermodynamic stability, finctionalization, and the properties of adamantane-containing materials. For instance, the following patents discuss materials comprising adamantane subunits: U.S. Pat. No. 3,457,318 teaches the preparation of polymers from alkenyl adamantanes; U.S. Pat. No. 3,832,332 teaches a polyamide polymer forms from alkyladamantane diamine; U.S. Pat. No. 5,017,734 discusses the formation of thermally stable resins from adamantane derivatives; and U.S. Pat. No. 6,235,851 reports the synthesis and polymerization of a variety of adamantane derivatives.

In contrast, the diamondoids tetramantane and higher have received comparatively little attention in the scientific literature. McKervay et al. have reported the synthesis of anti-tetramantane in low yields using a laborious, multistep process in "Synthetic Approaches to Large Diamondoid Hydrocarbons," *Tetrahedron*, vol. 36, pp. 971–992 (1980). To the inventors' knowledge, this is the only higher diamondoid that has been synthesized to date. Lin et al. have suggested the existence of, but did not isolate, tetramantane, pentamantane, and hexamantane in deep petroleum reservoirs in light of mass spectroscopic studies, reported in "Natural Occurrence of Tetramantane ($C_{22}H_{28}$), Pentamantane ($C_{26}H_{32}$) and Hexamantane ($C_{30}H_{36}$) in a Deep Petroleum Reservoir," *Fuel*, vol. 74(10), pp. 1512–1521 (1995). The possible presence of tetramantane and pentamantane in pot material after a distillation of a diamondoid-containing feedstock has been discussed by Chen et al. in U.S. Pat. No. 5,414,189.

The four tetramantane structures are iso-tetramantane [1(2)3], anti-tetramantane [121] and two enantiomers of skew-tetramantane [123], with the bracketed nomenclature for these diamondoids in accordance with a convention established by Balaban et al. in "Systematic Classification and Nomenclature of Diamond Hydrocarbons-I," *Tetrahedron* vol. 34, pp. 3599–3606 (1978). All four tetramantanes have the formula $C_{22}H_{28}$ (molecular weight 292). There are ten possible pentamantanes, nine having the molecular formula $C_{26}H_{32}$ (molecular weight 344) and among these nine, there are three pairs of enantiomers represented generally by [12(1)3], [1234], [1213] with the nine enantiomeric pentamantanes represented by [12(3)4], [1(2,3)4], [1212]. There also exists a pentamantane [1231] represented by the molecular formula $C_{25}H_{30}$ (molecular weight 330).

Hexamantanes exist in thirty nine possible structures with twenty eight having the molecular formula $C_{30}H_{36}$ (molecular weight 396) and of these, six are symmetrical; ten hexamantanes have the molecular formula $C_{29}H_{34}$ (molecular weight 382) and the remaining hexamantane [12312] has the molecular formula $C_{26}H_{30}$ (molecular weight 342).

Heptamantanes are postulated to exist in 160 possible structures with 85 having the molecular formula $C_{34}H_{40}$ (molecular weight 448) and of these, seven are achiral, having no enantiomers. Of the remaining heptamantanes 67 have the molecular formula $C_{33}H_{38}$ (molecular weight 434), six have the molecular formula $C_{32}H_{36}$ (molecular weight 420) and the remaining two have the molecular formula $C_{30}H_{34}$ (molecular weight 394).

Octamantanes possess eight of the adamantane subunits and exist with five different molecular weights. Among the octamantanes, 18 have the molecular formula $C_{34}H_{38}$ (molecular weight 446). Octamantanes also have the molecular formula $C_{38}H_{44}$ (molecular weight 500); $C_{37}H_{42}$ (molecular weight 486); $C_{36}H_{40}$ (molecular weight 472), and $C_{33}H_{36}$ (molecular weight 432).

Nonamantanes exist within six families of different molecular weights having the following molecular formulas: $C_{42}H_{48}$ (molecular weight 552), $C_{41}H_{46}$ (molecular weight 538), $C_{40}H_{44}$ (molecular weight 524, $C_{38}H_{42}$ (molecular weight 498), $C_{37}H_{40}$ (molecular weight 484) and $C_{34}H_{36}$ (molecular weight 444).

Decamantane exists within families of seven different molecular weights. Among the decamantanes, there is a single decamantane having the molecular formula $C_{35}H_{36}$ (molecular weight 456) which is structurally compact in relation to the other decamantanes. The other decamantane families have the molecular formulas: $C_{46}H_{52}$ (molecular weight 604); $C_{45}H_{50}$ (molecular weight 590); $C_{44}H_{48}$ (molecular weight 576); $C_{42}H_{46}$ (molecular weight 550); $C_{41}H_{44}$ (molecular weight 536); and $C_{38}H_{40}$ (molecular weight 496).

Undecamantane exists within families of eight different molecular weights. Among the undecamantanes there are two undecamantanes having the molecular formula $C_{39}H_{40}$ (molecular weight 508) which are structurally compact in relation to the other undecamantanes. The other undecamantane families have the molecular formulas $C_{41}H_{42}$ (molecular weight 534); $C_{42}H_{44}$ (molecular weight 548); $C_{45}H_{48}$ (molecular weight 588); $C_{46}H_{50}$ (molecular weight 602); $C_{48}H_{52}$ (molecular weight 628); $C_{49}H_{54}$ (molecular weight 642); and $C_{50}H_{56}$ (molecular weight 656).

The term "heterodiamondoid" as used herein refers to a diamondoid that contains a heteroatom typically substitionally positioned on a lattice site of the diamond crystal structure. A heteroatom is an atom other than carbon, and according to present embodiments may be nitrogen, phosphorus, boron, aluminium, lithium, and arsenic. "Substitutionally positioned" means that the heteroatom has replaced a carbon host atom in the diamond lattice. Although most heteroatoms are substitutionally positioned, they may in some cases be found in interstitial sites as well. As with diamondoids, a heterodiamondoid may be finctionalized or derivatized. In the present disclosure, an n-type or p-type diamondoid typically refers to a an n-type or p-type heterodiamondoid, but in some cases the n or p-type material may comprise diamondoids with no heteroatom.

Figure 2:
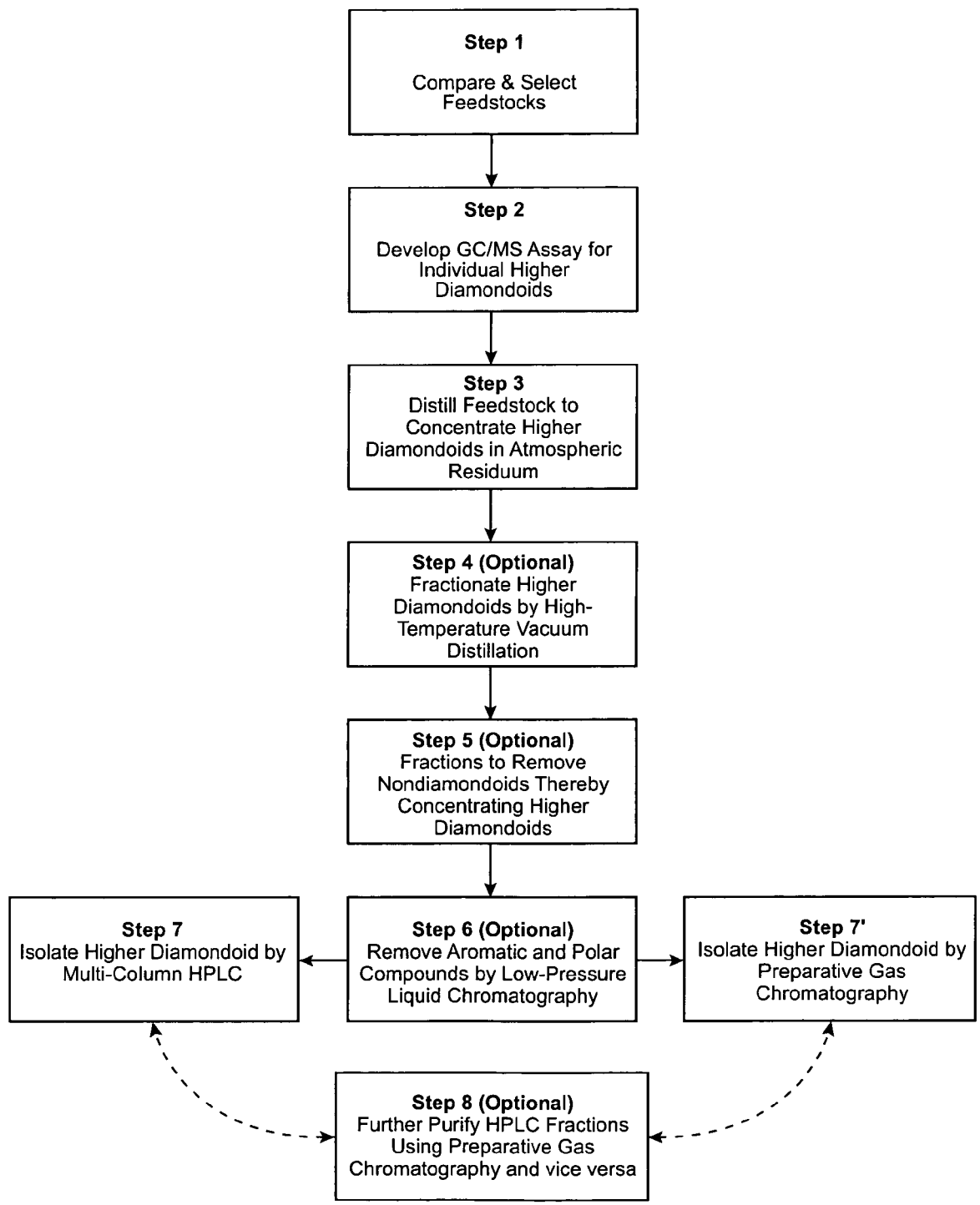
FIG. 2 shows an exemplary process flow for isolating diamondoids from petroleum.
Figure 3:
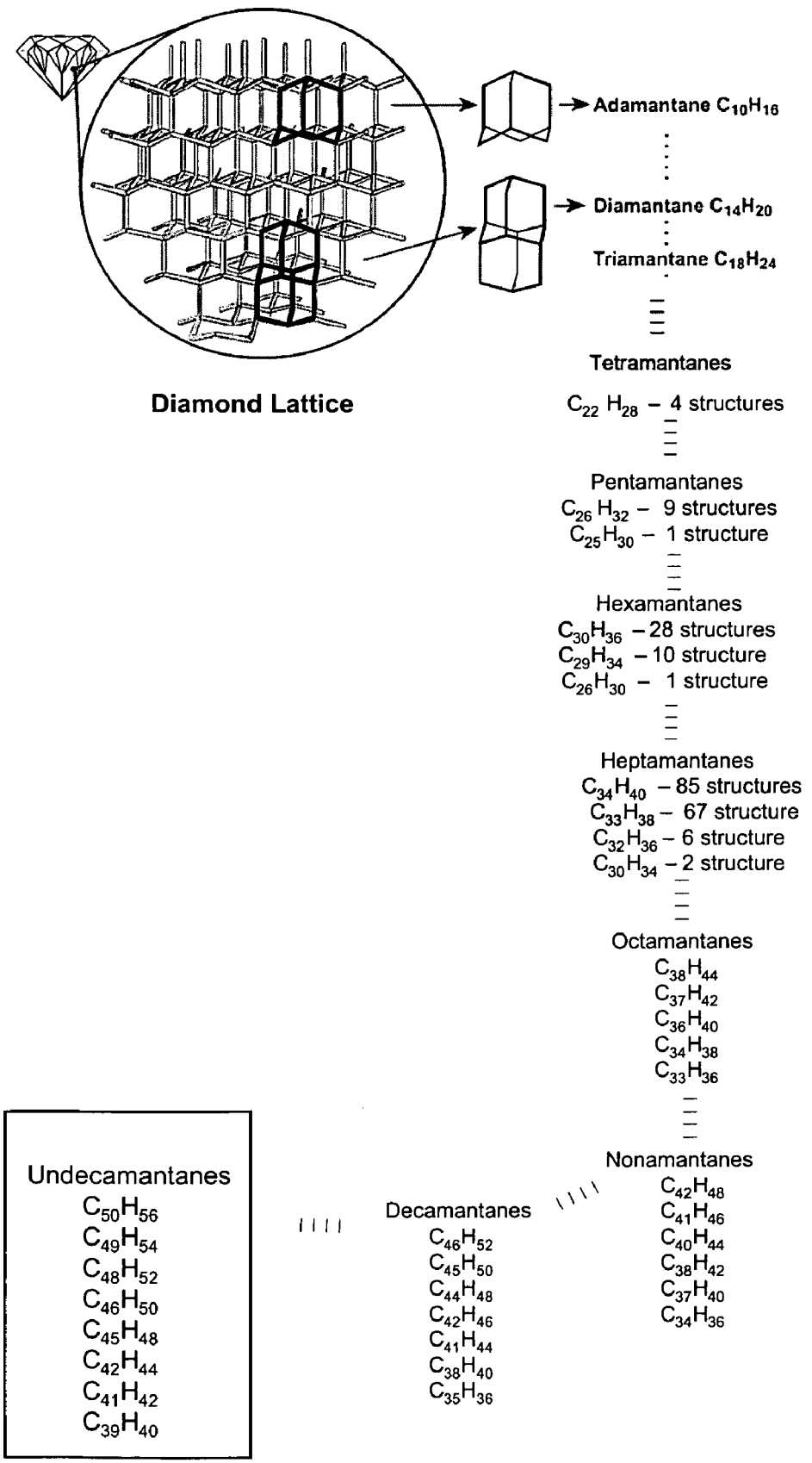
FIG. 3 illustrates the relationship of a diamondoid to the diamond crystal lattice, and enumerates many of the diamondoids available by stoichiometric formula.

FIG. 2 shows a process flow illustrated in schematic form, wherein diamondoids may be extracted from petroleum feedstocks, and FIG. 3 enumerates the various diamondoid isomers that are available from embodiments of the present invention.

Synthesis of Heterodiamondoids

Figure 4:
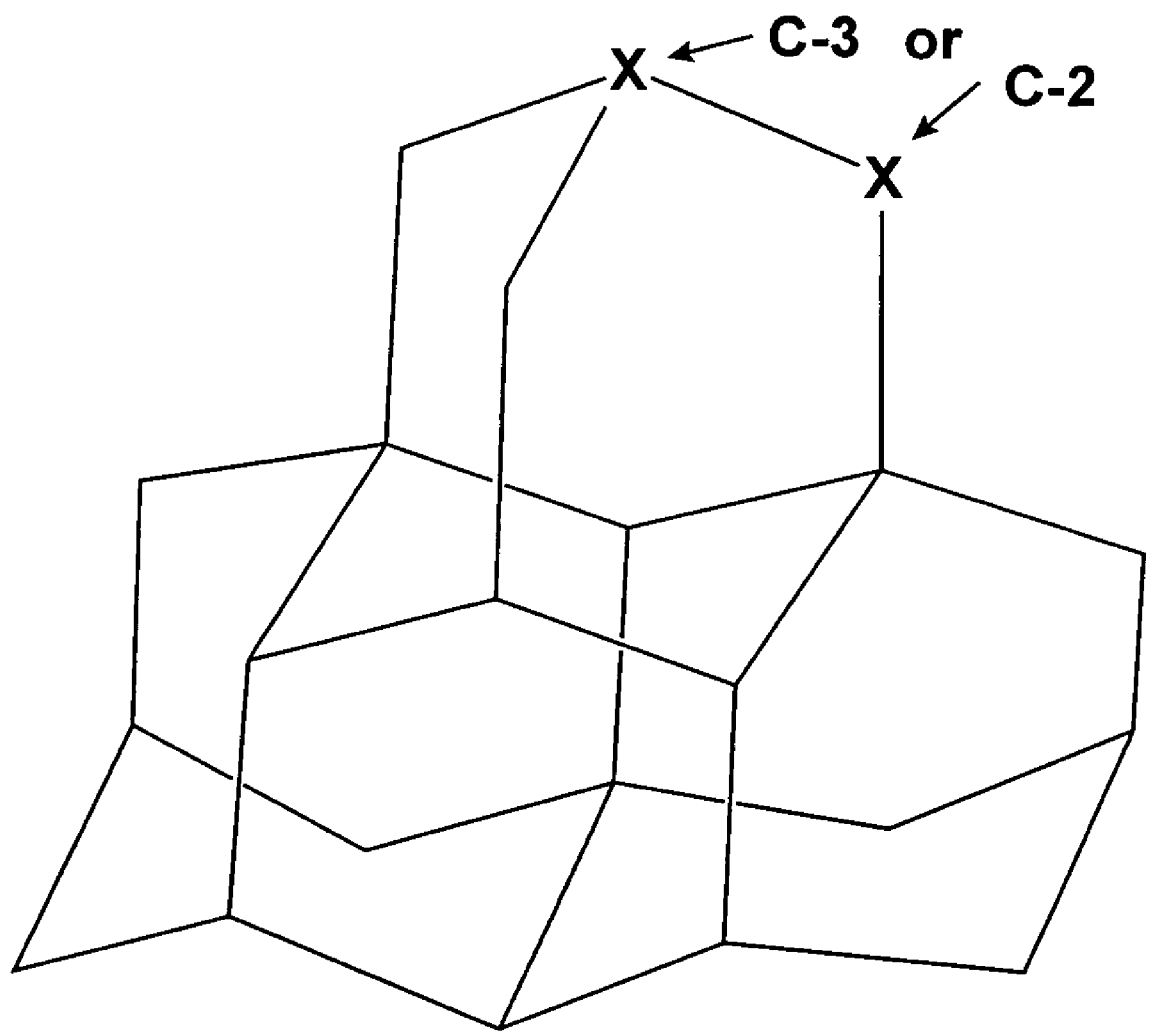
FIG. 4 illustrates exemplary heterodiamondoids, and indicates the types of carbon positions where a heteroatom may be substitutionally positionned.

FIG. 4 illustrates exemplary heterodiamondoids, indicating the types of carbon positions where a heteroatom may be substitutionally positionned. These positions are labelled C-2 and C-3 in the exemplary diamonoid of FIG. 4. The term "diamondoid" will herein be used in a general sense to include diamondoids both with and without heteroatom substitutions. As disclosed above, the heteroatom may be an electron donating element such as N, P, or As, or a hole donating element such as B or Al.

Next, the actual synthesis of such heterodiamondoids will be discussed. Although some heteroadamantane and heterodiamantane compounds have been synthesized in the past, and this may suggest a starting point for the synthesis of heterodiamondoids having more than two or three fused adamantane subunits, it will be appreciated by those skilled in the art that the complexity of the individual reactions and overall synthetic pathways increase as the number of adamantane subunits increases. For example, it may be necessary to employ protecting groups, or it may become more difficult to solubilize the reactants, or the reaction conditions may be vastly different from those that would have been used for the analagous reaction with adamantane. Nevertheless, it can be advantageous to discuss the chemistry underlying heterodiamondoid synthesis using adamantane or diamantane as a substrate because to the intentors' knowledge these are the only systems for which data has been available, prior to the present application.

Nitrogen hetero-adamantane compounds have been synthesized in the past. For example, in an article by T. Sasaki et al., "Synthesis of adamantane derivatives. 39. Synthesis and acidolysis of 2-azidoadamantanes. A facile route to 4-azahomoadamant-4-enes," *Heterocycles*, Vol. 7, No. 1, p. 315 (1977). These authors reported a synthesis of 1-azidoadamantane and 3-hydroxy-4-azahomoadamantane from 1-hydroxyadamantane. The procedure consisted of a substitution of a hydroxyl group with an azide function via the formation of a carbocation, followed by acidolysis of the azide product.

In a related synthetic pathway, Sasaki et al. were able to subject an adamantanone to the conditions of a Schmidt reaction, producing a 4-keto-3-azahomoadamantane as a rearranged product. For details pertaining to the Schmidt reaction, see T. Sasaki et al., "Synthesis of Adamantane Derivatives. XII. The Schmidt Reaction of Adamantane-2-one," *J. Org. Chem.*, Vol. 35, No. 12, p. 4109 (1970).

Alternatively, an 1-hydroxy-2-azaadamantane may be synthesized from 1,3-dibromoadamantane, as reported by A. Gagneux et al. in "1-Substituted 2-heteroadamantanes," *Tetrahedron Letters* No. 17, pp. 1365–1368 (1969). This was a multiple-step process, wherein first the di-bromo starting material was heated to a methyl ketone, which subsequently underwent ozonization to a diketone. The diketone was heated with four equivalents of hydroxylamine to produce a 1:1 mixture of cis and transdioximes; this mixture was hydrogenated to the compound 1-amino-2-azaadamantane dihydrochloride. Finally, nitrous acid transformed the dihydrochloride to the heteroadamantane 1-hydroxy-2-azadamantane.

Alternatively, a 2-azaadamantane compound may be synthesized from a bicyclo[3.3.1]nonane-3,7-dione, as reported by J. G. Henkel and W. C. Faith, in "Neighboring group effects in the β-halo amines. Synthesis and solvolytic reactivity of the anti-4-substituted 2-azaadamantyl system," in *J. Org. Chem.* Vol. 46, No. 24, pp. 4953–4959 (1981). The dione may be converted by reductive amination (although the use of ammonium acetate and sodium cyanoborohydride produced better yields) to an intermediate, which may be converted to another intermediate using thionyl choloride. Dehalogenation of this second intermediate to 2-azaadamantane was accomplished in good yield using $LiAlH_4$ in DME.

A synthetic pathway that is related in principal to one used in the present invention was reported by S. Eguchi et al. in "A novel route to the 2-aza-adamantyl system via photochemical ring contraction of epoxy 4-azahomoadamantanes," *J. Chem. Soc. Chem. Commun.*, p. 1147 (1984). In this approach, a 2-hydroxyadamantane was reacted with a $NaN_3$ based reagent system to form the azahomoadamantane, with was then oxidized by m-chloroperbenzoid acid (m-CPBA) to give an epoxy 4-azahomoadamantane. The epoxy was then irradiated in a photochemical ring contraction reaction to yield the N-acyl-2-aza-adamantane.

Figure 5A:
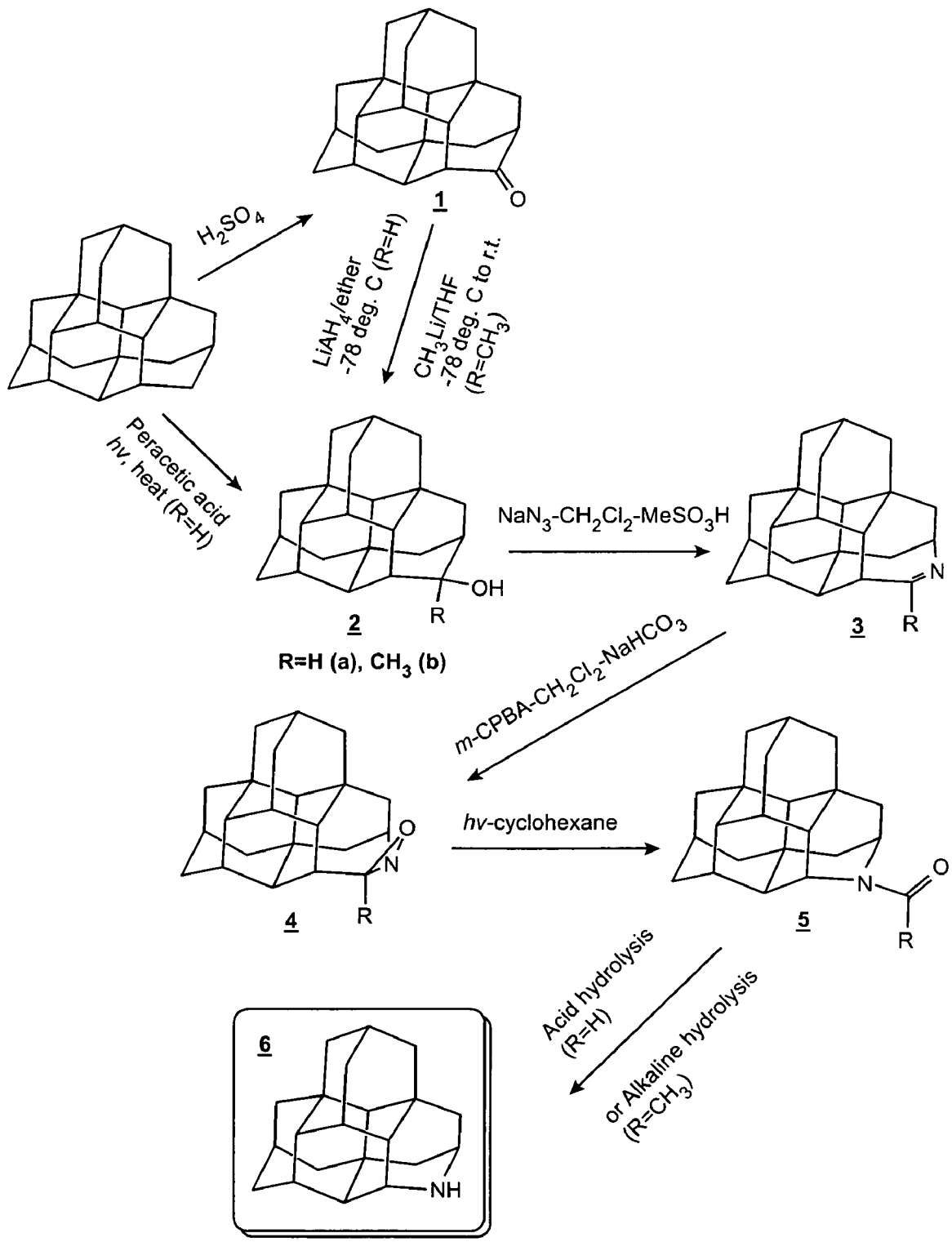
FIGS. 5A–B illustrate exemplary pathways for synthetically producing heterodiamondoids.
Figure 5B:
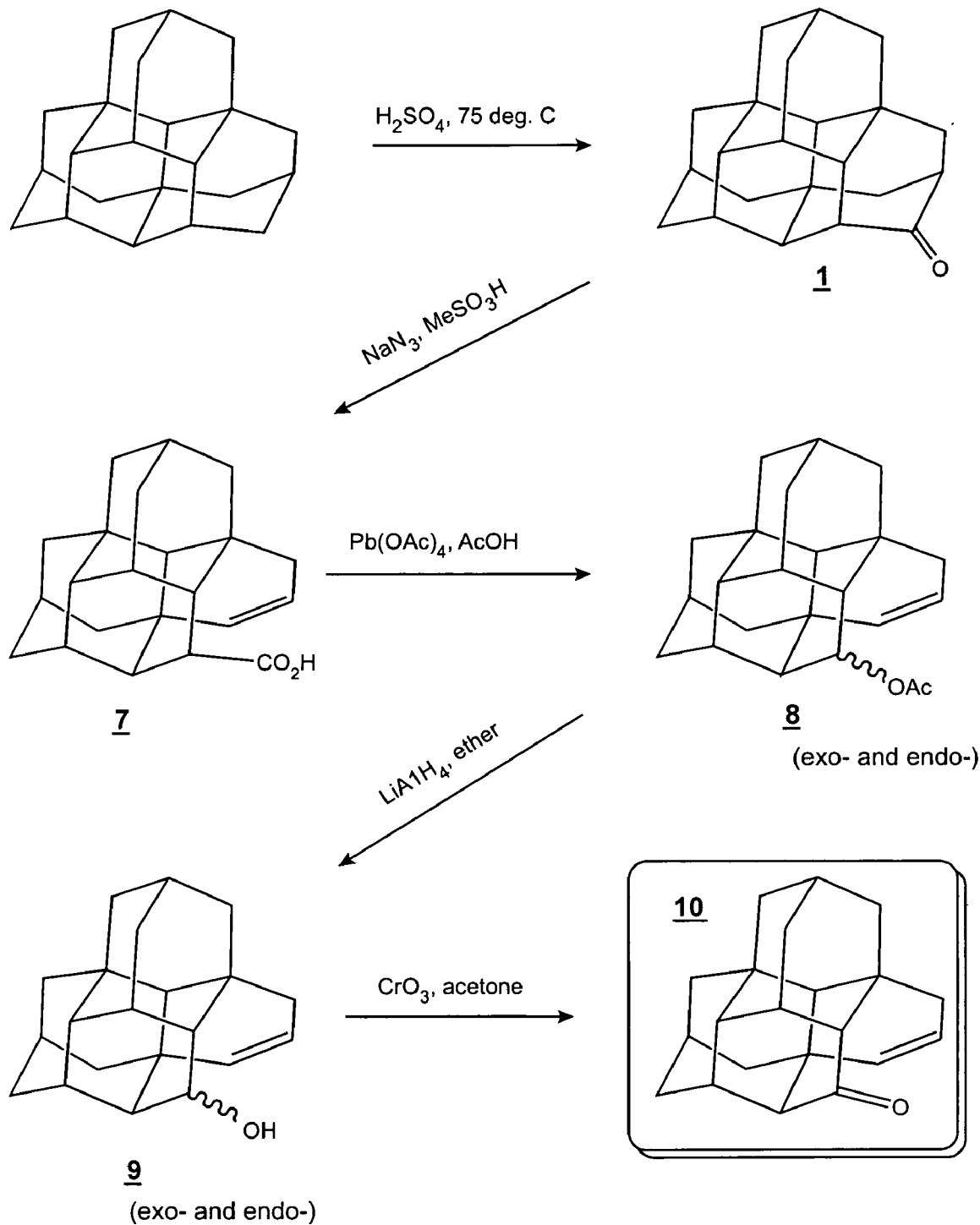
Figure 5B:
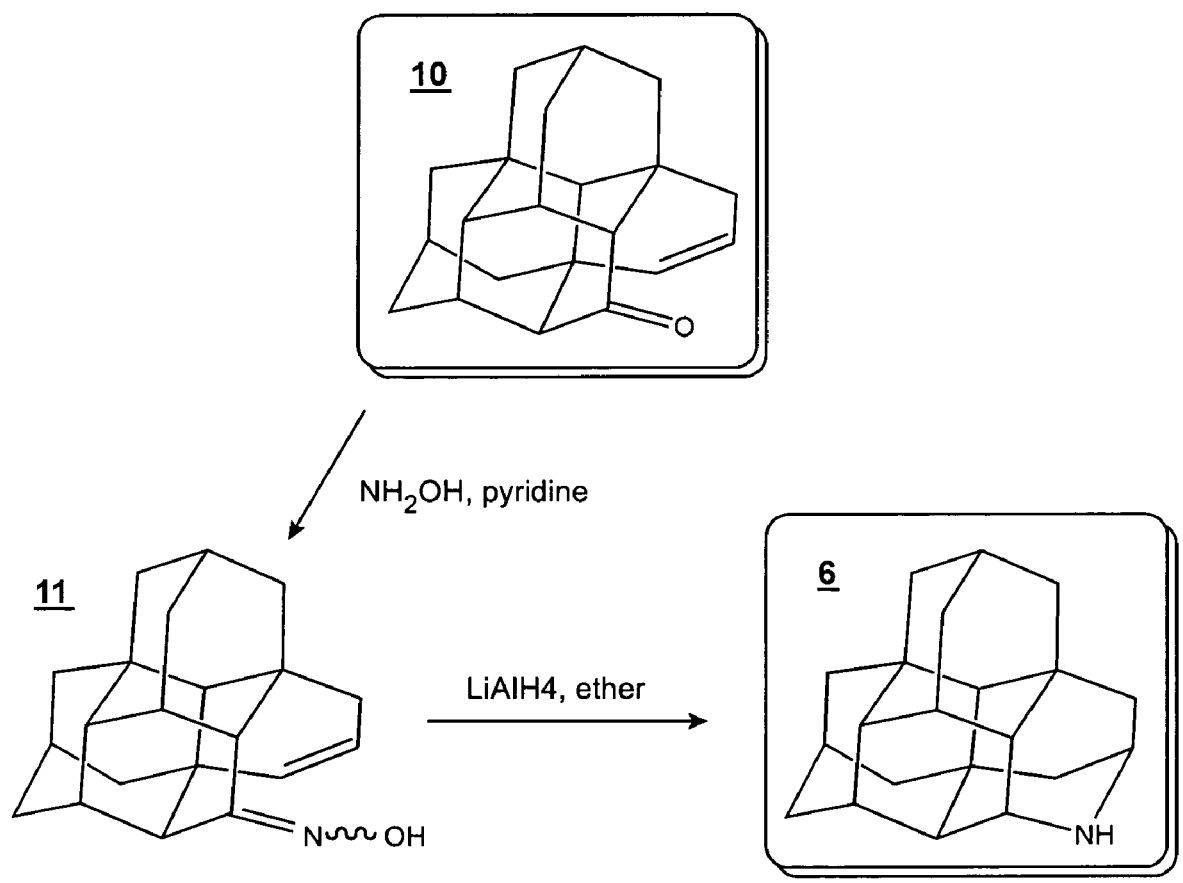

An exemplary reaction pathway for synthesizing a nitrogen containing hetero iso-tetramantane is illustrated in FIG. 5A. It will be known to those of ordinary skill in the art that the reactions conditions of the pathway depicted in FIG. 5A will be substantially different from those of Eguchi due to the differences in size, solubility, and reactivities of tetramantane in relation to adamantane. A second pathway available for synthesizing nitrogen containing heterodiamondoids is illustrated in FIG. 5B.

In another embodiment of the present invention, a phosphorus containing heterodiamondoid may be synthesized by adapting the pathway outlined by J. J. Meeuwissen et. al in "Synthesis of 1-phosphaadamantane," *Tetrahedron* Vol. 39, No. 24, pp. 4225–4228 (1983). It is contemplated that such a pathway may be able to synthesis heterodiamondoids that contain both nitrogen and phosphorus atoms substitutionally positioned in the diamondoid structure, with the advantages of having two different types of electron donating heteroatoms in the same structure.

After preparing heterodiamondoids from diamondoids having no impurity atoms, the resulting heterodiamondoids may be fabricated into bulk materials for use in semiconductor devices. Alternatively, it is contemplated that the heterodiamondoids may be used at a molecular level, where bulk materials are not necessary. The preparation of these materials will be discussed next, and they are also discussed in a copending application titled "Heterodiamondoids," by S. Liu, J. E. Daho, and R. M. Carlson, assigned to the assignee of the present application, and incorporated herein in its entirety.

Isolation of Diamondoids from Petroleum Feedstocks

Feedstocks that contain recoverable amounts of higher diamondoids include, for example, natural gas condensates and refinery streams resulting from cracking, distillation, coking processes, and the like. Particularly preferred feedstocks originate from the Norphlet Formation in the Gulf of Mexico and the LeDuc Formation in Canada.

These feedstocks contain large proportions of lower diamondoids (often as much as about two thirds) and lower but significant amounts of higher diamondoids (often as much as about 0.3 to 0.5 percent by weight). The processing of such feedstocks to remove non-diamondoids and to separate higher and lower diamondoids (if desired) can be carried out using, by way of example only, size separation techniques such as membranes, molecular sieves, etc., evaporation and thermal separators either under normal or reduced pressures, extractors, electrostatic separators, crystallization, chromatography, well head separators, and the like.

A preferred separation method typically includes distillation of the feedstock. This can remove low-boiling, non-diamondoid components. It can also remove or separate out lower and higher diamondoid components having a boiling point less than that of the higher diamondoid(s) selected for isolation. In either instance, the lower cuts will be enriched in lower diamondoids and low boiling point non-diamondoid materials. Distillation can be operated to provide several cuts in the temperature range of interest to provide the initial isolation of the identified higher diamondoid. The cuts, which are enriched in higher diamondoids or the diamondoid of interest, are retained and may require further purification. Other methods for the removal of contaminants and further purification of an enriched diamondoid fraction can additionally include the following nonlimiting examples: size separation techniques, evaporation either under normal or reduced pressure, sublimation, crystallization, chromatography, well head separators, flash distillation, fixed and fluid bed reactors, reduced pressure, and the like.

The removal of non-diamondoids may also include a thermal treatment step either prior or subsequent to distillation. The thermal treatment step may include a hydrotreating step, a hydrocracking step, a hydroprocessing step, or a pyrolysis step. Thermal treatment is an effective method to remove hydrocarbonaceous, non-diamondoid components from the feedstock, and one embodiment of it, pyrolysis, is effected by heating the feedstock under vacuum conditions, or in an inert atmosphere, to a temperature of at least about 390° C., and most preferably to a temperature in the range of about 410 to 450° C. Pyrolysis is continued for a sufficient length of time, and at a sufficiently high temperature, to thermally degrade at least about 10 percent by weight of the non-diamondoid components that were in the feed material prior to pyrolysis. More preferably at least about 50 percent by weight, and even more preferably at least 90 percent by weight of the non-diamondoids are thermally degraded.

While pyrolysis is preferred in one embodiment, it is not always necessary to facilitate the recovery, isolation or purification of diamondoids. Other separation methods may allow for the concentration of diamondoids to be sufficiently high given certain feedstocks such that direct purification methods such as chromatography including preparative gas chromatography and high performance liquid chromatography, crystallization, fractional sublimation may be used to isolate diamondoids.

Even after distillation or pyrolysis/distillation, further purification of the material may be desired to provide selected diamondoids for use in the compositions employed in this invention. Such purification techniques include chromatography, crystallization, thermal diffusion techniques, zone refining, progressive recrystallization, size separation, and the like. For instance, in one process, the recovered feedstock is subjected to the following additional procedures: 1) gravity column chromatography using silver nitrate impregnated silica gel; 2) two-column preparative capillary gas chromatography to isolate diamondoids; 3) crystallization to provide crystals of the highly concentrated diamondoids.

An alternative process is to use single or multiple column liquid chromatography, including high performance liquid chromatography, to isolate the diamondoids of interest. As above, multiple columns with different selectivities may be used. Further processing using these methods allow for more refined separations which can lead to a substantially pure component.

Detailed methods for processing feedstocks to obtain higher diamondoid compositions are set forth in U.S. Provisional Patent Application No. 60/262,842 filed Jan. 19, 2001; U.S. Provisional Patent Application No. 60/300,148 filed Jun. 21, 2001; and U.S. Provisional Patent Application No. 60/307,063 filed Jul. 20, 2001, and a co-pending application titled "Processes for concentrating higher diamondoids," by B. Carlson et al., assigned to the assignee of the present application. These applications are herein incorporated by reference in their entirety.

Materials

The diamondoid-containing materials that may be used in embodiments of the present invention may be fabricated in a number of different ways. Methods of fabrication include are CVD deposited diamondoid and diamondoid-containing materials, CVD nucleated diamond materials; polymeric materials including polymerized diamondoids and/or diamondoid-containing films; and molecular crystals, including those that are self assembled or self crystallizing.

In a first embodiment, diamondoids (which may or may not contain heteroatoms) are injected into a reactor carrying out a conventional CVD process such that the diamondoids are added to and become a part of an extended diamond structure, and if present, the heteroatom becomes substitutionally positioned on a diamond lattice site. Such a heteroatom behaves like a dopant in conventionally produced doped diamond. In another embodiment, heterodiamondoids may be derivatized (or functionalized) with finctional groups capable of causing a polymerizing reaction, and in one embodiment, the functional groups linking two adjacent heterodiamondoids are electrically semiconducting. In a third embodiment, the n orp-type material comprises only heterodiamondoids in a bulk heterodiamondoid crystal, wherein the individual heterodiamondoids in the crystal are held together by van der Waals (London) forces.

Optical uses of diamondoid-containing materials in accordance with the present embodiments are not limited to these types of materials, and may include any other type of film that contains the diamondoid form of carbon.

Preparation of Diamondoid-containing Materials Using CVD Techniques

In a first embodiment, diamondoid-containing materials, including n and p-type diamondoid materials, are fabricated according to embodiments of the present invention using chemical vapor deposition (CVD) techniques. Diamondoids may be employed as carbon precursor and heterodiamondoids as self-contained dopant sources already $sp^3$-hybridized in a diamond lattice, using conventional CVD techniques. In a novel approach, the use of the diamondoids and heterodiamondoids may be used to nucleate a diamond film using conventional CVD techniques, where such conventional techniques include thermal CVD, laser CVD, plasma-enhanced or plasma-assisted CVD, electron beam CVD, and the like.

Conventional methods of synthesizing diamond by plasma enhanced chemical vapor deposition (PECVD) techniques are well known in the art, and date back to around the early 1980's. Although it is not necessary to discuss the specifics of these methods as they relate to the present invention, one point in particular that should be made since it is relevant to the role hydrogen plays in the synthesis of diamond by "conventional" plasma-CVD techniques.

In one method of synthesizing diamond films discussed by A. Erdemir et al. in "Tribology of Diamond, Diamond-Like Carbon, and Related Films," in *Modern Tribology Handbook*, Vol. Two, B. Bhushan, Ed. (CRC Press, Boca Raton, 2001) pp. 871–908, a modified microwave CVD reactor is used to deposit a nanocrystalline diamond film using a $C_{60}$ fullerene, or methane, gas carbon precursor. To introduce the $C_{60}$ fullerene precursor into the reactor, a device called a "quartz transpirator" is attached to the reactor, wherein this device essentially heats a fullerene-rich soot to temperatures between about 550 and 600° C. to sublime the $C_{60}$ fullerene into the gas phase.

Figure 6:
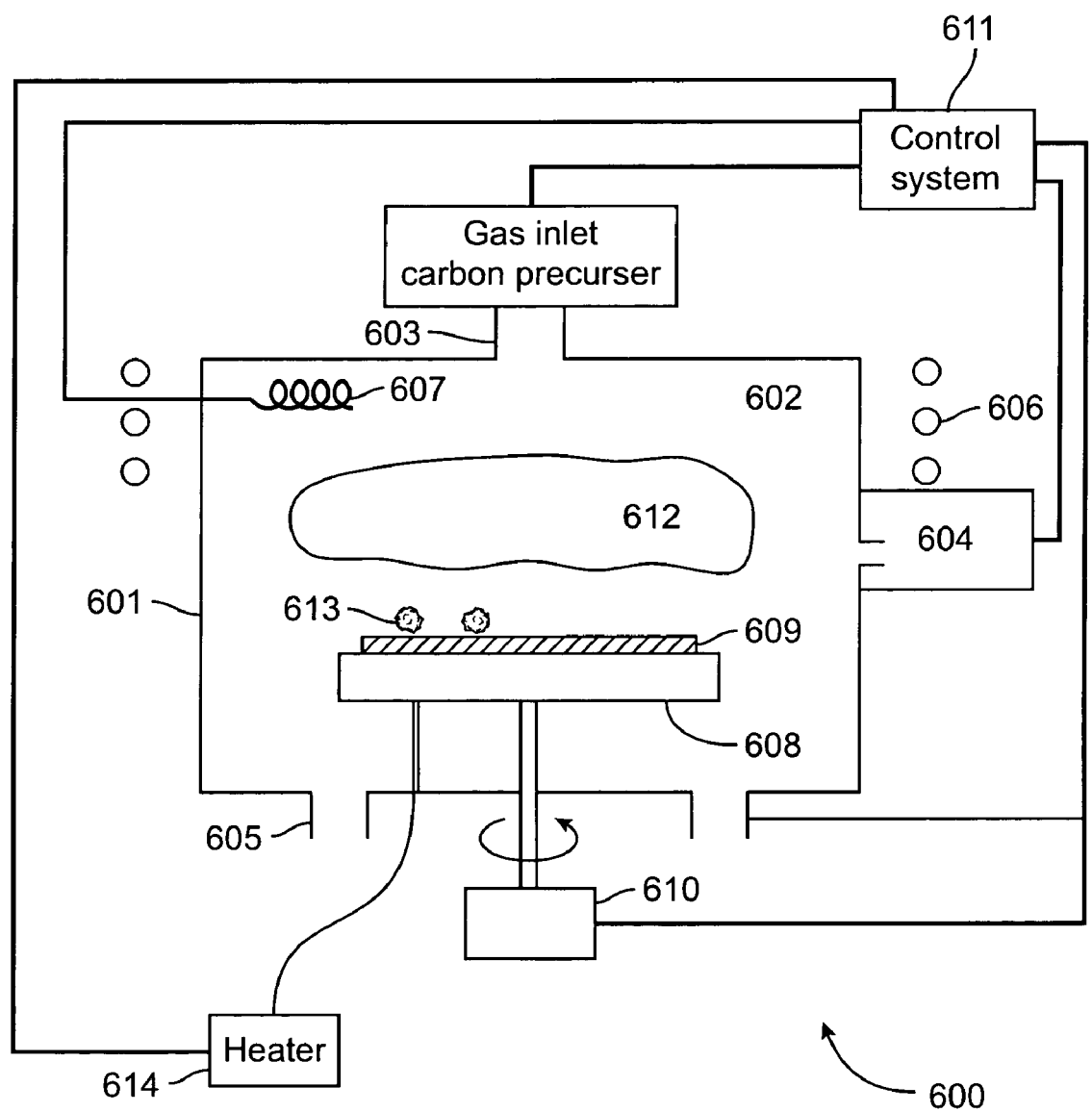
FIG. 6 illustrates an exemplary processing reactor in which undoped diamondoid-containing materials, or n and p-type heterodiamondoid materials may be made using chemical vapor deposition (CVD) techniques.

It is contemplated that a similar device may be used to sublime diamondoids into the gas phase such that they may be introduced to a CVD reactor. An exemplary reactor is shown in generally at 600 in FIG. 6. A reactor 600 comprises reactor walls 601 enclosing a process space 602. A gas inlet tube 603 is used to introduce process gas into the process space 602, the process gas comprising methane, hydrogen, and optionally an inert gas such as argon. A diamondoid subliming or volatilizing device 604, similar to the quartz transpirator discussed above, may be used to volatilize and inject a diamondoid containing gas into the reactor 600. The volatilizer 604 may include a means for introducing a carrier gas such as hydrogen, nitrogen, argon, or an inert gas such as a noble gas other than argon, and it may contain other carbon precursor gases such as methane, ethane, or ethylene.

Consistent with conventional CVD reactors, the reactor 600 may have exhaust outlets 605 for removing process gases from the process space 602; an energy source 606 for coupling energy into process space 602 (and striking a plasma from) process gases contained within process space 602; a filament 607 for converting molecular hydrogen to monoatomic hydrogen; a susceptor 608 onto which a diamondoid containing film 609 is grown; a means 610 for rotating the susceptor 608 for enhancing the $sp^3$-hybridized uniformity of the diamondoid-containing film 609; and a control system 611 for regulating and controlling the flow of gases through inlet 603; the amount of power coupled from source 606 into the processing space 602; the amount of diamondoids injected into the processing space 602; the amount of process gases exhausted through exhaust ports 605; the atomization of hydrogen from filament 607; and the means 610 for rotating the susceptor 608. In an exemplary embodiment, the plasma energy source 606 comprises an induction coil such that power is coupled into process gases within processing space 602 to create a plasma 612.

A diamondoid and/or heterodiamondoid precursor may be injected into reactor 600 according to embodiments of the present invention through the volatilizer 604, which serves to volatilize the diamondoids. A carrier gas such as methane or argon may be used to facilitate transfer of the diamondoids entrained in the carrier gas into the process space 602. The injection of such heterodiamondoids provides a method whereby impurity atoms may be inserted into a diamond film without having to resort to crystal damaging techniques such as ion implantation.

It is contemplated in some embodiments that the injected methane gas provides the majority of the carbon material present in a CVD created film, with the diamondoid portion of the input gas facilitating the rate of growth, but more importantly, the heteroatom of the heterodiamondoid supplying the impurity that will eventually function as the electron donor or acceptor in the n and p-type diamond or diamondoid-containing film. This process is illustrated schematically in FIGS. 7A–7C.

Figure 7A:
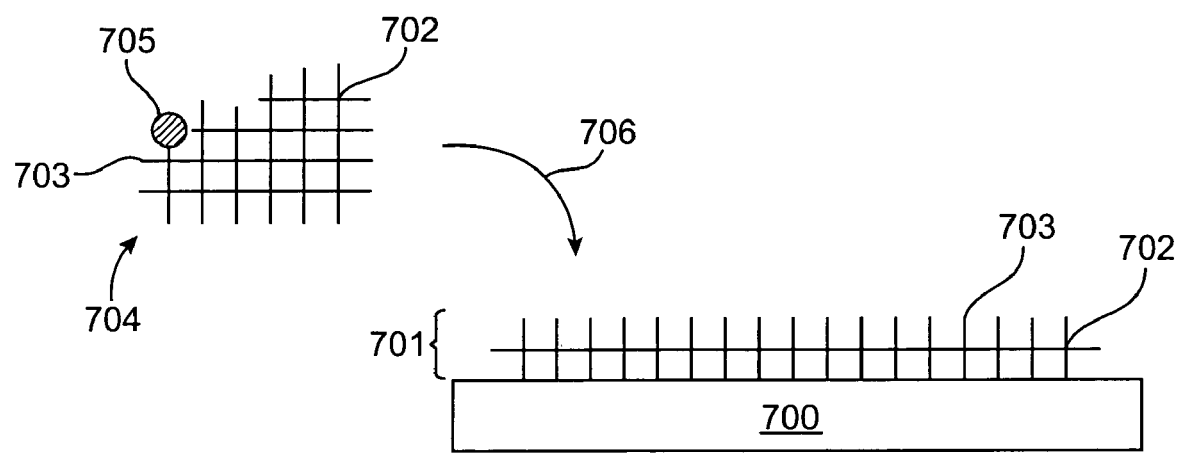
FIGS. 7A–C illustrate an exemplary process whereby a heterodiamondoid may be used to introduce dopant impurity atoms into a growing diamond film.

Referring to FIG. 7A, a substrate 700 is positioned within the CVD reactor 600, and a conventional CVD diamond film 701 is grown on the substrate 700. This diamond film 701 comprises tetrahedrally bonded carbon atoms, where a carbon atom is represented by the intersection of two lines in FIGS. 7A–C, such as depicted by reference numeral 702, and a hydrogen terminated surface represented by the end of a line, as shown by reference numeral 703. The hydrogen passivated surface 703 of the diamond film 701 is very important. Hydrogen participates in the synthesis of diamond by PECVD techniques by stabilizing the $sp^3$ bond character of the growing diamond surface. As discussed in the reference cited above, A. Erdemir et al. teach that hydrogen also controls the size of the initial nuclei, dissolution of carbon and generation of condensable carbon radicals in the gas phase, abstraction of hydrogen from hydrocarbons attached to the surface of the growing diamond film, production of vacant sites where $sp^3$ bonded carbon precursors may be inserted. Hydrogen etches most of the double or $sp^2$ bonded carbon from the surface of the growing diamond film, and thus hinders the formation of graphitic and/or amorphous carbon. Hydrogen also etches away smaller diamond grains and suppresses nucleation. Consequently, CVD grown diamond films with sufficient hydrogen present leads to diamond coatings having primarily large grains with highly faceted surfaces.

Referring again to FIG. 7A, a heterodiamondoid 704 is injected in the gas phase into the CVD reactor via the volatilizing device 604 described above. Schematically, the heterodiamondoid 704 has tetrahedrally bonded carbon atoms at the intersections of lines 702, as well as a hydrogen passivated surface at the end of the lines 703, as before. The heterodiamondoid 704 also has a heteroatom 705 substitutionally positioned within its lattice structure, and the heteroatom may be an electron donor or acceptor.

Figure 7B:
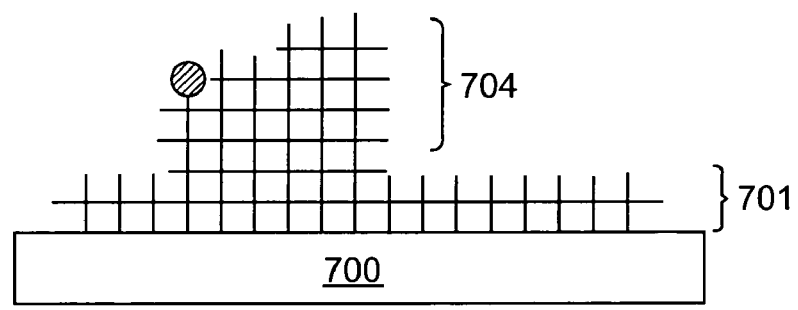

During the deposition process, the heterodiamondoid 704 is deposited on the surface of the CVD diamond film 701, as shown in FIG. 7B. The carbon atoms of the heterodiamondoid 704 become tetrahedrally coordinated with (bonded to) the carbon atoms of the film 701 to produce a continuous diamond lattice structure across the newly created interface of the heterodiamondoid 704 and the diamond film 701.

Figure 7C:
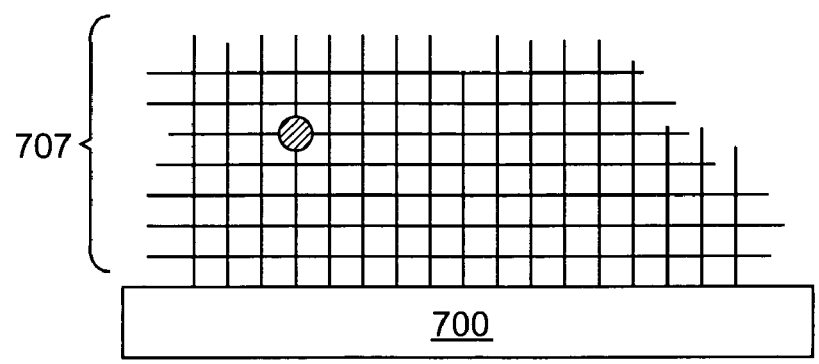

The result is a diamond film 707 having an impurity atom (which may be an electron donor or acceptor) substitutionally positioned on a lattice site position within the diamond crystal structure, as shown in FIG. 7C. Since the heterodiamondoid has been incorporated into the growing diamond film, so has its heteroatom become incorporated into the growing film, and the heteroatom has retained its $sp^3$-hybridization characteristics through the deposition process. Advantages of the present embodiment include the insertion of an impurity atom into the diamond lattice without having to resort to crystal damaging implantation techniques.

The weight of heterodiamondoids and substituted heterodiamondoids, as a function of the total weight of the CVD film (where the weight of the heterodiamondoid functional groups are included in the heterodiamondoid portion), may in one embodiment range from about 1 part per million (ppm) to 100 percent by weight. Alternatively, the content of diamondoids and heterodiamondoids, and derivatives thereof may range from about 1 part per million to 95 percent by weight. In another embodiment, the content of heterodiamondoids and substituted heterodiamondoids is about 10 ppm to 1 percent by weight. In another embodiment, the proportion of heterodiamondoids and substituted heterodiamondoids in the CVD film relative to the total weight of the film is about 100 ppm to 0.01 percent by weight.

Preparation of Diamondoid-containing Materials Using Polymerization Techniques

In an alternative embodiment, diamondoid-containing films or materials may be faricated by polymerization. For this to occur, it is necessary to derivatize (or functionalize) the diamondoids prior to polymerization, and methods of forming diamondoid derivatives, and techniques for polymerizing derivatized diamondoids, are discussed in U.S. patent application Ser. No. 60/334,939, entitled "Polymerizable Higher Diamondoid Derivatives," by Shenggao Liu, Jeremy E. Dahl, and Robert M. Carlson, filed Dec. 4, 2001, and incorporated herein by reference in its entirety.

To fabricate a polymeric film containing diamondoid constituents, either as part of the main polymeric chain, or as side groups or branches off of the main chain, one first synthesizes a derivatized diamondoid molecule, that is to say, a diamondoid having at least one functional group substituting one of the original hydrogens. As discussed in that application, there are two major reaction sequences that may be used to derivatize heterodiamondoids: nucleophilic ($S_N1$-type) and electrophilic ($S_E2$-type) substitution reactions.

$S_N1$-type reactions involve the generation of diamondoid carbocations, which subsequently react with various nucleophiles. Since tertiary (bridgehead) carbons of diamondoids are considerably more reactive than secondary carbons under $S_N1$ reaction conditions, substitution at a tertiary carbon is favored.

$S_E2$-type reactions involve an electrophilic substitution of a C—H bond via a five-coordinate carbocation intermediate. Of the two major reaction pathways that may be used for the functionalization of heterodiamondoids, the $S_N1$-type may be more widely utilized for generating a variety of heterodiamondoid derivatives. Mono and multi-brominated heterodiamondoids are some of the most versatile intermediates for functionalizing heterodiamondoids. These intermediates are used in, for example, the Koch-Haaf, Ritter, and Friedel-Crafts alkylation and arylation reactions. Although direct bromination of heterodiamondoids is favored at bridgehead (tertiary) carbons, brominated derivatives may be substituted at secondary carbons as well. For the latter case, when synthesis is generally desired at secondary carbons, a free radical scheme is often employed.

Although the reaction pathways described above may be preferred in some embodiments of the present invention, many other reaction pathways may certainly be used as well to finctionalize a heterodiamondoid. These reaction sequences may be used to produce derivatized heterodiamondoids having a variety of finctional groups, such that the derivatives may include heterodiamondoids that are halogenated with elements other than bromine, such as fluorine, alkylated diamondoids, nitrated diamondoids, hydroxylated diamondoids, carboxylated diamondoids, ethenylated diamondoids, and aminated diamondoids. See Table 2 of the co-pending application "Polymerizable Higher Diamondoid Derivatives" for a listing of exemplary substituents that may be attached to heterodiamondoids.

Diamondoids and heterodiamondoids, as well as derivatived forms thereof having substituents capable of entering into polymerizable reactions, may be subjected to suitable reaction conditions such that polymers are produced. The polymers may be homopolymers or heteropolymers, and the polymerizable diamondoid and/or heterodiamondoid derivatives may be co-polymerized with nondiamondoid, diamondoid, and/or heterodiamondoid-containing monomers. Polymerization is typically carried out using one of the following methods: free radical polymerization, cationic, or anionic polymerization, and polycondensation. Procedures for inducing free radical, cationic, anionic polymerizations, and polycondensation reactions are well known in the art.

Free radical polymerization may occur spontaneously upon the absorption of an adequate amount of heat, ultraviolet light, or high-energy radiation. Typically, however, this polymerization process is enhanced by small amounts of a free radical initiator, such as peroxides, aza compounds, Lewis acids, and organometallic reagents. Free radical polymerization may use either non-derivatized or derivatized heterodiamondoid monomers. As a result of the polymerization reaction a covalent bond is formed between diamondoid, nondiamondoid, and heterodiamondoid monomers such that the diamondoid or heterodiamondoid becomes part of the main chain of the polymer. In another embodiment, the functional groups comprising substituents on a diamondoid or heterodiamondoid may polymerize such that the diamondoids or heterodiamondids end up being attached to the main chain as side groups. Diamondoids and heterodiamonhdoids having more than one functional group are capable of cross-linking polymeric chains together.

For cationic polymerization, a cationic catalyst may be used to promote the reaction. Suitable catalysts are Lewis acid catalysts, such as boron trifluoride and aluminum trichloride. These polymerization reactions are usually conducted in solution at low-temperature.

In anionic polymerizations, the derivatized diamondoid or heterodiamdondoid monomers are typically subjected to a strong nucleophilic agent. Such nucleophiles include, but are not limited to, Grignard reagents and other organometallic compounds. Anionic polymerizations are often facilitated by the removal of water and oxygen from the reaction medium.

Polycondensation reactions occur when the functional group of one diamondoid or heterodiamondoid couples with the functional group of another; for example, an amine group of one diamondoid or heterodiamondoid reacting with a carboxylic acid group of another, forming an amide linkage. In other words, one diamondoid or heterodiamondoid may condense with another when the functional group of the first is a suitable nucleophile such as an alcohol, amine, or thiol group, and the functional group of the second is a suitable electrophile such as a carboxylic acid or epoxide group. Examples of heterodiamondoid-containing polymers that may be formed via polycondensation reactions include polyesters, polyamides, and polyethers.

Figure 8A:
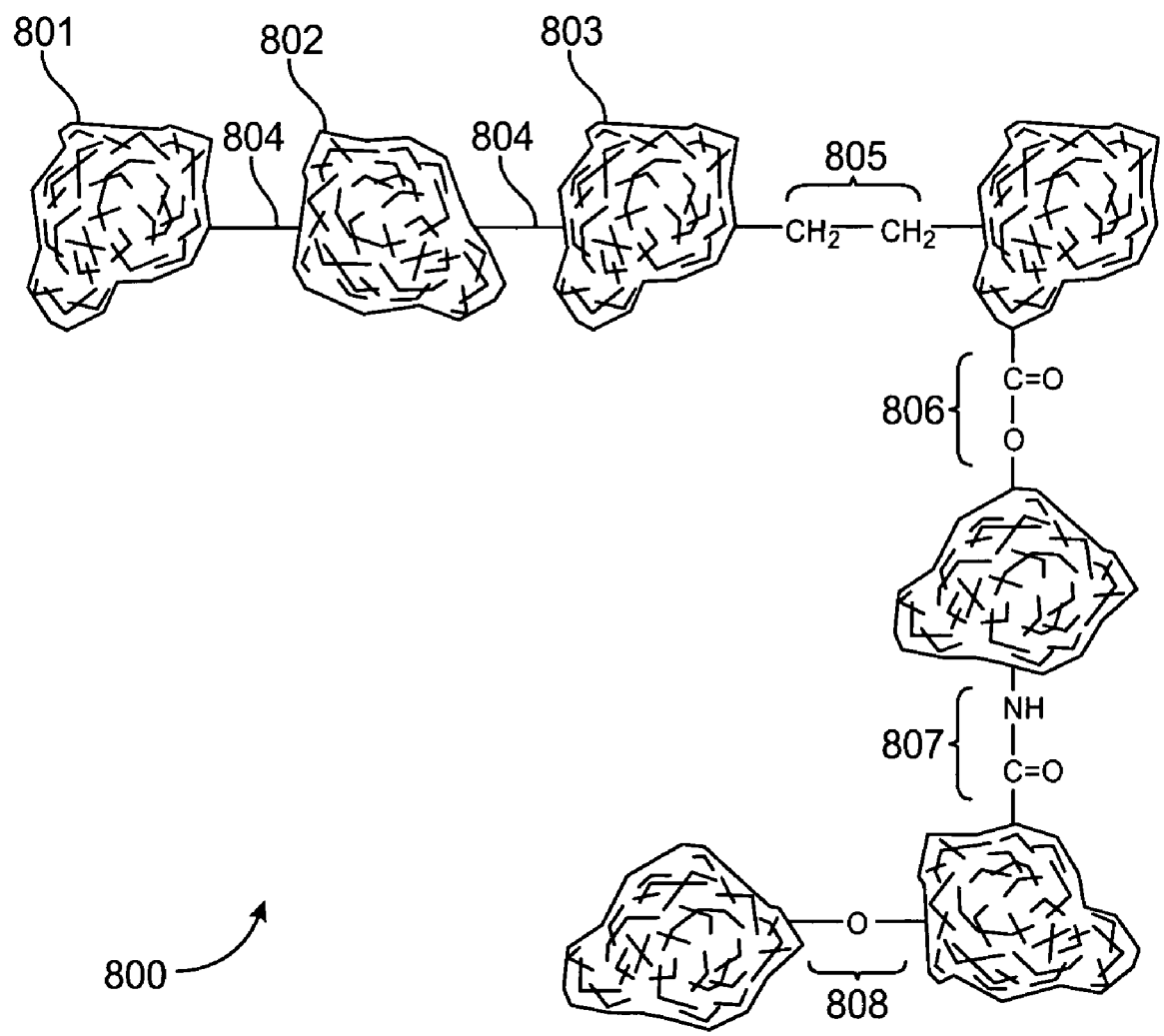
FIGS. 8A–C represent exemplary polymeric materials that may be fabricated from diamondoids.
Figure 8B:
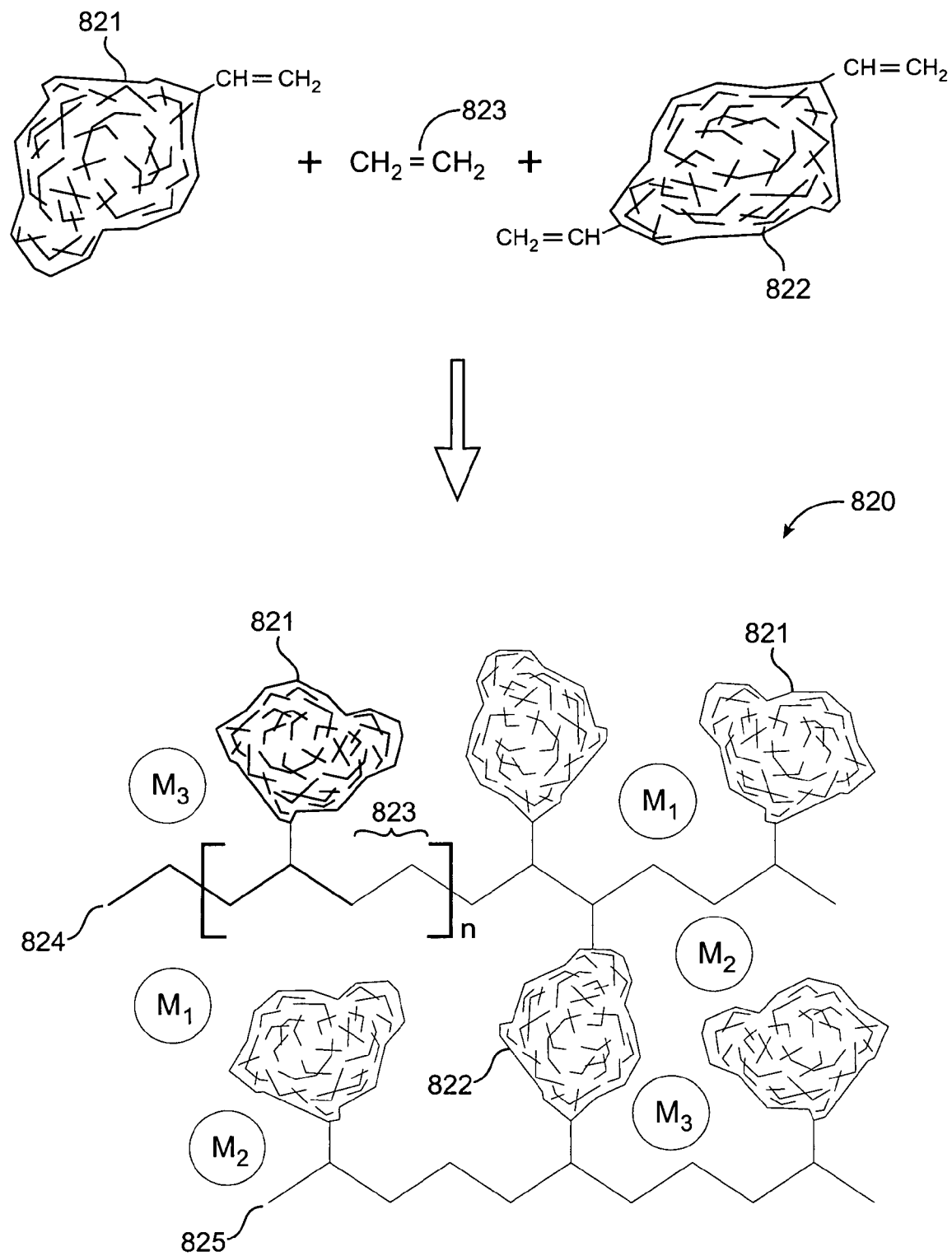
Figure 8C:
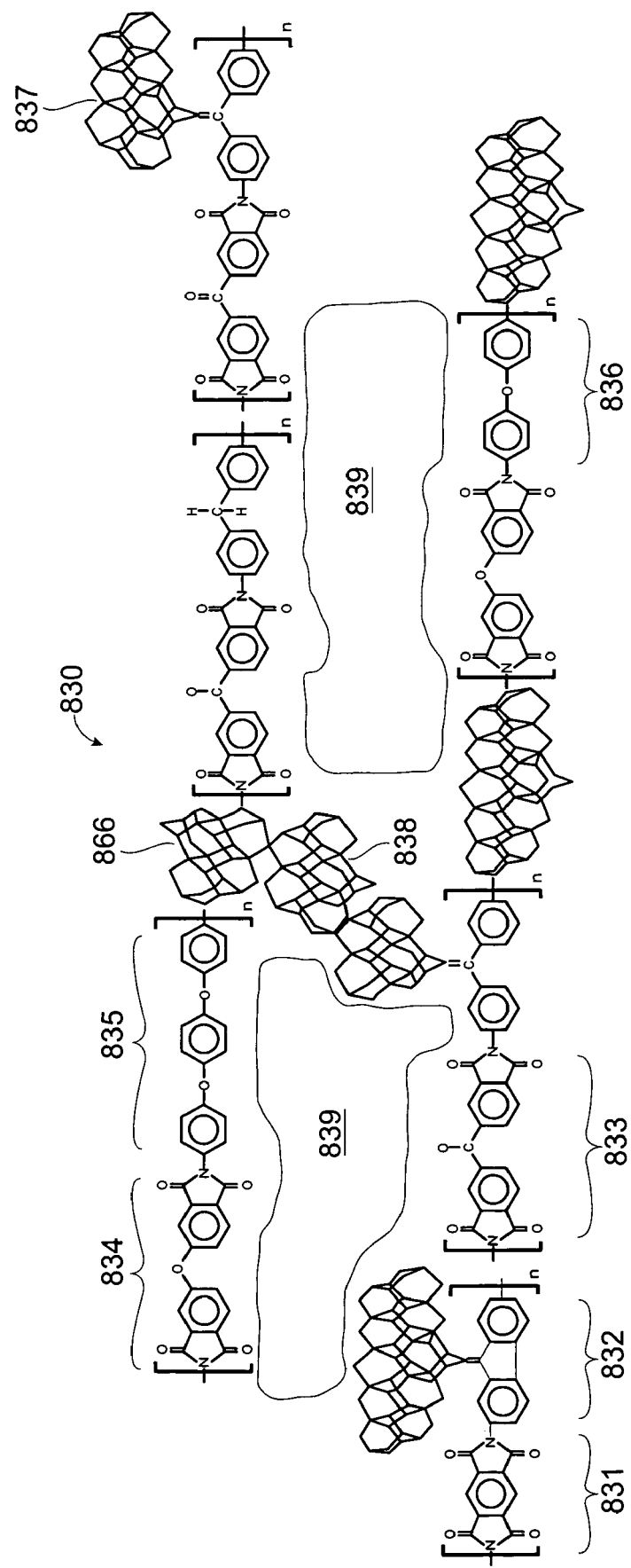

Exemplary diamondoid-containing polymeric films are illustrated schematically in FIGS. 8A–8C. Referring to FIG. 8A, a diamondoid-containing polymer is shown generally at 800, where the polymer comprises diamondoid monomers 801, 802, 803 linked through carbon-to-carbon covalent bonds 804. The diamondoid monomers 801, 802, 803 may comprise any member of the higher diamondoid series tetramantane through undecamantane. The covalent linkage 804 comprises a bond between two carbon atoms where each of carbon atoms of the bond are members of the two adjacent diamondoids. Stated another way, two diamondoids in the polymeric chain are directly linked such that there are no intervening carbon atoms that are not part of a diamondoid nucleus (or part of an adamantane subunit).

Alternatively, two adjacent diamondoids may be covalently linked through carbon atoms that are not members (part of the carbon nucleus) of either of the two diamondoids. Such a covalent linkage is shown schematically in FIG. 8A at reference numeral 805. As discussed above, adjacent diamondoids may be covalently connected through, for example, an ester linkages 806, an amide linkages 807, and an ether linkage is 808.

In an alternative embodiment, a diamondoid-containing polymer shown generally at 820 in FIG. 8B comprises a copolymer formed from the monomers ethylene and a higher diamondoid having at least one ethylene substituent. The diamondoid monomer shown at 821 contains one substituent ethylene group. The diamondoid monomer shown at 822 contains two ethylene substituents, and could have more than two substituents. Either or both of these diamondoids may be copolymerized with ethylene 823 itself, as a third monomer participating in the reaction, to form the co-polymer 820 or subunits thereof. Because the diamondoid monomer 822 has two substituent polymerizable moieties attached to it, this particular monomer is capable of cross-linking chains 824 and chain 825 together. Such a cross-linking reaction is capable of producing polymers having properties other than those of the polymer depicted in FIG. 8A, since for the FIG. 8A polymer the diamondoid nuclei are positioned within the main chain. A consequence of the structures formed in FIGS. 8A and 8B is that it is possible to incorporate metallic elements, particles, and inclusions (illustrated as M1 to M3) by inserting them into the interstities of folded and cross-linked polymeric chains. Diamondoid-containing materials may be doped in such a manner with alkali metals, alkali earth metals, halogens, rare earth elements, B, Al, Ga, In, Tl, V, Nb, and Ta to improve thermal conductivity and/or optical properties if desired. The relative ratios of the monofunctional diamondoid monomer, the difunctional diamondoid monomer, and the ethylene monomer in the exemplary polymer of FIG. 8B may of course be adjusted to produce the desired properties with regard to stifffiess, compactness, and ease of processing.

The exemplary polyimide-diamondoid polymer shown generally at 830 in FIG. 8C contains segments of polyimide chains derived from representative groups selected to illustrate certain relationships between structure and properties, in particular, how the properties of the exemplary polymer relate to the processing it has undergone. The dianhydride PMDA (pyromellitic dianhydride) shown at 831 and the diamine diaminofluorenone 832 are introduced into the chain for rigidity. The dianhydride BTDA (benzophenonetetracarboxylic dianhydride) shown at 833 provides the capability of further reaction at the carboxyl site, possibly for crosslinking purposes, and/or for the potential inclusion of metallic moieties into the material. The dianhydride oxydiphthalic dianhydride (ODPA) shown at 834, and the diamines oxydianiline (ODA) at 835 and bisaminophenoxybenzene at 836 may be introduced for chain flexibility and ease of processing of the material. Additionally, fluorinated dianhydrides such as 6FDA (not shown) may be introduced to lower the overall dielectric constant of the material.

The diamondoid components of the exemplary polymer illustrated schematically in FIG. 8C comprise a pentamantane diamondoid at 866, which is positioned in the main chain of the polymer, and an octamantane diamondoid at 837, which comprises a side group of the diamondoid-polyimide polymer at a position of a diamine (in this exemplary case, diaminobenzophenone) component. A diamondoid component 838 may be used as a cross-linking agent to connect two adjacent chains, through covalent linkages, or diamondoid component 838 may be passively present as an unfunctionalized "space filler" wherein it serves to separate main polymeric chains simply by steric hindrance. Folding of the main polymeric chains, particularly when diamondoid "fillers" 838 are present, may create voids 839, which may serve to reduce the overall dielectric constant of the material, since the dielectric constant of air (if it is the gas within the void), is one.

The diamondoid-containing polymers discussed above may be applied to a substrate undergoing microelectronic processing by any of methods known in the art, such as spin coating, molding, extrusion, and vapor phase deposition. The weight of diamondoids and substituted diamondoids as a function of the total weight of the polymer (where the weight of the diamondoid functional groups are included in the diamondoid portion) may in one embodiment range from about 0.001 to 100 percent by weight.

In one embodiment of the present invention, a synthesis technique for the polymerization of heterodiamondoids comprises a two-step synthesis. The first step involves an oxidation to form at least one ketone functionality at a secondary carbon (methylene) position of a heterodiamondoid. The heterodiamondoid may be directly oxidized using a reagent such as concentrated sulfuric acid to produce a keto-heterodiamondoid. In other situations, it may be desirable to convert the hydrocarbon to an alcohol, and then to oxidize the alcohol to the desired ketone. Alternatively, the heterodiamondoid may be initially halogenated (for example with N-chlorosuccinimide, NCS), and the resultant halogenated diamondoid reacted with base (for example, $KHCO_3$ or $NaHCO_3$, in the presence of dimethyl sulfoxide). It will be understood by those skilled in the art that it may be necessary to protect the heteroatom in the heterodiamondoid prior to the oxidation step.

The second step consists of the coupling two or more keto-heterodiamondoids to produce the desired polymer of heterodiamondoids. It is known in the art to couple diamondoids by a ketone chemistry, and one process has been described as the McMurry coupling process in U.S. Pat. No. 4,225,734. Alternatively, coupling may be effected by reacting the keto-heterodiamondoids in the presence of $TiCl_3$, Na, and 1,4-dioxane. Additionally, polymers of diamondoids (adamantanes) have been illustrated in Canadian Patent Number 2100654. One of ordinary skill in the art will understand that because of the large number of oxidation and coupling reaction conditions available, a variety of keto-heterodiamondoids may be prepared with a diversity of configurational, positional, and stereo configurations.

In an alternative embodiment, it is desirable to conduct a sequence of oxidation/coupling steps to maximize the yield of a heterodiamondoid polymer. For example, when the desired polymeric heterodiamondoid contains interposing bridgehead carbons, a three step procedure may be useful. This procedure comprises chlorinating an intermediate coupled polymeric heterodiamondoid with a selective reagent such as NCS. This produces a chlorinated derivative with the newly introduced chlorine on a methylene group adjacent to the double bond (or bonds) that were present in the intermediate. The chloro-derivative is convertable to the desired ketone by substitution of the chlorine by a hydroxyl group, and further oxidation by a reagent such as sodium bicarbonate in dimethylsulfoxide (DMSO). Additional oxidation may be carried out to increase ketone yields, the additional treatment comprising further treatment with pyridine chlorochromate (PCC).

Figure 8D:
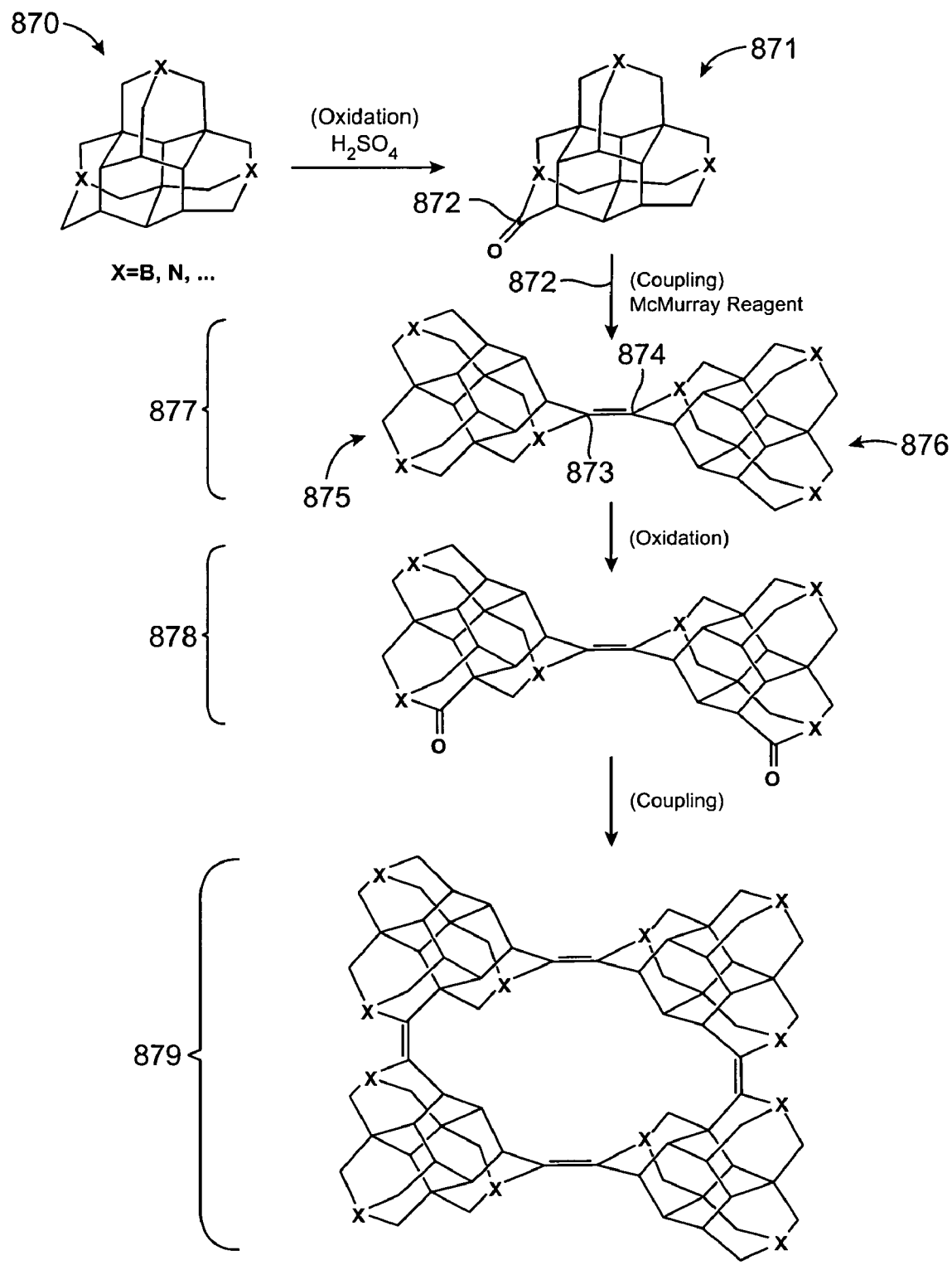
FIG. 8D is an exemplary reaction scheme for the synthesis of a polymer from n-type or p-type heterodiamondoids.

A schematic illustration of a polymerization reaction between heterodiamondoid monomers is illustrated in FIG. 8D. A heterodiamondoid 870 is oxidized using sulfuric acid to the keto-heterodiamondoid 871. The particular diamondoid shown at 871 is a tetramantane, however, any of the diamondoids described above are applicable. Again, the symbol "X" represents a heteroatom substitutionally positioned on a lattice site of the diamondoid. The ketone group in this instance is attached to position 872.

Two heterodiamondoids 871 may be coupled using a McMurry reagent as shown in step 872. According to embodiments of the present invention, the coupling between two adjacent heterodiamondoids may be made between any two carbons of each respective heterodiamondoid's nuclear structure, and in this exemplary situation the coupling has been made between carbons 873 of diamondoid 876 and carbon 874 of heterodiamondoid 876. It will be apparent to those skilled in the art that this process may be continued; for example, the pair of heterodiamondoids shown generally at 877 may be functionalized with ketone groups on the heterodiamondoids 875 and 876, respectively, to produce the intermediate 878, where two intermediates 878 may couple to form the complex 879. In this manner, a polymer may be constructed using the individual heterodiamondoids 870 such that n-type orp-type material is fabricated. Such a material is expected to be electrically conducting due to the pi-bonding between adjacent heterodiamondoid monomers.

In an alternative embodiment, individual heterodiamondoid molecules may be coupled with electrically conductive polymer "linkers" to generate an n-type or p-type heterodiamondoid material. In this context, a linker is defined as a short segment of polymer comprising one to ten monomer segments of a larger polymer. The linkers of the present invention may comprise a conductive polymer such that electrical conductivity is established between adjacent heterodiamondoids in the overall bulk material. Polymers with conjugated pi-electron backbones are capable of displaying these electronic properties. Conductive polymers are known, and the technology of these materials have been described in a chapter titled "Electrically Conductive Polymers" by J. E. Frommer and R. R. Chance in High Performance Polymers and Composites, J. I. Kroschwitx, Ed. (Wiley, New York, 1991), pp. 174 to 219. The conductivity of many of these polmers have been described in this chapter, and compared to metals, semiconductors, and insulators. A typical semiconducting polymer is poly(p-phenylene sulfide), which has a conductivity as high as $10^3$ Siemens/cm$^2$ (these units are identical to $\Omega^{-1}$ cm$^{-1}$), and as low as $10^{-15}$, which is as insulating as nylon. Polyacetylene is more conducting with an upper conductance of $10^3$ $\Omega^{-1}$ cm$^{-1}$, and a lower conductance of about $10^{-9}$ $\Omega^{-1}$ cm$^{-1}$.

According to embodiments of the present invention, heterodiamondoids may be electrically connected to form a bulk n or p-type material using oligomers of the polymers discussed above. In this instance, an oligomer refers to a polymerization of about 2 to 20 monomers. Thus, an oligomer may be thought of as a short polymer. In this instance, the purpose of the oligomers, and/or linkers, is to electrically connect a number of heterodiamondoids into a three-dimensional structure such that a bulk material having p-type or n-type electrical conductivity may be achieved.

Conductive polymers have been discussed in general by J. E. Frommer and R. R. Chance in a chapter titled "Electrically conductive polymers," in *High Performance Polymers and Composites*, J. I. Kroschwitz, ed. (Wiley, New York, 1991), pp. 174–219. To synthesize a conventional conductive polymer, it is important to incorporate moieties having an extended π-electron conjugation. The monomers that are typically used to synthesize such polymers are either aromatic, or contain multiple carbon-carbon double bonds that are preserved the in the final polymeric backbone. Alternatively, conjugation may be achieved in a subsequent step that transforms the innitial polymer product into a conjugated polymer. For example, the polymerization of acetylene yields a product of conjugated ethylene units, whereas a benzene polymerization produces a chain of covalently linked aromatic units.

Figure 9A:
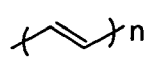
FIGS. 9A–N show exemplary linking groups that are electrically conducting as polymers, and that may be used to link heterodiamondoids to produce n and p-type materials.
Figure 9B:
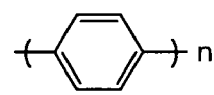
Figure 9C:
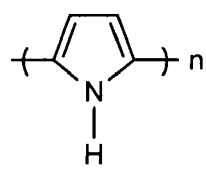
Figure 9D:
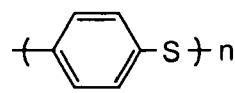
Figure 9E:
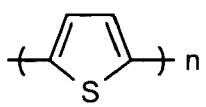
Figure 9F:
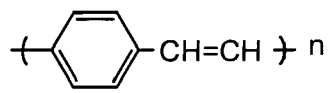
Figure 9G:
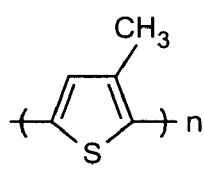
Figure 9H:
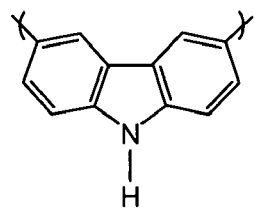
Figure 9I:
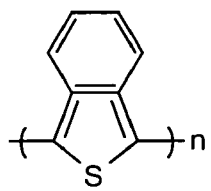
Figure 9J:
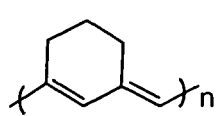
Figure 9K:
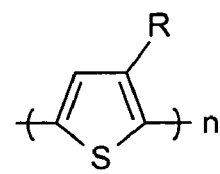
Figure 9L:
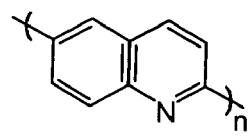
Figure 9M:
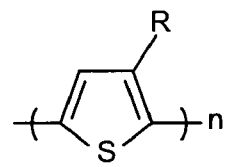
Figure 9N:
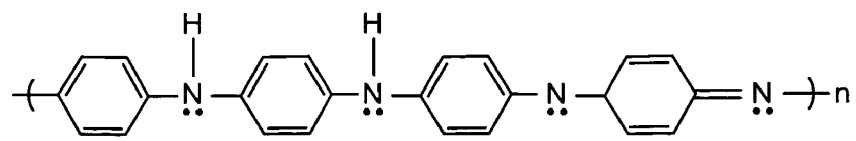

A catalog of exemplary oligomers (linkers) that may be used to connect heterodiamondoids in an electrically conductive manner are illustrated in FIGS. 9A–N. Typical linkers that have been shown to be electrically conductive are polyacetylene in FIG. 9A, polythiophene in FIG. 9E, and polyparaphenylene vinylene in FIG. 9F. An electrically conductive linker that will be highlighted as an example in the next discussion is polyaniline, the oligomer of which has been depicted in FIG. 9N.

Figure 10:
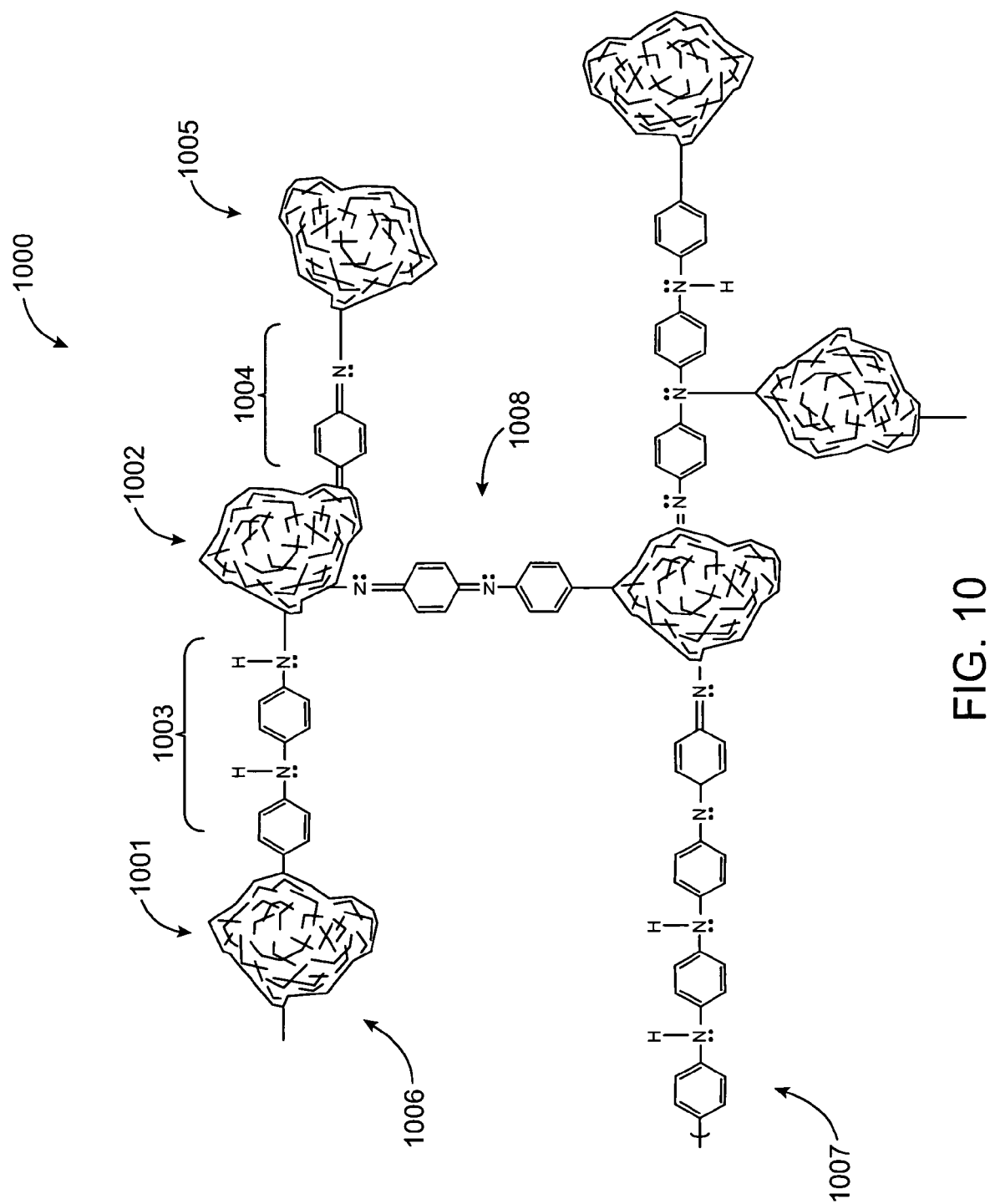
FIG. 10 illustrates an exemplary n or p-type material fabricated from heterodiamondoids linked by polyaniline oligomers.

A schematic diagram of a heterodiamondoid polymer generated with polyaniline linking groups is depicted in FIG. 10. The polymer of FIG. 10 is only exemplary in that the conductive linker groups between adjacent heterodiamondoids is a polyaniline functionality, but of course the linking group could be any conductive polymer, many of which comprise conductive diene systems. In FIG. 10 a heterodiamondoid 1001 is linked to a heterodiamondoid 1002 via a short segment of polyaniline oligomer 1003. The same applies for the connection 1004 to the heterodiamondoid 1005 within the same linear chain.

The polymer shown generally at 1000 may also contain crosslinks that connect a linear chain 1006 with 1007. This creates a three-dimensional crosslinked polymer with electrical conductivity in a three-dimensional sense. Crosslinked chains 1008 may be used to connect adjacent linear chains 1006 and 1007. A three-dimensional matrix of an electrically conducting diamondoid containing material is thus established. Each heterodiamondoid 1001 and 1002 contains within its structure a heteroatom which is either an electrical donor or electrical accepter. Overall, fabrication of an n-type or p-type heterodiamondoid material is achieved.

Molecular Crystals

A third method of fabricating diamondoid-containing materials is crystallize the diamondoids into a solid, where the individual diamondoids comprising the solid are held together by Van der Waals forces (also called London or dispersive forces). Molecules that are held together in such a fashion have been discussed by J. S. Moore and S. Lee in "Crafting Molecular Based Solids," *Chemistry and Industry*, July, 1994, pp. 556–559, and are called "molecular solids" in the art. These authors state that in contrast to extended solids or ionic crystals, the prefered arrangement of molecules in a molecular crystal is presumably one that minimizes total free energy, and thus the fabrication of a molecular crystal is controlled by thermodynamic considerations, unlike a synthetic process. An example of a molecular crystal comprising the pentamantane [1(2,3)4] will be discussed next.

In an exemplary embodiment, a molecular crystal comprising [1(2,3)4] pentamantane was formed by the chromatographic and crystallographic techniques described above. These aggregations of diamondoids pack to form actual crystals in the sense that a lattice plus a basis may be defined. In this embodiment,the [1(2,3)4] pentamantane is found to pack in an orthorhombic crystal system having the space group Pnma, with unit cell dimensions a=11.4706, b=12.6418, and c=12.5169 angstroms, respectively. To obtain that diffraction data, a pentamantane crystal was tested in a Bruker SMART 1000 diffractometer using radiation of wavelength 0.71073 angstroms, the crystal maintained at a temperature of 90 K.

Figure 11:
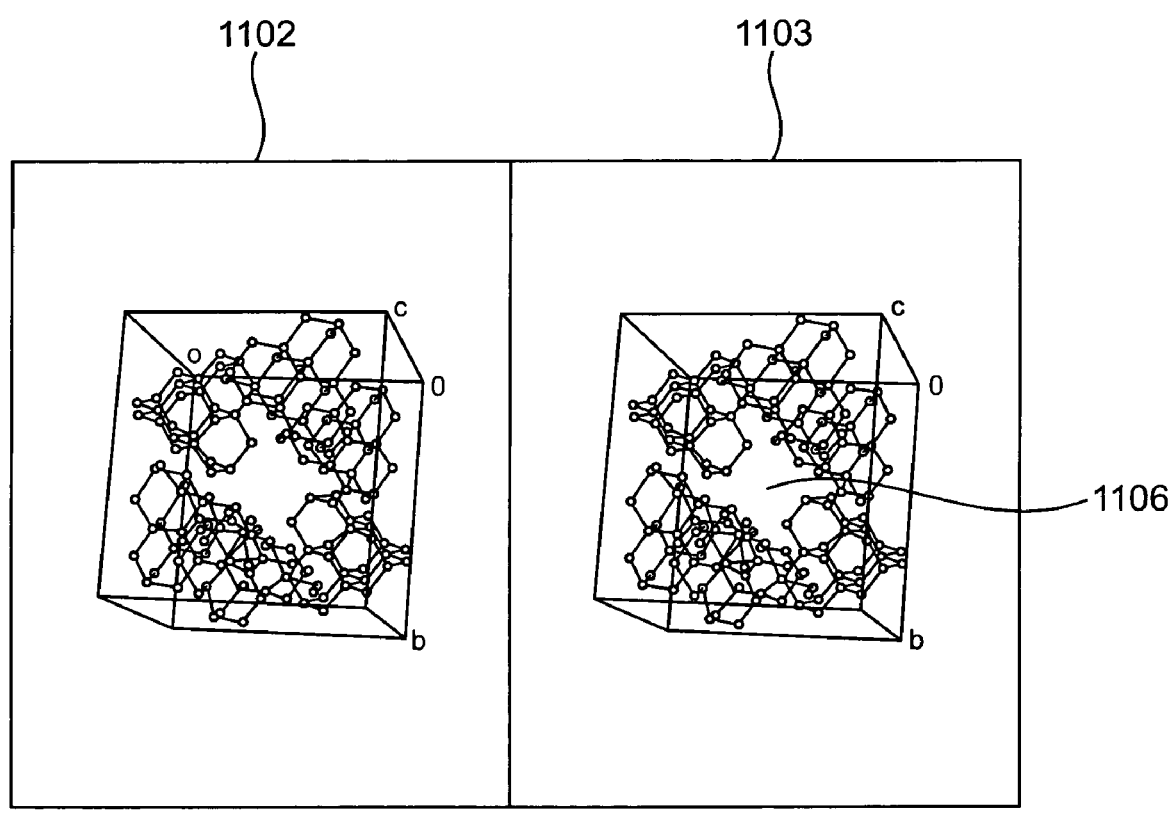
FIG. 11 is an stereogram illustrating how an exemplary diamondoid, [1(2,3)4] pentamantane, packs to form a molecular crystal.

A unit cell of the pentamantane molecular crystal is illustrated in FIG. 11. This diagram illustrates the generalized manner in which heterodiamondoids may pack in order to be useful according to embodiments of the present invention. These molecular crystals display well-defined exterior crystal facets, and are transparent to visible radiation.

Referring to FIG. 11, the packing of the [1(2,3)4] pentamantane is illustrated in three dimensions by the stereogram having two images 1102, 1103, that may be viewed simultaneously. Each unit cell of the molecular crystal contains four pentamantane molecules, where the molecules are arranged such that there is one central cavity or pore 1106 per unit cell. In many (if not all) of the embodiments of the present invention, the cavity that is created by packing diamondoid or heterodiamondoid molecules into a crystal are the packed pentamantane units may be too small to accommodate a transition element metal, but crystallization around a transition element, such as gold, may occur such that the conductivity of the material is enhanced. There may be none, or more than one pore in molecular crystals of other diamondoids, and the sizes of these pores may vary.

The significance of the packing of the [1(2,3)4] pentamantanes illustrated in FIG. 11 is that a p or n-type diamondoid material, and junction fabricated therefrom, may be realized with little further processing than isolation using chromatographic techniques. In other words, no functionalization is necessary to polymerize or link up individual diamondoid molecules, and no expensive deposition equipment is needed in this embodiment. Since many of these crystal are mechanically soft and easily compressible, being held together by van der Waals forces, an exterior "mold" is contemplated to support the various regions of the device (in essence, for example, a lasing or light emitting medium may even be "semi-liquid").

Figure 12:
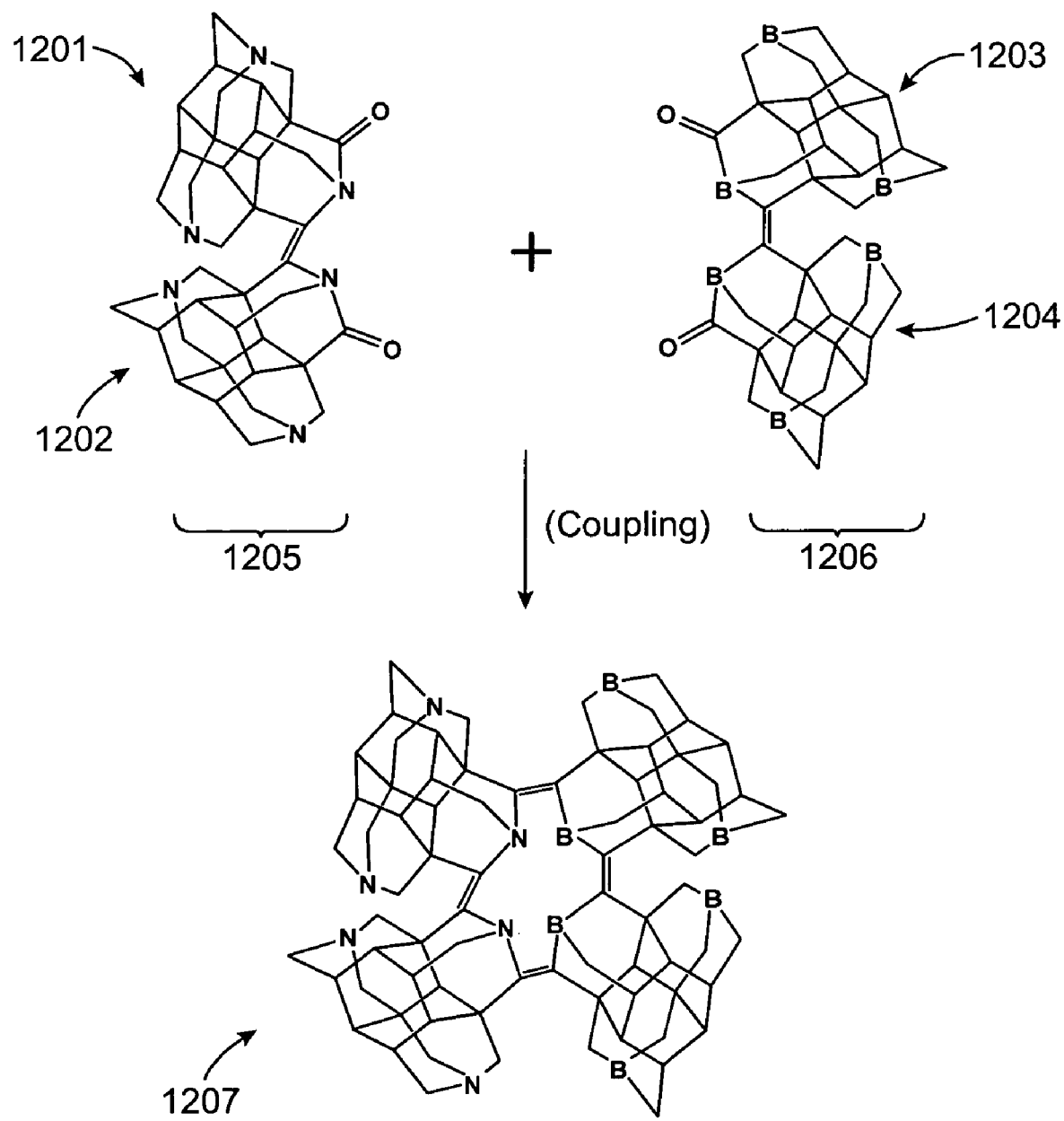
FIG. 12 shows how individual heterodiamondoids may be coupled to form an n or p-type device at the molecular level.

An exemplary subunit of polymerized diamondoids (and/or heterodiamondoids) that are contemplated to be capable of forming a molecular crystal is illustrated in FIG. 12. Referring to FIG. 12 individual heterodiamondoids 1201, 1202 that contain nitrogen heteroatoms may be coupled to form dimer of diamondoids 1205; likewise, individual heterodiamondoids 1203, 1204 may be coupled to form a dimer of diamondoids 1206. The two dimers 1205, 1206 may be coupled to form a tetramer of diamondoids 1207, which may comprise an n or p-type device at the molecular level. It is contemplated that structures such as the polymerized diamondoids 1207 may crystallize to form an electrically conducting molecular crystal.

Optical Devices Fabricated from Diamondoids

The optical materials that may be fabricated according to embodiments of the present invention are contemplated to belong to one of two classes; 1) passive devices that include lenses, pressure windows, optical waveguides, and antireflection coatings; and 2) active or light emitting devices, which may have electrical components, including lasers and light emitting diodes, and other optoelectronic devices such as photoresistors, photodetectors, photodiodes, phototransistors, photovoltaic cells and solar cells. Particle and radiation detectors are also contemplated.

Lasing in Diamondoid-containing Materials

The diamondoid-containing laser devices of the present invention are contemplated to operate by principes delineated below. The interaction between radiation and matter as it pertains to lasing has been reviewed by O. S. Heavens et al. in *Insight into Optics* (Wiley, New York, 1991), chapters 12 and 20, and by E. Hecht in *Optics*, $2^{nd}$ Ed. (Addison-Wesley, Reading, Mass., 1990), pp. 577–593. A collection of atoms may have two energy levels, $E_1$ and $E_2$, where the number of atoms in the lower energy state $E_1$ is $n_1$, and the number of atoms in the higher energy state $E_2$ is $n_2$. The collection of atoms may exist in a radiation field of frequency $\omega$, and a certain number of atoms may absorb energy from the field such that they are excited from level $E_1$ to $E_2$. An excited atom in level $E_2$ may spontaneously decay back to energy level $E_1$, thereby giving up a photon in the process having an energy equal to the difference between $E_2$ and $E_1$; this process is spontaneous in that no external radiation field is necessary to cause the decay to occur.

In contrast, the excited atom may interact with the radiation field, causing the excited atom to decay to the lower state in a process known as stimulated emission. Einstein postulated in 1917 that a photon produced by stimulated emission has three distint properties: a) it has the same phase as the electromagnetic radiation which triggered the excited atom into stimulated emission; b) it has the same polarization as the electromagnetic radiation causing the stimulated emission, and c) it propagates in the same direction as the electromagnetic radiation causing the stimulated emission. Thus, laser light has these three properties.

The conditions for light amplication have also been reviewed by O. S. Heavens et al. (1991) and E. Hecht (1990). When the number of stimulated emissions per second exceed the number of absorptions per second; in other words, when $n_2$ is greater than $n_1$, a condition known as population inversion is achieved. Under this condition an incident photon of the proper frequency triggers an avalanche of stimulated photons, wherein all of the stimulated photons have the same phase. As such, the the light intensity from the emitted photons adds to the intensity of the incident light wave, increasing its flux density). As more and more stimulated photons are added to the overall flux, the emitted light wave continues to build as long as there are no competing processes such as scattering, and as long as the population inversion condition is maintained.

Energy must be added to the system to maintain the condition of population inversion. This process is known as "pumping." The energy pump may be in the form of electrical, chemical, or optical energy. Electrical energy is added to the system in the form of electronic collisions, and is known as "electron collisional excitation. Alternativly, atoms may be elevated in energy to excited states via a chemical reaction. Optically, the atoms of a medium may be energetically excited as a result of an absorption of radiation.

Lasers based on doped crystal systems have been reviewed by O. S. Heavens et al. (1991) and E. Hecht (1990). Crystals containing traces of transition elements, lanthanides, and actinides show broad absorption bands in certain spectral regions, and sharp fluorescent emissions at longer wavelengths. One example is the ruby pulsed laser, which utilizes a crystal rod comprising 0.05 percent by weight $Cr_2O_3$ in $Al_2O_3$ as the active medium. To construct a ruby laser, the end faces of the crystal rod are polished, into a flat, parallel, and reflecting configuration in order to form a resonant cavity. To provide the energy input to maintain population inversion, in this an optical pump, the rod is surrounded by a helical gaseous discharge flashtube. The flashtube provides broadband optical pumping to excite $Cr^{3+}$ ions into absorption bands. The excited $Cr^{3+}$ ions rapidly relax (the transition takes about 100 ns) in a non-radiative transition to a pair of metastable states, where the ions remain for as long as several milliseconds (about 3 ms at room temperature).

Because the metastable states have longer lifetimes than the time required for the non-radiative transition to take place, a population inversion may be maintained. The process is initiated when a few spontaneously emitted photons stimulate a chain reaction. Thereafter excited atoms in the metastable states are stimulated to decay to the ground state, resulting in an in-phase addition of energy to the evolving light wave. Because the ends of the active medium are flat and polished, the growing light wave can sweep back and forth across the active medium provided enough sufficient energy is provided to overcome losses at the mirrored ends. See O. S. Heavens et al. (1991) and E. Hecht (1990).

It is the existence of the broad absorption bands of the active or lasing medium that make the initial excitation possible, and the long lifetime of the metastable states facilitates the condition of population inversion. A critical component of a laser of this type is the correct dimensioning of the optical resonant cavity. A device such as the ruby laser is known as a "three-level laser," because of the three energy levels (the absorption bands, the metastable states, and the ground state) available to the system.

In contrast, a He—Ne laser is a four energy level system because the lower energy level (to which the stimulated photons decay) is not the ground state. The four energy level system has advantages in terms of continuous wave operation, as opposed to the three level systems that typically operate in a pulsed mode.

Other examples of lasing media are the trivalent rare earths $Nd^{3+}$, $Ho^{3+}$, $Gd^{3+}$, $Tm^{3+}$, $Er^{3+}$, $Pr^{3+}$, and $Eu^{3+}$ in a variety of hosts, including $CaWO_4$, $Y_2O_3$, $SrMoO_4$, $LaF_3$, yttrium aluminum garnet (YAG), and glass.

The mode of achieving the necessary population inversion in a semiconductor laser is different than that used in a doped crystal system, as discussed by O. S. Heavens et al. in *Insight into Optics* (Wiley, New York, 1991), section 20.10.5, pp. 252–253. A semiconductor laser consists of a p-n junction, which in the absence of an applied voltage (also called a bias), demonstrates no light emission. When a forward bias is applied to the p-n junction, however, electrons flow from the n-type material into the p-type material to occupy the conduction band of the material in the immediate vicinity of the junction. A condition of population inversion is established in a semiconductor laser by virtue of a higher concentration of electrons occupying states in the conduction band of this junction material than the concentration of holes occupying states in the valence band.

Whether occuring in a dye laser or in a semiconductor laser, though, population inversion still leads to the same result: spontaneous emission as a result of electrons combining with holes. One difference between a dye laser and a semiconductor laser is that with the latter type of device no external mirrors are required; however, it is still necessary for the light emitted from a semiconductor laser to be retained within a resonant cavity. Lasing material that are cubic crystals with a high refractive index are typically desired for semiconductor lasers. See O. S. Heavens et al. (1991).

Lasing in Silicon

There appear to be advantages offered by type IV semiconducting optical devices; either silicon optical devices for use in silicon-based microelectronic circuitry, or carbon-based optical devices for use in diamond-based technologies. The problem inherent with this approach is that it is difficult to achieve light emission from a type IV semiconductor, although nano-sized structures made from type IV semiconductors appear to offer a solution. In this section, recent success with light emission from silicon will be discussed, followed by a disclsosure of the lasing that is contemplated to be possible in a diamondoid-containing materials.

In an article entitled "Optical gain in silicon nanocrystals," by L. Pavesi et al., *Nature*, Vol. 408, pp. 440–444, (23 Nov., 2000), the difficulty of adding optical components to silicon integrated circuits is discussed. This is because silicon is an indirect-bandgap semiconductor, and is therefore an inefficient emitter of light. For this reason, integration of optically active elements into silicon microelectronic circuitry has been achieved largely through the use of direct bandgap compound semiconductors. The key component in an optoelectronic device is a light source, the most desired type being a laser.

Lasing has been observed in type III-V and II-VI direct bandgap semiconductors, such as gallium arsenide and indium phosphide, respectively, but, to the inventors' knowledge, not in type IV indirect semiconductors such as silicon. This is because the electron transition in a direct bandgap semiconductor, with subsequent photon emission, takes place at virtually the same position in momentum (or wave vector k) space, and thus it is not necessary for the transition to be mediated by a photon. In contrast, an indirect bandgap semiconductor requires the transition to be mediated by a phonon since a change in k-space takes place.

These concepts are illustrated in FIG. 13A–B. Referring to FIG. 13A, a graph of electronic energy 1301 is plotted against momentum or wave vector k 1302. The conduction band 1303 is separated from the valence band 1304 by a bandgap 1305. The bandgap 1305 represents the difference in electron energy between the minimum of the conduction band 1306 and a maximum of the valence band 1307. Electrons may be thermally excited from electronic states at the top of the valence band 1304 to electronic states at the bottom of the conduction band 1303. Filled states in the diagram are represented by the shaded symbol 1308. It will be noted by those skilled in the art that electrons thermally excited across the bandgap that fill states in the conduction band 1303 will leave behind holes in the valence band 1304. One such thermal excitation is shown by the electron 1309, which has created (or left behind) hole 1310.

The direct bandgap semiconductor represented in FIG. 13A displays a minimum in the conduction band 1306 which lies in a substantially vertical position above the maximum in the valence band 1307. In other words, each of the states (the electron state 1309 and the hole state 1310) lie at substantially the same position 1311 in momentum or k-space. Thus, when the electron 1309 decays to fill hole position 1310, emitting a photon 1312, there is essentially no change in the overall momentum of the system.

This situation is to be contrasted with the indirect bandgap semiconductor of FIG. 13B. In this case, the minimum 1329 of the conduction band 1323 does not lie in a substantially vertical position above the maximum of the valence band 1324, and thus, a change in momentum of the system equal to about 1350 is required for an electronic transition to occur. For the electron 1329 to decay to fill hole 1330, emitting photon 1332 in the process, a phonon (not shown) having a momentum equal to about the value 1350 mediates the transition. Phonons basically lead to heat dissipation in the system. This is the reason that indirect bandgap semiconductors, such as silicon, are relatively inefficient emitters of light (L. Pavesi et al, 2000).

Direct bandgap materials (group III-V semiconductors in particular) as laser sources operate efficiently because electrons and holes recombine directly where no phonon is needed to mediate the recombination process; this is a so-called $\Delta k=0$ transistion (U.S. Pat. No. 6,151,347). Type III-V and II-VI are direct bandgap semiconductors lasers, and therefore require no phonon mediation, but direct bandgap semiconductors are difficult to integrate onto silicon-based microelectronic devices. What is needed is a silicon laser (L. Canham, 2000). Type IV materials do not radiate light by direct hole-electron recombination, and require a phonon-mediated process to conserve momentum; even so, the longer lifetimes of the phonon-mediated transitional states result in a lower probability of radiative emission (U.S. Pat. No. 6,151,347).

Attempts to achieve optical gain in silicon have been discussed in an article entitled "Gaining light from silicon," *Nature*, Vol. 408, pp. 411–428, (23 Nov., 2000). In this article, L. Canham discusses the fact that bulk silicon is an extremely inefficient light emitter, and thus, to make lasers and high-speed telecommunications devices, compound semiconductors such as gallium arsenide and indium phosphide are used. These compound semiconductors are, however, difficult to integrate into silicon integrated circuits.

The manner in which radiative efficiency may be increased, providing the basis for achieving stimulated emission in indirect bandgap semiconductors is illustrated in FIG. 13C. The energy dispersion relationship shown in FIG. 13C shows a minimum in a conduction band 1340 that is non-aligned with a maximum in a valence band 1341. The description of an indirect bandgap semiconductor having such non-aligned extrema in k-space is derived from Bloch theory, with the tacit assumption of an infinite lattice; that is to say, a bulk material. When charge carriers are restricted in their ability to diffuse randomly throughout the material, such as materials having a nano or microstructure described below, Bloch treatment does not apply because trapping or localization of charge carriers in sufficiently small cells occurs. Consequently, the solid lines representing the conduction band 1342 and the valence band 1343 in FIG. 13C in the E vs. k energy dispersion relationship (the electron energy or band energy as a function of carrier momentum k), are broadened considerably. The broadened conduction and valence bands are represented by reference numerals 1344 and 1345, respectively. Thus, a phonon is not necessary to mediate the transition which may occur between the electron state 1346 and hole state 1347, and radiative efficiency in this indirect bandgap semiconductor is enhanced.

Optical gain has been observed in silicon, and a silicon-based laser diode may not be long away, according to L. Pavesi. There are apparently a number of morphologies that may manifest the band broadening described above such that electronic transitions may take place without phonon mediation. These structures include porous silicon, silicon nanocrystals, silicon/insulator superlattices, and silicon nano-pillars (L. Pavesi, 2000).

The reason a nanostructured or quantum level physical morphology leads to band broadening appears to lie in the quantum confinement of excitons (an exiton is a bound electron-hole pair) in the nanometer scale crystalline structures. Evidence for this is a disclosure of a radiative state associated with a silicon nanocrystal and silicon oxide interface. The silicon nanocrystal comprised about 500 silicon atoms, of which about 35 percent were surface atoms). A farther approach was the fabrication of silicon-germanium alloys, particularly into quantum well structures (U.S. Pat. No. 6,151,347).

Disadvantages of prior art attempts to build optical devices (including lasers) from semiconductor nanocrystals include lack of uniformity in size and in the size distribution of the nanocrystals. In one example this was particularly true in view of the etching techniques used to produce the nanocrystals (L. Canham, 2002). The diamondoids that are a part of the diamondoid-containing materials of the present are particularly adept at solving this problem, since each diamondoid, heterodiamondoid, and derivatized diamondoid is a specific molecule with a definitive structure.

Returning now to the problem of developing a silicon laser, L. Pavesi et al. teach the manner in which a silicon microstructure may be manipulated in order to improve the light emitting properties of the material. As previously mentionned, a large number different types of structures have been evaluated, each having in common a naonstructure morphology, or structure that is conducive to quantum level operation. For silicon, these structures have included porous silicon, silicon nanocrystals, silicon/insulator superlattices, and silicon nano-pillars.

According to L. Pavesi et al., the physical principles that lead to increased photoluminescence in each of these types of silicon morphologies is essentially that of quantum confinement of exitons in a nanometer scale crystalline structure. In some cases, a silicon/dielectric layer (such as silicon dioxide) interface may play a role in passivating radiative states, and forming radiative states. These authors state that although such morphologies are promising with regard to a future role for silicon in photonic applications, a silicon laser remains unlikely.

As previously alluded to, the production of a silicon laser requires a light amplification process through stimulated emission. However, light amplification in silicon is difficult to achieve because silicon has an efficient free carrier absorption, which reduces the net gain available for lasing, and because there is a significant size dependence on the radiative energies in silicon nanostructures, which causes significant optical losses in the system.

In keeping with the use of nanostructured materials, and materials capable of operating at a quantum level, L. Pavesi et al. were able to show that radiative emission in silicon nanocrystals occured through a radiative state associated with an silicon/oxide interface. A three level model was proposed to explain the observed gain, and the manner in which population inversion could be achieved. Two of the proposed levels were the lowest unoccupied molecular orbital (LUMO) and the highest occupied molecular orbital (HOMO), which corresponded to the bottom of the conduction band and the top of the valance band of the nanocrystal, respectively. In this model, the third level was created by a radiative interface state that appeares to be responsible for luminescence at 800 nm. Electrons were excited such that they populated the higher energy level LUMO; they then relaxed very rapidly to the interface state that was located intermediate in energy between the LUMO and the HOMO. Electrons that populate the interface state have long lifetimes. Because the rate of depopulation of the LUMO is much faster than its filling rate via carrier recommendation mediated by the interface state, population inversion between the interface state and the HOMO could be achieved.

In L. Pavesi et al.'s study, the silicon nanocrystals that displayed optical gain were thought to contain about 500 atoms, of which about 35 percent were surface atoms. Thus, about 150 interface states were available per silicon nanocrystal, with the assumption that each surface silicon atom was bound to an oxygen atom of the oxide layer.

Solid State Dye Lasers

A tunable laser is one in which the frequency of the lasing light is adjustable. One type of tunable laser is known as the dye laser because it employs an organic dye in solution as the lasing medium. The dye is optically pumped using a flashlamp or another laser. Laser action occurs through the emission of light by the excited dye molecules. By employing multiple dye solutions, dye lasers can be tuned over a wide range of wavelengths including the ultraviolet, visible, and infrared spectrum.

However, dye lasers that are not solid state possess several disadvantages which limits their usefulness and applications requiring portability and long life. For example, a dye laser system requires a means for providing a continuous flow of the dye solution. This necessitates a substantial amount of expensive and bulky hardware, including pumps, tanks, valves, and other fluid control apparatus. Another requirement of the dye laser is that the temperature of the dye solution must be maintained within a narrow range close to room temperature. Thus, it is necessary to cool the dye solution. Yet another limiting characteristic of the dye laser is that the dye is must be replaced very frequently due to photochemical association, which may take place after exposure to ambient light, optical bleaching, and thermal degradation. Dye replacement is often required on a daily basis.

Solid State Diamondoid-containing Laser Materials Based on Nitrogen Color Centers One type of solid state laser is the color center laser. This type of laser employs a host material within which are processed a number of color centers that provide the lasing action. Solid-state lasers having color centers as the active lasing material have been discussed in U.S. Pat. No. 4,638,484 to Rand et al., U.S. Pat. No. 4,949,347 to Satoh et al., U.S. Pat. No. 4,950,657 to Nakashima et al., U.S. Pat. No. 5,420,879 to Kawarada et al, and U.S. Pat. No. 4,950,625 to Nakashima et al. Such color centers are typically based on defects comprising nitrogen impurities and their association with lattice vacancies.

Figure 14A:
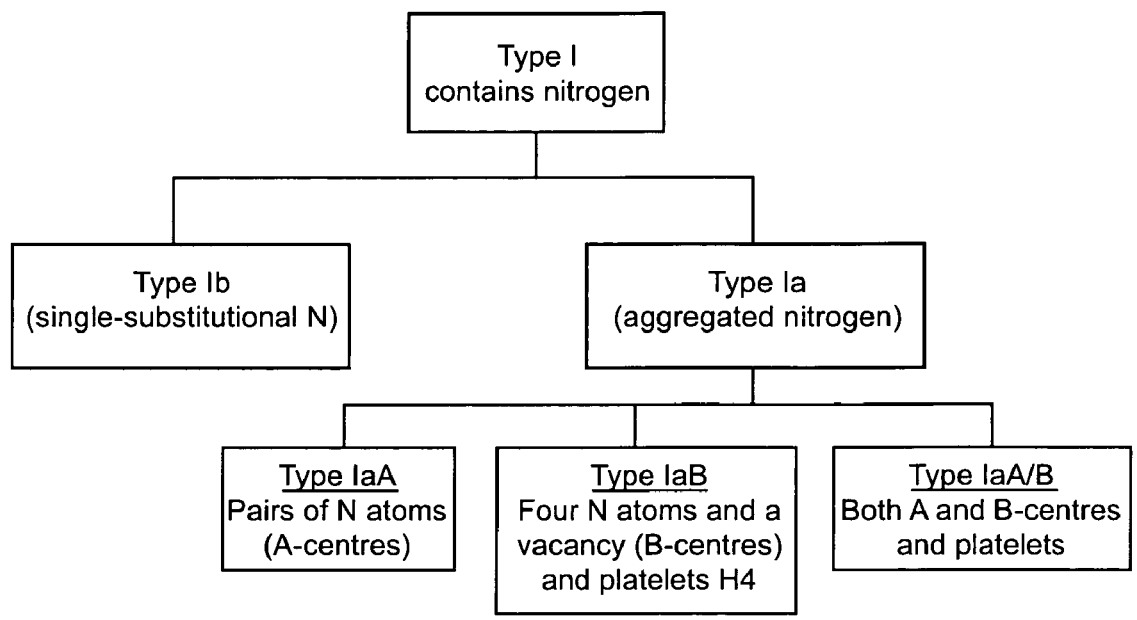
FIG. 14A is a flow chart defining the terminology used to describe nitrogen heteroatoms in diamond (from I. Kiflawi et al. in "Theory of aggregation of nitrogen in diamond," *Properties, Growth and Applications of Diamond*, edited by M. H. Nazaré and A. J. Neves (Inspec, London, 2001), pp.130–133)

Nitrogen aggregates in diamond have been discussed by I. Kiflawi et al. in "Theory of aggregation of nitrogen in diamond," *Properties, Growth and Applications of Diamond*, edited by M. H. Nazare and A. J. Neves (Inspec, London, 2001), pp. 130–133. These authors teach that nitrogen is the major impurity in both natural and synthetic diamond. It is found both in dispersed form and aggregated form. A flowchart showing the relationship amongst the different types of diamond, based on the state of nitrogen aggregation, is given in FIG. 14A. In the actual nitrogen aggregation sequence, nitrogen is incorporated into the diamond lattice as a single substitution on a diamond lattice site. As the nitrogen aggregation sequence continues, other nitrogen-containing centers are produced that are associated with greater numbers of vacancies. Such centers include the H3 center, the N3 center, and the B-center. In nature, nitrogen aggregates (and their associations with vacancies) are formed as a result of a process that takes place over geologic time scales at temperatures which prevailed within the earth's upper mantle. This view is supported by a laboratory experiments in which diamonds annealed at high temperatures displayed the same aggregates.

Figure 14B:
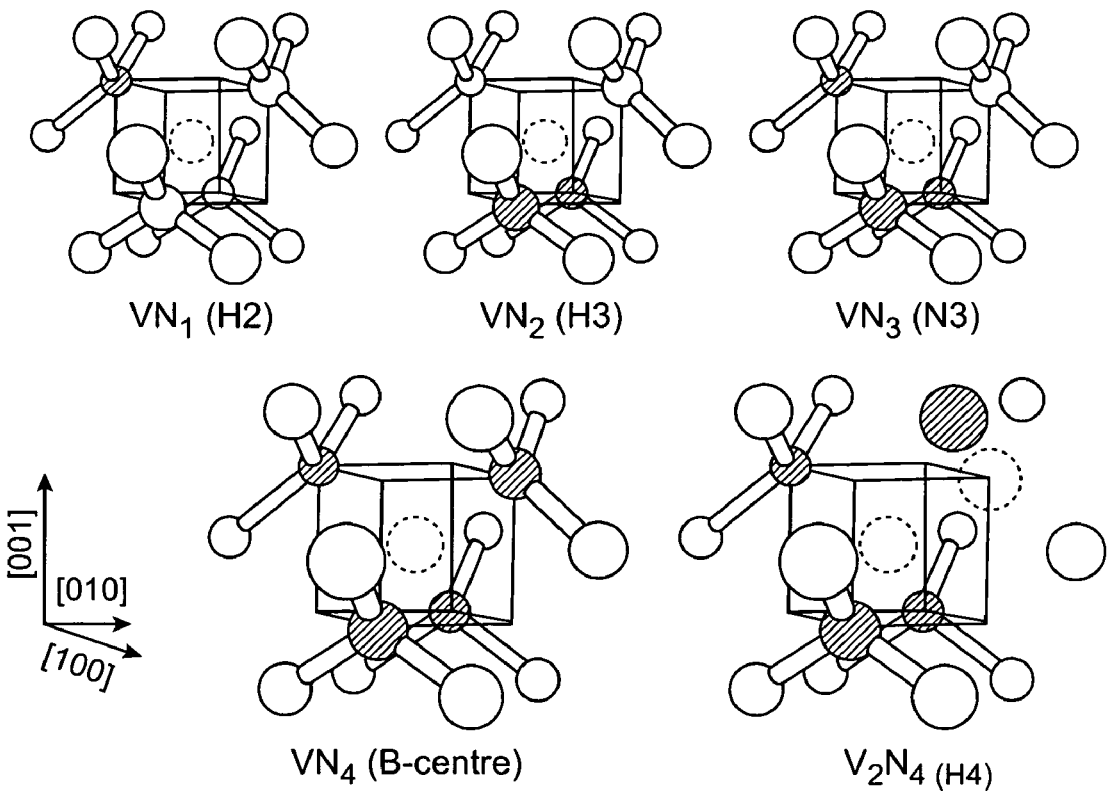
FIG. 14B shows various configurations of nitrogen heteroatoms and vacancies in diamond that lead to lasing color centers (from R. Jones et al. in "Theory of aggregation of nitrogen in diamond" in *Properties, Growth and Applications of Diamond*, edited by M. H. Nazaré and A. J. Neves (Inspec, London, 2001), pp. 127–129)

Nitrogen-vacancy associations have also been discussed by R. Jones et al. in "Theory of aggregation of nitrogen in diamond" in *Properties, Growth and Applications of Diamond*, edited by M. H. Nazaré and A. J. Neves (Inspec, London, 2001), pp. 127–129. This paper reviewed properties including the energies and lifetimes of optical transitions, local vibrational modes and vibrational resonances to study the structure of such color centers. Various types of aggregated nitrogen, and nitrogen vacancy complexes are illustrated in FIG. 14B. An association between a single nitrogen atom and a single lattice vacancy is designated a $VN_1$ center, also called an H2 center. Those skilled in the art will note that the nitrogen impurity atom has substitutionally replaced one of the four carbons in a tetrahedrally coordinated around the vacancy. In the $VN_2$ center, also termed an H3 center, a single lattice vacancy has tetrahedrally coordinated around it two nitrogen atoms substitutionally positioned on diamond lattice sites. The $VN_3$ center, also known as an N3 center, consists of three nitrogen atoms tetrahedrally positioned around a single vacancy. In the $VN_4$ center, or B-center, all four tetrahedral positions surrounding a single vacancy are occupied with nitrogen atoms.

A solid state laser employing a diamond having H3 and N3 color centers as the lasing medium has been discussed by Rand et al. in U.S. Pat. No. 4,638,484. Rand disclosed the demonstration of laser action in natural Type I diamonds containing H3 and N3 color centers when excited by an optical pumping source comprising a light source emitting ultraviolet radiation in the 300–600 nm range. High concentrations of N3 color centers emitted a bright blue fluorescence, while high concentrations of H3 cneters emitted a bright green-yellow fluorescence. The diamonds suitable for use as laser active materials contained nitrogen substitutions at a level of at least 0.1 atomic percent. The gain coefficient of the H3 centers was calculated as 0.09 $cm^{-1}$, while the gain coefficient for the N3 centers was estimated at about 0.009 $cm^{-1}$.

A diamond laser comprising a lasing medium having H2 centers has been described by Satoh et al. in U.S. Pat. No. 4,949,347. Laser action was effected in the range 1000 to 1400 nm by an external light pumping source operating at 650 to 950 nm. One method for providing the lasing medium material comprised the steps of subjecting a synthetic type Ib diamond having a nitrogen concentration within the range of $1\times10^{17}$ to $8.5\times10^{19}$ atoms/$cm^3$, irradiating the nitrogen-containing diamond with an electron dose of not less than $5\times1017$ electrons/$cm^2$, followed by a heat treating step. The heat treating method was optionally performed under ultra high-pressure of not less than 3.0 GPa, and high-temperature conditions of not less than 1500° C. The diamond laser was activated using a semiconductor laser(s) as the source of external pumping. For laser action using H2 centers, it was necessary to maintain the maximum value of the optical density of the H2 centers between 0.01 and 4, where optical density is defined as the natural log of the ratio of the incident light intensity to the transmitted light intensity. When the pumping wavelength of Satoh et al.'s diamond laser was varied between 500–1000 nm, laser action was observed in the range 1000 to 1400 nm.

A method of preparing a diamond laser crystal with a large quantity of H3 centers in synthetic Type Ib (single substitutional N) diamond has been disclosed by Nakashima et al. in U.S. Pat. No. 4,950,625. This method involved first preparing synthetic Type 1b containing at least 60 percent of a (111) growth plane, and then thermally treating that material under high temperature/high pressure conditions such that the type Ib diamond was converted to type IaA (pairs of N atoms; see FIG. 14A). The type IaA diamond was then exposed to an electron beam in order to generate vacancies. Finally, an annealing step was performed to form H3 centers by coupling the type IaA nitrogen atoms with the vacancies. The number of $VN_1$ centers was low, which was found to be desirable, as these are normally an obstacle to laser action.

These methods of producing lasing media with color centers may be cumbersome and expensive to implement, and it may difficult to control the type, number, and distribution of color centers. What is needed is a set of color center configuration, and methods of manufacturing the same, wherein control over the type, number, quality, uniformity, and distribution is readily achievable.

According to embodiments of the present invention, a lasing medium may be fabricated by allowing diamondoids, nitrogen heteroatom diamondoids, derivatized diamondoids, and derivatized heterodiamondoids to crystallize into a molecular solid. It is contemplated that the nitrogen heteroatoms may be positioned in the solid adjacent to pores and or vacancies such that a nitrogen-vacancy association is formed, wherein the number of nitrogens and the number of vacancies in the color center assembly may be engineered according to the particular structure desired. This of course determines the properties of the light emitted. In one embodiment of the present invention, an H3 or N3 structure is approximated. Such a lasing medium is depicted in FIGS. 15A and 15B, where a molecular crystal held together substantially by van der Waals forces is depicted in FIG. 15A, and a covalently bonded diamondoid polymer is depicted in FIG. 15B.

Figure 15A:
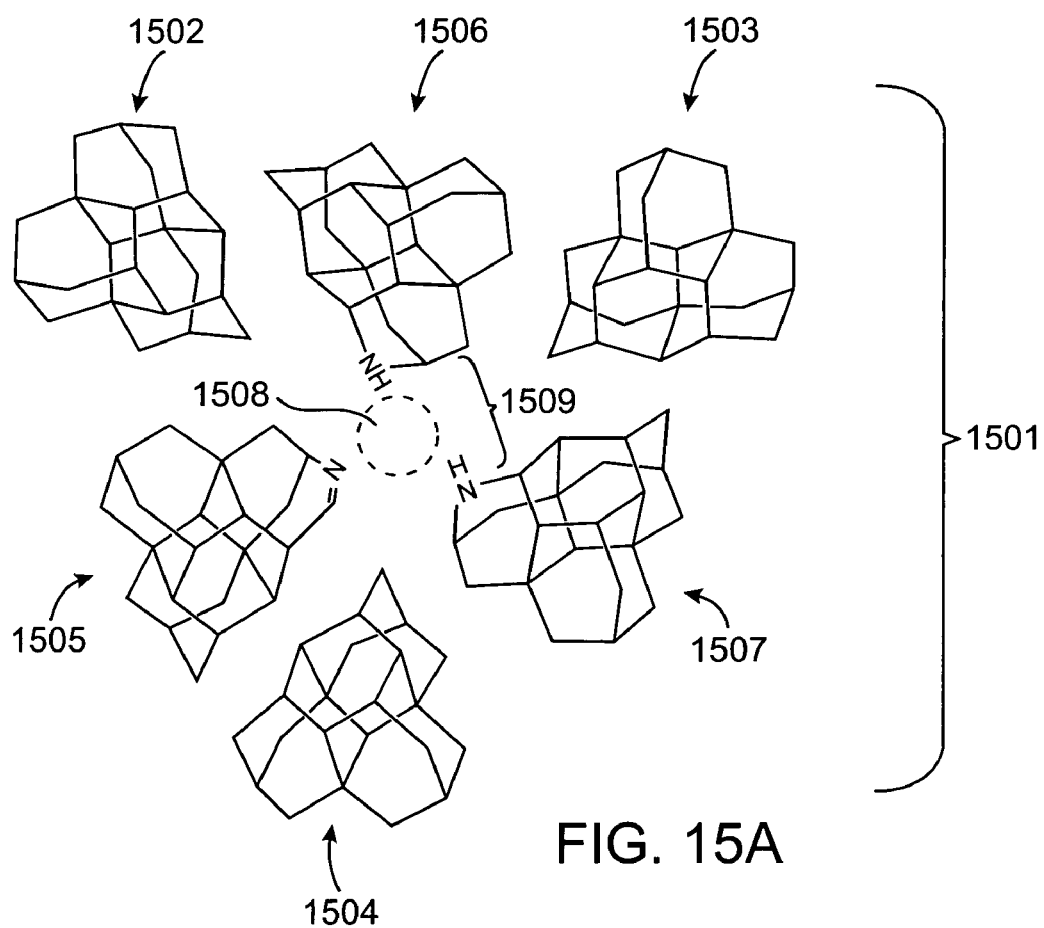
FIGS. 15A, B are exemplary diamondoid-containing materials having nitrogen-vacancy color centers.

Referring to FIG. 15A, a diamondoid-containing material suitable for use in a dye laser having nitrogen-vacancy color centers is depicted generally at 1501. Individual diamondoids 1502, 1503, and 1504 pack with individual heterodiamondoids 1505, 1506, and 1507 forming a pore 1508 generally at the center of the group. Heterodiamondoids 1505, 1506, and 1507 pack, assemble, or are otherwise constructed such that their nitrogen heteroatoms are generally positioned adjacent to pore or vacancy 1508 forming a structure that resembles an N3 color center 1509. It will be understood by those skilled in the art that many possible combinations of pore sizes, types of heteroatom bonding within each heterodiamondoid, valence structure of each heteroatom within the heterodiamondoid, geometrical positioning and configuration of diamondoids and heterodiamondoids to one another, packing density of diamondoids, etc., are possible. Thus, it is possible to control the optical properties of the color center 1509 within the molecular crystal 1501 to achieve the desired laser light properties.

Figure 15B:
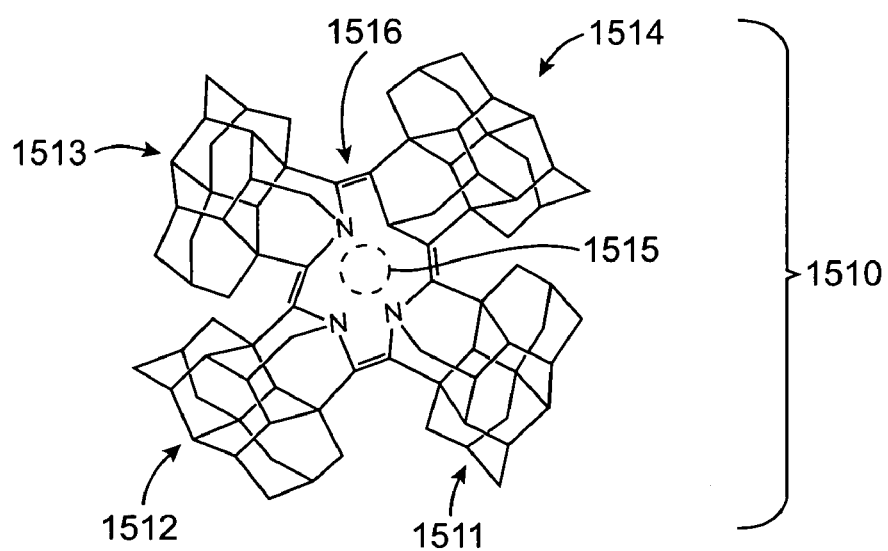

Referring to FIG. 15B, a diamondoid containing material shown generally at 1510 comprises heterodiamondoids 1511, 1512, and 1513, and diamondoid 1514. Heterodiamondoids 1511, 1512, and 1513, contained nitrogen heteroatoms. These four diamondoids may be held in a covalently bonded structure according to the techniques described for the polymer in FIG. 12. The polymerization synthesis is carried out such that the nitrogen heteroatoms of the heterodiamondoids 1511, 1512, and 1513, respectively, are positioned adjacent to a pore, opening, or vacancy 1515. The nitrogen heteroatoms and pore 1515 form a color center 1516 located substantially at the center (in this example) of the covalently bonded structure. The pore does not have to be at the center of the structure. It will be understood by those skilled in the art that many combinations of covalent bonding structure, choice of heterodiamondoids, degree of $sp^2$ vs. $Sp^3$ character in the covalent bonding, etc., are possible. Thus, it is possible to control the optical properties in the color center 1516 within the polymerized material 1510.

Figure 16:
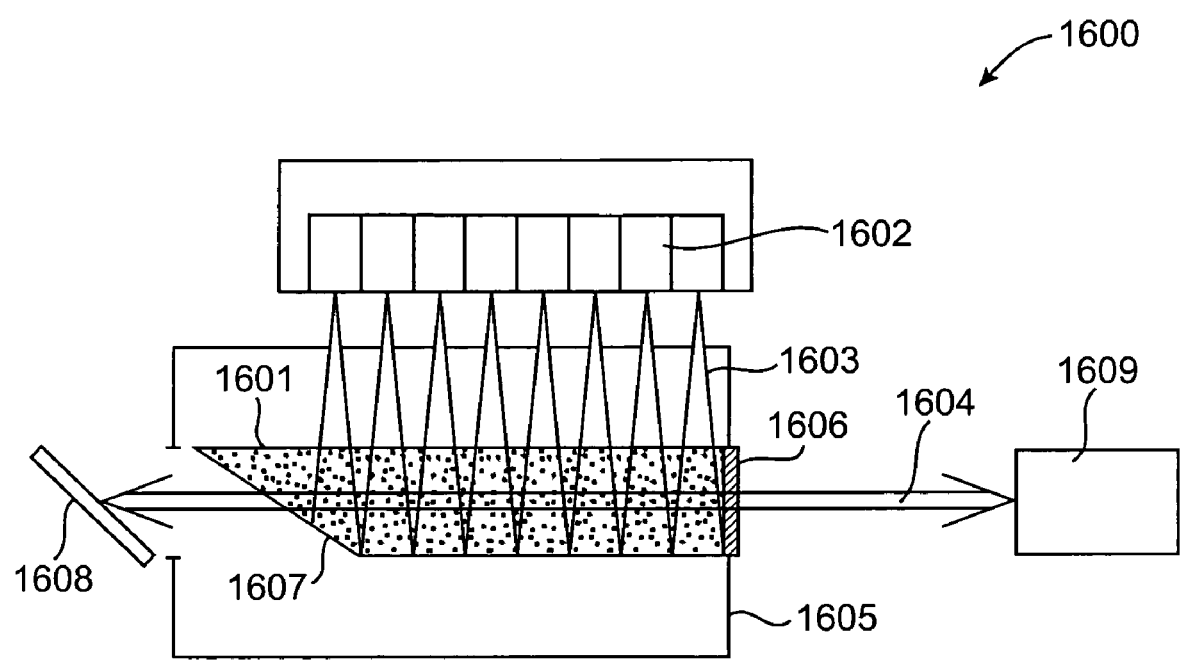
FIG. 16 is an exemplary laser having a diamondoid-containing lasing medium.

An exemplary solid state dye laser that may be constructed to utilize the lasing medium discussed with regard to FIGS. 15A, B is shown in FIG. 16. The dye laser shown generally at 1600 comprises a lasing medium 1601 optically pumped by external radiation source 1602, which may be in the form of an array. The external pumping source 1602 emits radiation 1603 that excites the color centers (not shown) of the lasing medium 1601. Stimulated emission from the lasing medium 1601 forms coherent laser light 1604. A lasing medium 1601 is housed with an optical resonator 1605. The ends of the lasing medium 1601 comprise a polished and partially reflecting surface 1606 and a polished and translucent surface 1607. The wavelength of the laser light emitted by the die laser 1600 may be selected by adjusting a grading 1608. The laser light 1604 may be impinged on a measuring device or end-use system 1609, or otherwise processed or used.

Advantages of the present molecular crystals and polymerized diamondoids are that the nitrogen-vacancy containing color center are constructed "from the bottom up," meaning that the nitrogen heteroatoms and the vacancies comprising the color centers are placed in position by virtue of the details of the assembling technique, whether, crystallization or polymerization. This may be contrasted with the damaging techniques of the prior art methods, wherein nitrogen atoms are either already present in the crystal, and there is less control over their density or distribution, or inserted by lattice damaging implantation techniques. Vacancy insertion by ion beam exposure is also more likely to damage a crystal than the synthesis and assembly techniques of the present embodiments.

The present embodiments include a solid state dye laser which may comprise a diamondoid-containing lasing medium, an optical pumping system for delivering energy to the lasing medium, and an optical resonator for processing the light emitted from the lasing medium. The lasing medium may comprise a diamondoid-containing host material and at least one color center within the host material. The color center may comprise at least one nitrogen heteroatom in a heterodiamondoid, where the heterodiamondoid may be positioned adjacent to at least one vacancy or pore.

The solid state dye laser may comprise a diamondoid-containing host material selected from the group consisting of a CVD-deposited film, a molecular crystal, and a polymerized material. The host material may comprise at least one diamondoid selected from the group consisting of adamantane, diamantane, and triamantane, and heterodiamondoid derivatives thereof. It may also comprise at least one diamondoid selected from the group consisting of tetramantane, pentamantane, hexamantane, heptamantane, octamantane, nonamantane, decamantane, and undecamantane, and heterodiamondoid derivatives thereof.

Doped Crystal Diamondoid-containing Laser Medium

A solid state dye laser may also be fabricated according to embodiments of the present invention by incorporating an optically active dopant which is found to lase in the solid matrix.

It is contemplated in the present invention to provide a solid state laser having as the lasing medium a diamondoid-containing material that includes an optically active dopant material that lases within the diamondoid-containing material. Such a device is similar to that disclosed in U.S. Pat. No. 5,504,767, except that the diamondoid-containing material of the present disclosure offers the same abovementionned advantages over the diamond of U.S. Pat. No. 5,504,767.

The dopant may be a rare earth element, transition element, actinide, or lanthanide. The dopant may be selected from the group consisting of titanium, vanadium, chromium, iron, cobalt, nickel, zinc, zirconium, niobium, cadmium, hafnium, tantalum, tungsten, rhenium, osmium, iridium, platinum, gold, mercury, cerium, praseodymium, neodymium, promethium, samarium, europium, gadolinium, terbium, dysprosium, holmium, erbium, thulium, ytterbium, and uranium. The laser medium is formed as dopants are included in the diamondoid-containing material as discussed above, wherein the diamondoid-containing material may include a polymeric material, ceramic, CVD-nucleated material, molecular crystal, and combinations thereof.

The elements of a diamond laser have been discussed by Jamison et al. in U.S. Pat. No. 5,504,767. According to Jamison et al., a laser contains three elements; 1) a lasing medium, which generates the laser light, 2) a power supply, which delivers energy to the laser medium in a form a needed to excite it to emit light, and 3) and optical cavity or resonator which concentrates light to simulate the emission of laser radiation.

In one type of solid state laser, the laser medium comprises a crystalline solid host, which is doped with the species that emits the laser light. The active species is embedded in the host. The active species is excited to lase, or is pumped, by light from external source. A variety of crystals and glasses have been used as hosts in the medium of a solid state laser. The main requirements of the host are transparency, ease of fabrication, and good heat transfer characteristics.

Also discussed by Jamison et al. in U.S. Pat. No. 5,504,767 are the advantages that diamond displays as a potential host for lasing ions to form a solid state laser. These advantages are due to the extremely high thermal conductivity and large bandgap of diamond. Diamond is about 200 times more resistant to thermal shock in a high power optical systems than any other me of material, and therefore may provide the basis for producing extremely high power density solid state laser. The high thermal conductivity of diamond will also minimize thermal lensing, caused by a change in the refractive index of the host diamondoid-containing material as its temperature increases during operation. This is contemplated to allow a diamondoid based laser to operate at a higher power density than a conventional solid state laser.

Another advantage a diamondoid based laser offers stems from the very wide bandgap that a diamondoid-containing material is expected to have. A diamondoid based material is expected to have a bandgap higher than about 3 eV (in some embodiments greater than about 4 eV, and in still other embodiments greater than about 5 eV), such that higher energy photons pass of through the crystal than otherwise would have occurred with a traditional solid state laser host material.

Optically active dopants are inserted into a diamondoid-containing material according to present embodiments by self-assembly, crystallization, and polymerization techniques similar to those used for nitrogen-vacancy color centers. An exemplary self-assembled or crystallized material suitable for use in a solid state laser is shown generally at 1700 in FIG. 17A. Diamondoids 1702–1707 may be generally disposed around an optically active dopant 1708. The optically active dopant 1708 may comprise a rare earth element, transition element, actinide, or lanthanide, or mixtures thereof. The optically active dopant may be selected from the group consisting of titanium, vanadium, chromium, iron, cobalt, nickel, zinc, zirconium, niobium, cadmium, hafnium, tantalum, tungsten, rhenium, osmium, iridium, platinum, gold, mercury, cerium, praseodymium, neodymium, promethium, samarium, europium, gadolinium, terbium, dysprosium, holmium, erbium, thulium, ytterbium, and uranium. Some of the diamondoids surrounding the optically active dopant 1708, and comprising the pocket in which the dopant sits, may be either positioned in close proximity to the dopant atom, in contact with it, or even bonded to it in some manner, such as through a covalent or ionic bond, or through London forces. Exemplary diamondoids in FIG. 17A include 1703, 1705, and 1707. Other diamondoids comprising the pocket may be positioned further away from the dopant atom; such diamondoids include 1702, 1704, and 1706. These more distant diamondoids may also exert a force on the dopant, or no force at all. The dopant atom may also be chemically inert with respect to its diamondoid hosts. Of course, in keeping with the definition of diamondoids in this disclosure, the diamondoids may also be heterodiamondoids, or derivatives thereof.

Figure 17A:
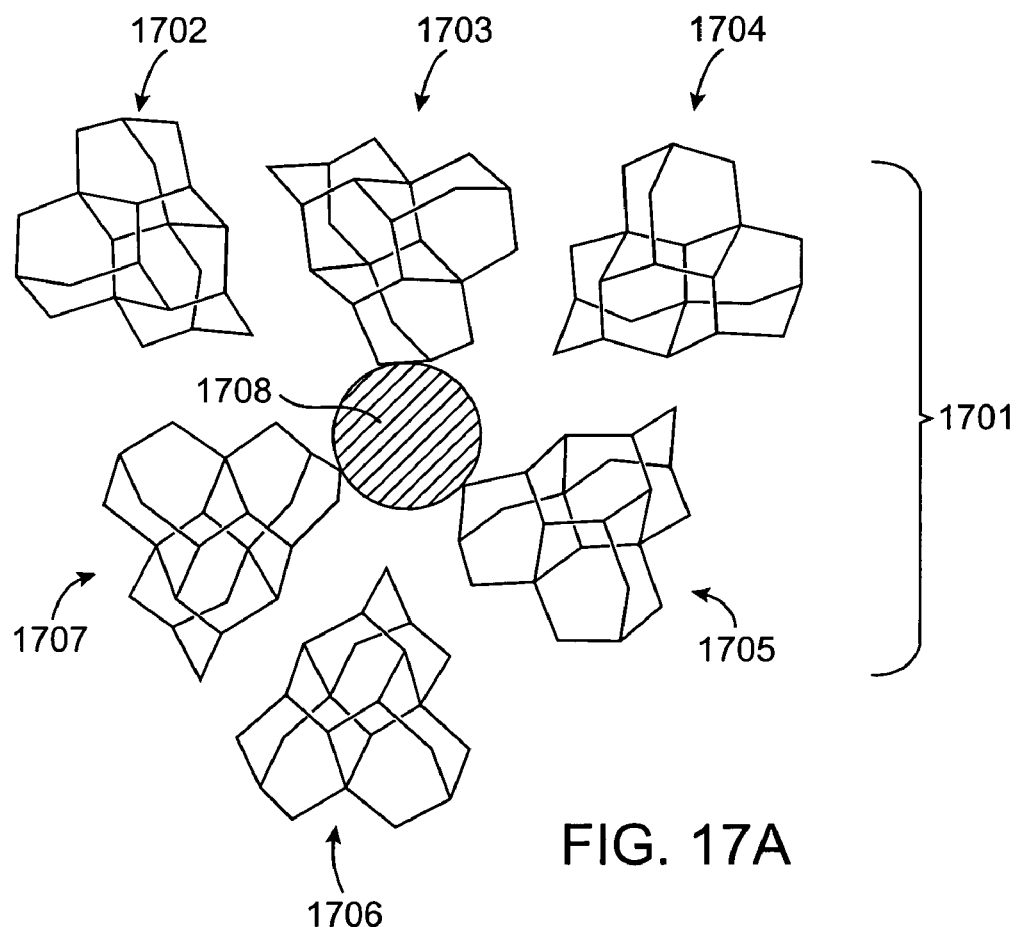
FIGS. 17A, B are exemplary diamondoid-containing materials having a dopant atom that is responsible for the lasing action.
Figure 17B:
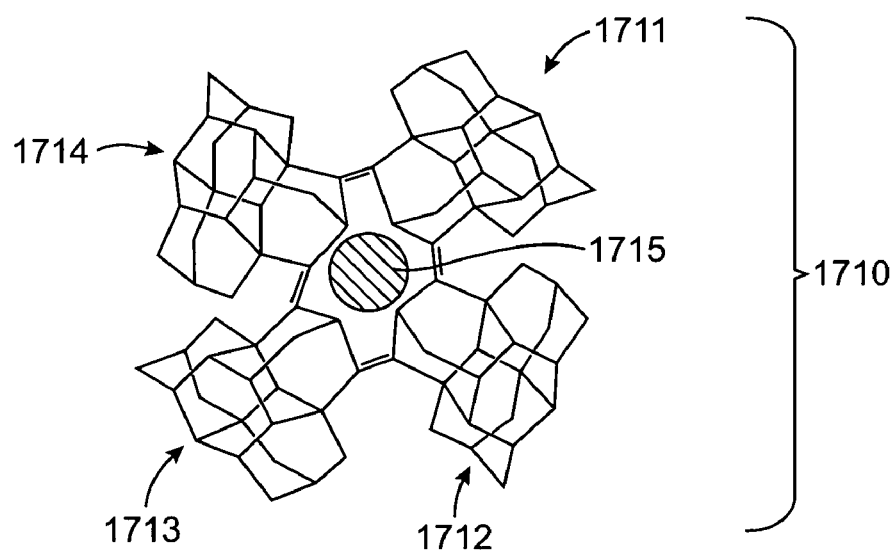

A polymerized diamondoid-containing material that may host an optically active dopant atom is shown generally at 1710 in FIG. 17B. This exemplary material comprises four diamondoids 1711–1714 that form a pore within which an optically active dopant atom 1715 resides. As with the molecular crystal 1701, any of the diamondoids 1711–1714 that comprise polymerized material 1710 may contact or be bonded in some manner to the dopant atom, or they may be chemically inert to it and the optically active dopant atom 1715 may be held in place mechanically.

The diamondoid-containing materials of FIGS. 17A, B may also be used in the solid state laser of FIG. 16.

Diamondoid-containing Semiconducting Lasers and LED's

A light emitting diode constructed from materials of the present embodiments may be formed by joining an n-type diamondoid-containing material with a p-type material; an n-type material and a p-type diamondoid-containing material, or a p-type diamondoid-containing material and an n-type diamondoid-containing material, to form a p-n junction. The p-n junction is then forward biased, meaning that a negative voltage is applied to the n-type side of the junction, and a positive voltage is applied to the p-type side of the junction. The p-n junction may be foward biased by applying an electric field or an electric potential across the diode, and in particular, its p-n junction. Forward biasing causes electrons to be excited from the n-type material, across the p-n junction, into the p-type material, wherein the electrons combine with holes. Each time an electron combines with a hole, a photon may be emitted.

Current injection type light emitting devices employing diamond have been disclosed by Horiuchi et al. in U.S. Pat. No. 6,433,474. Such a current injection type light emitting devices makes use of a diamond medium to emit ultraviolet light. The device emits ultraviolet radiation as a consequence of free exiton recombination within the diamond material as a result of the application of the DC voltage applied between two electrodes to inject carriers into the diamond.

Horiuchi et al. teach tha p-n junction such an ultraviolet light emitting diamond device can be used in the field of optical information recording, readout processing, photolithography, optical working, and florescent light sources. Since ultraviolet light has a short wavelength, demands for such a device are numerous due to the high frequency and therefore high bandwidth provided by ultraviolet light. Horiuchi et al.'s device comprises a luminescent layer where emission occurs such that free excitation recombination radiation due to excitation by the injection of current is dominant. This is possible only with high-quality diamond having with few lattice defects except for the dopant atoms that are deliberately inserted.

A "dominant" emission whose origin is a free exiton recombination is defined by Horiuchi et al. as an emission whose intensity is least twice as large as an emission arising from impurities. Horiuchi et al.'s high-quality diamond crystal is fabricated by a high-temperature and high-pressure method using a nitrogen getter so that the amount of nitrogen contained in the crystal is no more than about 10 ppm. The presence of nitrogen in the diamond, in addition to lattice defects, adversely affects the free exiton recombination radiation. The preferred diamond material is p-type semiconductor containing boron, where the boron content is no greater than 40 ppm as measured by infrared spectroscopy, or no more than about $2 \times 10^{19}$ atoms/cm$^3$ as measured by secondary ion mass spectroscopy (SIMS).

To maximize the wavelength of the objective emission, which in this case is in the ultraviolet wavelength of the electromagnetic spectrum, the number of impurities and defects in the crystal should be minimized. Diamond exhibits a bandgap (Eg) at room temperature of approximately 5.47 eV (wavelength 227 nm), and a bound energy of a free exiton (Eb) of approximately 80 meV; therefore, the frequency of free exiton recombination radiation is Eg-Eb, or 5.39 eV (230 nm). However, diamond has the band structure of an indirect transition type of semiconductor, and thus a variety of phonon mediated events accompany the emission of a photon. One in particular is an emission associated with one or more transverse optical phonons whose creation results in an emission with an energy at room temperature in the vicinity of 5.28 eV (235 nm), 5.12 eV (242 nm), 4.98 eV (249 nm), and 4.82 eV (257 nm). These plural phonon side bands overlap to form a luminescence emission band which is observable. Generally, the accumulated emissions from these phonon side bands are called "free exiton recombination radiation."

It is important to stress that such radiation may only be observed for high-quality diamond crystals having a minimum of impurities and defects. Horiuchi et al. achieve such impurity and defect free diamond crystals using high-temperature and high-pressure method is employing a nitrogen getter, and state that such a method is suitable for providing an ultraviolet light emitting diamond crystal, whereas natural diamond and diamond grown by CVD methods are not capable of providing such defect and impurity free crystal qualities. However, the high-temperature and high-pressure synthesis methods can be difficult to carry out. In such a method, carbon raw material is dissolved in the flux metal and a temperature pressure regime such that the diamond can stably exist and precipitate on a seed crystal. What is needed are methods for producing defect and impurity free diamond or diamond like materials with more reliable and controllable techniques.

The diamondoid-containing materials of the present convention offer such a solution. It is contemplated that any of the methods disclosed above, including CVD generated diamondoid containing films, self assembled or crystallized clusters of diamondoids (molecular crystals), or polymerized diamondoid-containing films are suitable for producing devices that emit short wavelength radiation. Of particular interest are molecular crystals of diamondoids containing no heteroatoms, as it has been observed that they hydrogenated diamond surface exhibits p-type electrical properties, and a molecular crystal of the diamondoids of the present embodiments display a very large surface to volume ratio.

Figure 18:
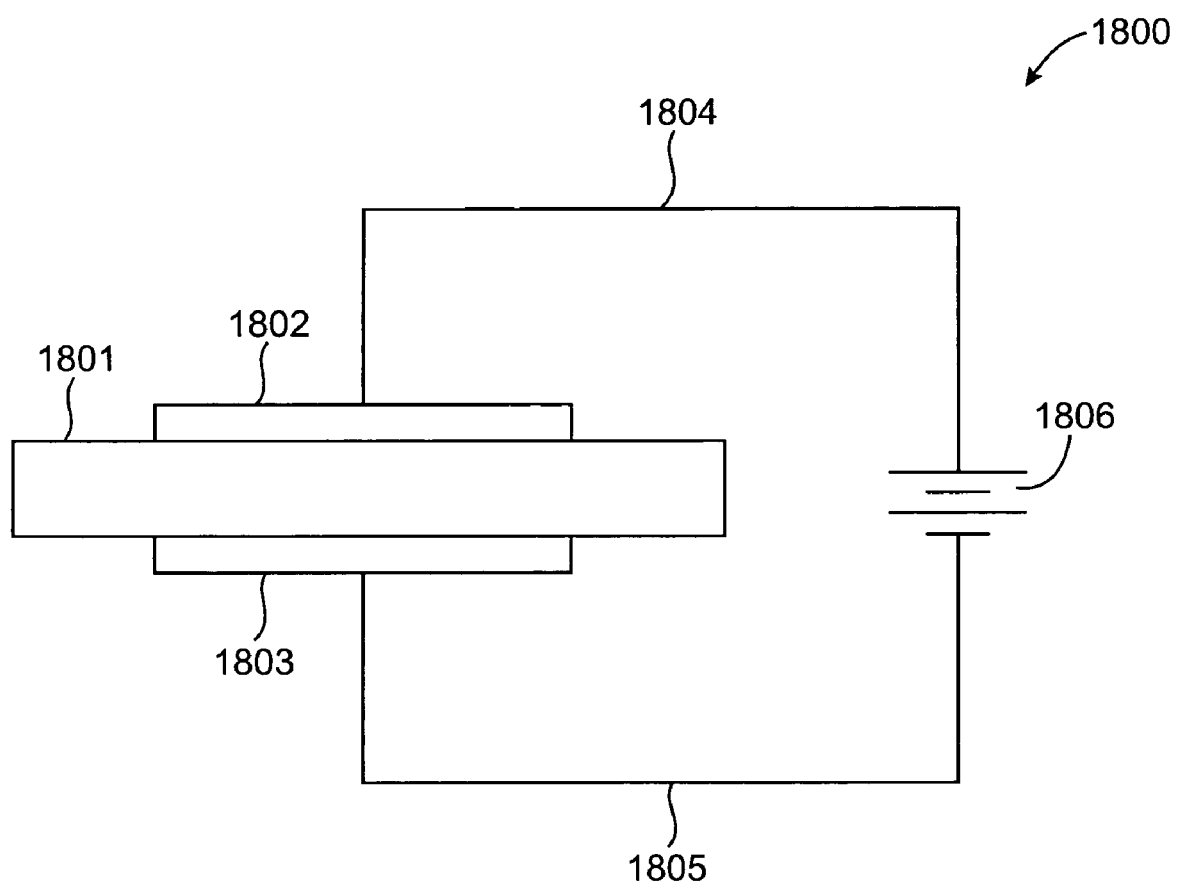
FIG. 18 is a schematic of an exemplary diamondoid-containing light emitting diode (LED)

A suitable ultraviolet emitting current injection type device (laser or LED) in which the above-mentioned diamondoid containing materials are suitable is shown in FIG. 18. Referring to FIG. 18, a current injection type ultraviolet light emitting device shown generally at 1800 comprises a diamondoid-containing material 1801 sandwiched between an electrode 1802 and an electrode 1803. The diamondoid-containing material 1801 in one embodiment is a molecular crystal of diamondoids having no heteroatoms such that the hydrogenated surface of the diamondoids display p-type electrical properties. In this embodiment, the electrodes 1802, 1803 may comprise a conducting metal such as silver that may be sputtered onto two opposing sides of the diamondoid-containing material 1801. The electrodes 1802, 1803 are connected via wiring 1804, 1805, respectively to a power supply 1806. The polarity of the power supply 1806 and wiring 1804, 1805 is configured such that electrons are injected from the electrode 1803 into the diamondoid containing material 1801, creating holes and free exitons in the diamondoid-containing material 1801. The diamondoid containing material 1801 is of sufficient quality, meaning a low concentration of impurities and defects, such that free exitons may combine with one another, and free exiton recombination radiation can be achieved.

The basis for a semiconductor laser according to embodiments contemplated by the present inventors is discussed in relation to FIGS. 19A–C. A semiconductor laser is shown schematically at 1900 in FIG. 19A, where contacts 1901, 1902 are shown connected to a p-type diamondoid-containing material 1903, and a n-type diamondoid-containing material 1904, respectively. As a forward bias is applied to the junction region 1905, laser light 1906 is emitted.

The mode of achieving the necessary population inversion in a semiconductor laser is different from the mechanisms that apply to dye lasers. Referring to FIG. 19B, one of skill in the art will recognize the band structure for a p-n junction without any bias, and in FIG. 19C, the same p-n junction with a forward bias. As previously explained, electrons flow from the n-type material into the p-type material, occupying the conduction band of the material in the immediate vicinity of the junction. In this region, a higher concentration of electronic states in the conduction band is occupied relative to that of the hole states in the valence band. Upon making a downward transition 1907 between the two states, as shown in FIG. 19C, the system emits recombination radiation (not shown) which serves as the spontaneous emission for initiating laser action. For this type of laser, no external mirrors are needed.

It is contemplated that the n and p-type diamondoid-containing materials discussed in an earlier section of this disclosure are suitable for forming the p-n junction of a semiconductor laser.

Similar devices that may be fabricated from the n and p-type materials disclosed above include photoresistors, photodiodes, solar cells, and phototransistors. Such devices have been discussed in a chapter on Optoelectronics by P. Scherz in "Practical Electronics for Inventors," (McGraw-Hill, New York, 2000), chapter 5. A photoresistor is a light control variable resistor. In terms of operation, a photoresistor is usually very resistive when placed in the dark, however; when it is eliminated, its resistance decreases significantly. Potential applications of a diamondoid-containing photoresistor include light and dark activated switching circuits and light-sensitive detector circuits. Photodiodes are devices that convert light energy directly into an electric current. If the anode and cathode leads of the photodiodes are joined together by a wire and then the photodiodes is placed in the dark, no current will flow. However, when the photodiode is illuminated, it becomes a small current source that pumps current from the cathode through the wire into the anode. Applications of photodiodes include detectors of fast pulses of light used in wireless communications. Solar cells are photodiodes with very large surface areas. The transistors are light sensitive transistors. A common type of phototransistor resembles a bipolar transistor with its base lead removed, and replaced with a light-sensitive surface area. When the surface area is kept dark, the device is off, and no current flows through the collector to emitter region. When the light-sensitive region is exposed to light, a small base current is generated that controls and much larger collector to emitter current. Field effect photo transistors are light-sensitive field effect transistors. Unlike bipolar transistors, field effect photo transistors use light to generate a gate voltage that is used to control in train source current.

According to embodiments of the present invention, a light emitting diode may comprise comprises a diamondoid-containing material having a bandgap, and a means for generating an electric field to cause at least one electronic transition such that light is emitted from the diode. The electronic transition may occur across the bandgap, and further, the light emitting diode may be configured such that the electronic transition occurs without participation of electronic states within the bandgap. The bandgap of the diamondoid-containing material is at least 3 eV in one embodiment, at least 4 eV in another embodiment, and at least 5 eV yet another embodiment. The wavelength of the emitted light may be in the ultraviolet range of the electromagnetic spectrum.

Similarly, a photodetector may comprise a diamondoid-containing material having a bandgap, and a means of processing current from at least one electronic transition that results from the absorption of light by the material. The electronic transition may occur across the bandgap, and further, the light emitting diode may be configured such that the electronic transition occurs without participation of electronic states within the bandgap. The bandgap of the diamondoid-containing material is at least 3 eV in one embodiment, at least 4 eV in another embodiment, and at least 5 eV yet another embodiment. The wavelength of the emitted light may be in the ultraviolet range of the electromagnetic spectrum.

Charged Particle Detectors

The diamondoid-containing materials are contemplated to be useful as particle detectors. Such a device has been described by Lu et al. in U.S. Pat. No. 5,773,830. The solid-state radiation detector described by Lu et al. operates by establishing a strong electrical field between two electrodes within which is positioned a freestanding insulating material. When the insulating material is exposed to radiation of sufficient energy to bring electrons or electron-hole pair carriers into the conduction band of the insulating material, the carriers are swept to the electrodes by the electric field. Their arrival can be measured by an electronic signal detection device connected to the electrodes.

It is recognized that diamond in general is a particularly advantageous material for use in a solid-state particle detector because diamond is much more resistant to radiation damage than our alternative detector materials such as silicon having a p-n junction. Silicon detectors suffer crystal structure damage when exposed to high radiation which leads to an increased leakage current and decreased pulse height and output signal. Furthermore, in silicon, the maximum field that can be applied before avalanche breakdown is about $10^3$ V/cm. This limits the charge velocity to approximately 106 cm per second, so that the collection time is at least 20 ns for a detector having a thickness of the few hundred microns.

Lu et al. disclose a method of producing a diamond film via an arcjet CVD deposition process. The material produced demonstrated a collection distance of 35 to 50 microns, a mobility of 3000 to 4000 $cm^2 V^{-1} s^{-1}$, and a lifetime of over 1 ns. This lifetime is higher than 8150 pico seconds typically reported for CVD diamond, and higher than 3300 550 pico seconds for natural type IIa diamond.

Figure 20A:
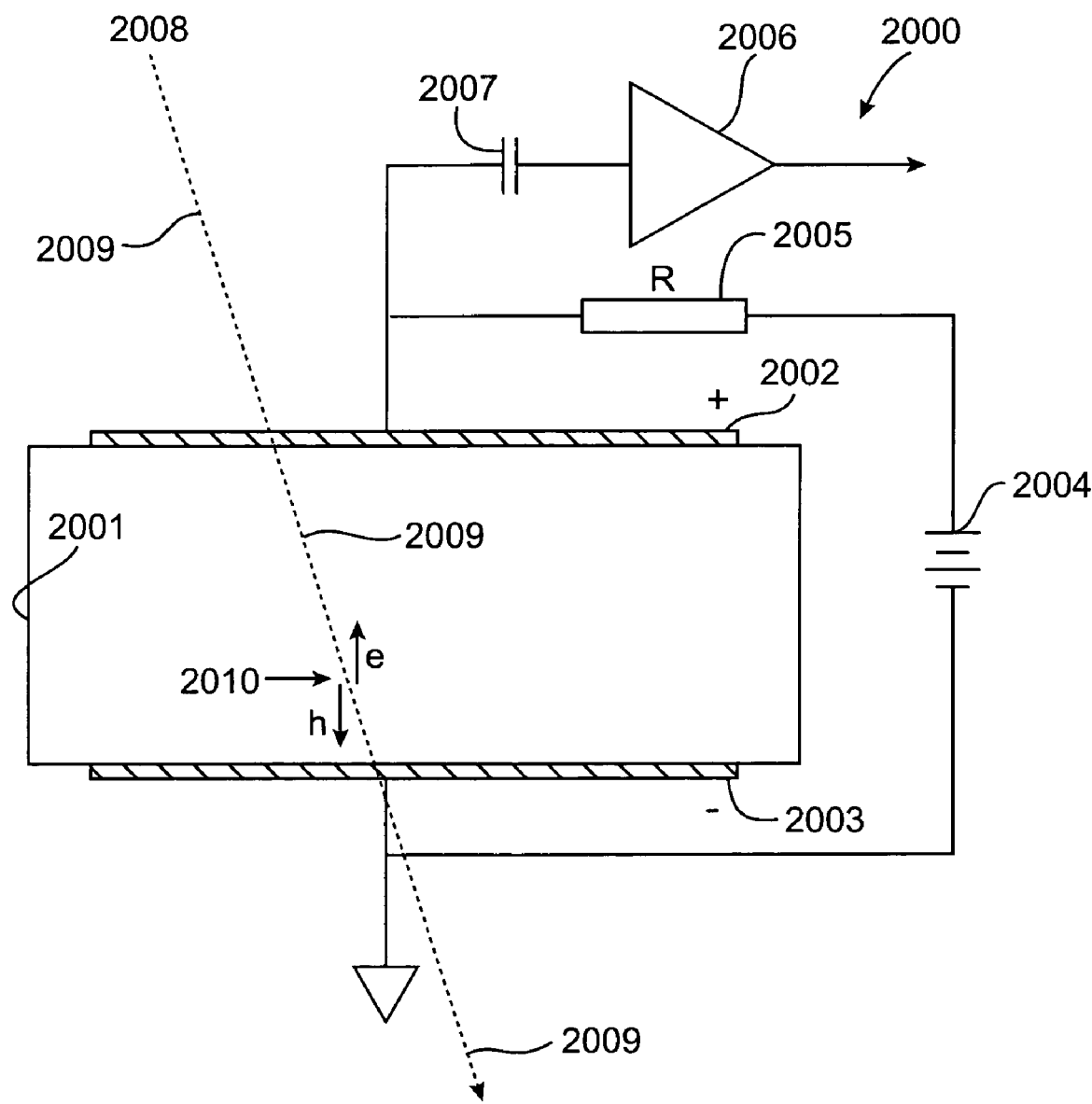
FIGS. 20A, B are schematic diagrams of exemplary diamondoid-containing particle detectors.

And exemplary particle detector suitable for use according to the present embodiments is shown generally at 2000 in FIG. 20A. The device comprises a diamondoid-containing material 2001 having two ohmic contact electrodes 2002, 2003. The electrodes 2002, 2003 are connected to signal processing circuitry which includes a voltage source 2004 in series with a load resistor 2005. An amplifier 2006 is connected to the electrodes 2002 via an isolation capacitor 2007. In operation, a charged particle 2008 passes through the detector 2000 following approximately path 2009, in the process creating an electron hole pair at approximately position 2010. The electron diffuses to the positively charged electrode 2002, where the hole diffuses to the negatively charged electrode 2003, creating a signal in the external circuit which is amplified by the amplifier 2006.

Figure 20B:
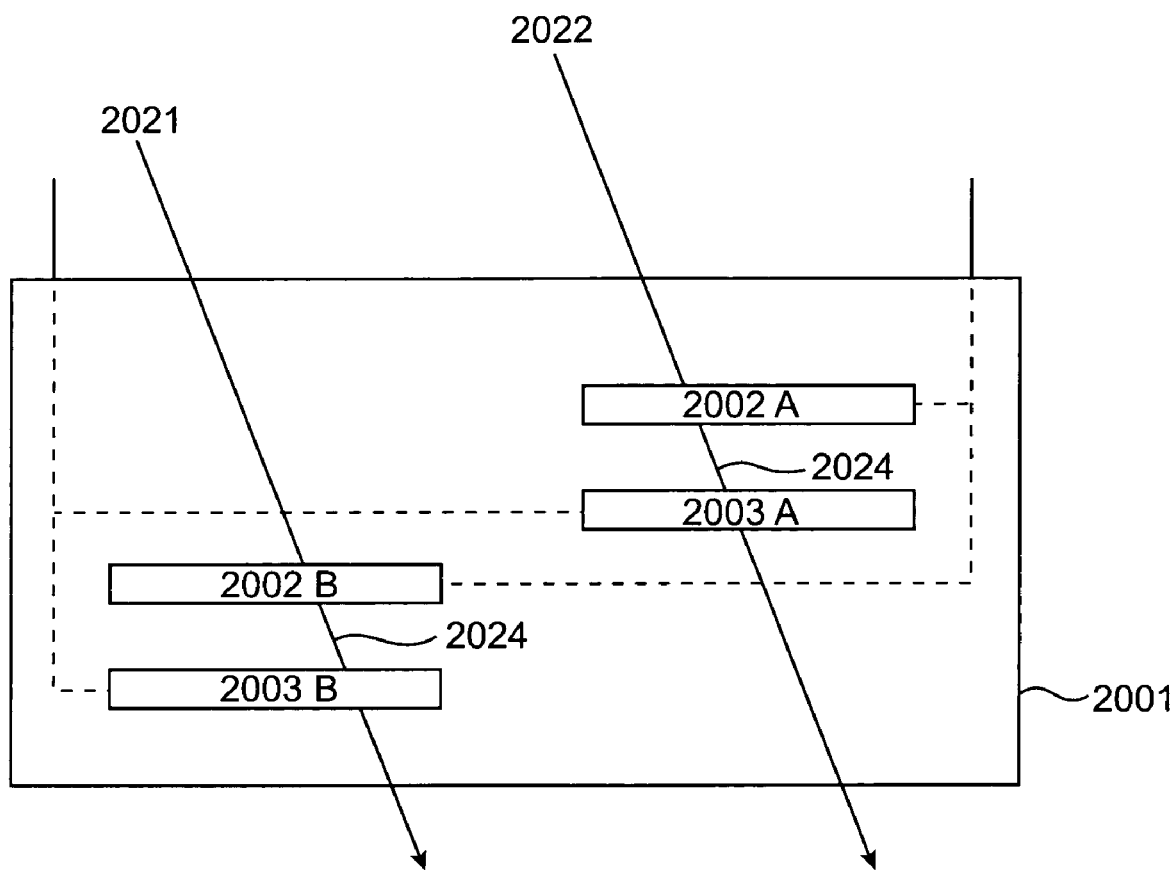

An alternative embodiment of the particle or radiation detector is shown in FIG. 20B. In FIG. 20B, the electrodes 2002 and 2003 have been subdivided such that various portions of the electrodes service different portions of the diamondoid-containing material 2002. Advantages of this embodiment are that because multiple regions of the diamondoid-containing material 2001 are under the influence of different pairs of electrodes, damage sustained by one portion of the detector does not prevent another part of the detector from being sensitive to particles or radiation. As shown in FIG. 20B, the pair of electrodes 2002B, 2003B energizes the left hand region of the detector, and the pair of electrodes 2002A, 2002B energizes the right hand region of the detector. Thus, if a particle 2021 damages the left hand region such that the region of material 2023 is no longer sensitive to radiation, a particle 2022 may still be detected by the still operable region 2024.

Anti-reflection Coatings

It is contemplated that the diamondoid-containing materials of the present embodiments will be useful as either one or both of the alternating layers of an antireflection coating. The theory of antireflection coatings has been discussed by O. S. Heavens and R. W. Ditchburn in *Insight into Optics* (Wiley, New York, 1991), pp. 44–46.

Figure 21A:
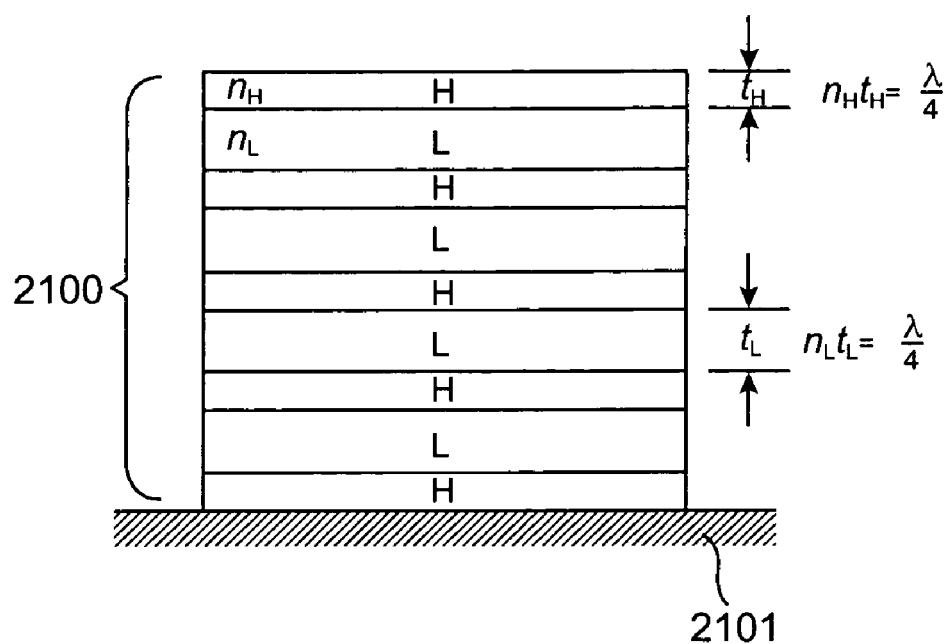
FIGS. 21A, B are exemplary diamondoid-containing antireflection coatings.

Exemplary antireflection coatings are shown in FIG. 21A, B. Referring to FIG. 21A, an antireflection coating shown generally at 2100 comprises alternating layers of high refractive index and low refractive index materials deposited on a substrate 2101. The layers comprising antireflection coatings 2100 are of equal optical thickness of ¼ of wavelength of the light impinging on the substrate 2101 such that transmission twice through any one layer produces a phase difference of pi.

Figure 21B:
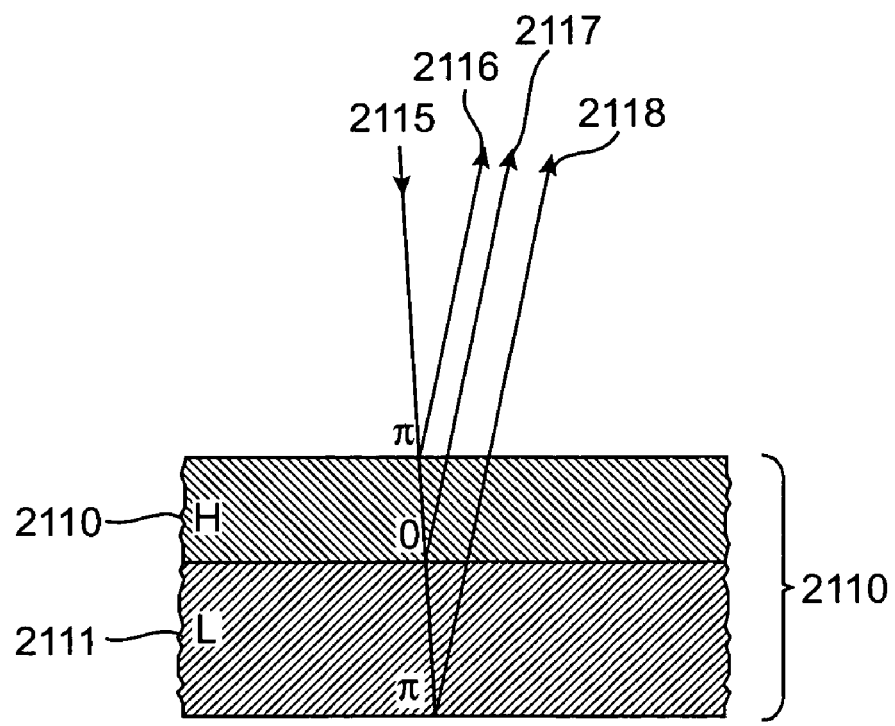

Operation of the antireflection coating may be discussed more easily with reference to FIG. 21B, which shows the result of rays impinging on a single element of a quarter wave stack 2110. The single element 2110 comprises a single layer of a high refractive index material 2110, and a low refractive index material 2111. Supposing that the phase of an incident wave 2115 on the single element 2110 is 0, then reflected beam 2116 one has a phase pi (due to reflection), and reflected beam 2117 has no face difference due to reflection, but a phase difference of pi due to transmission twice. Reflected beam 2118 has a phase difference of 2 pi due to transmission and pi due to reflection, making 3 pi, so that it is in phase with beams 2116 and 2117. Thus by successive destructive interference of each set of two waves, the reflection is zero.

Advantages of a diamondoid-containing layer's 2110 is that due to the layer's high refractive index, the thickness of the layer may be thin, thereby allowing for a greater number of layers and greater efficiency in creating a state of destructive interference.

All of the publications, patents and patent applications cited in this application are herein incorporated by reference in their entirety to the same extent as if the disclosure of each individual publication, patent application or patent was specifically and individually indicated to be incorporated by reference in its entirety. Many modifications of the exemplary embodiments of the invention disclosed above will readily occur to those skilled in the art. Accordingly, the invention is to be construed as including all structure and methods that fall within the scope of the appended claims.

What is claimed is:

1. An optical device comprising a diamondoid-containing material wherein the diamondoid-containing material comprises at least one diamondoid selected from the group consisting of tetramantane, pentamantane, hexamantane, heptamantane, octamantane, nonamantane, decamantane, and undecamantane, and heterodiamondoid derivatives thereof.

2. The optical device of claim 1, wherein the diamondoid-containing material comprises at least one heterodiamondoid derivative.

3. The optical device of claim 1, wherein the optical device is selected from the group consisting of a lens, a mirror, a pressure window, and an optical waveguide.

4. The optical device of claim 3, wherein the diamondoid-containing material is selected from the group consisting of a CVD-deposited film, a molecular crystal, and a polymerized material.

5. An optical device comprising a diamondoid-containing material wherein the diamondoid-containing material comprises at least one diamondoid selected from the group consisting of adamantane, diamantane, and triamantane, and heterodiamondoid derivatives thereof.

6. The optical device of claim 5, wherein the diamondoid-containing material comprises at least one heterodiamondoid derivative.

7. The optical device of claim 5, wherein the optical device is selected from the group consisting of a lens, a mirror, a pressure window, and an optical waveguide.

8. The optical device of claim 7, wherein the diamondoid-containing material is selected from the group consisting of a CVD-deposited film, a molecular crystal, and a polymerized material.

* * * * *